US012787359B2

(12) United States Patent
Kim et al.

(10) Patent No.: US 12,787,359 B2

(45) Date of Patent: Nov. 3, 2026

(54) SEMICONDUCTOR DEVICE

(71) Applicant: Samsung Electronics Co., Ltd., Suwon-si (KR)

(72) Inventors: Hee Sub Kim, Suwon-si (KR); Chul Sung Kim, Suwon-si (KR); Su Bin Lee, Suwon-si (KR); Geun Hee Jeong, Suwon-si (KR); Sang Min Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 286 days.

(21) Appl. No.: 18/794,404

(22) Filed: Aug. 5, 2024

(65) Prior Publication Data

US 2025/0185294 A1 Jun. 5, 2025

(30) Foreign Application Priority Data

Dec. 5, 2023 (KR) ........................ 10-2023-0174024

(51) Int. Cl.

| | |
|---|---|
| ***H10W 20/00*** | (2026.01) |
| ***H10D 30/01*** | (2025.01) |
| ***H10D 30/43*** | (2025.01) |
| ***H10D 30/67*** | (2025.01) |
| ***H10D 62/10*** | (2025.01) |
| ***H10D 64/01*** | (2025.01) |
| ***H10D 64/23*** | (2025.01) |
| ***H10W 20/41*** | (2026.01) |

(52) U.S. Cl.

CPC ....... *H10D 30/6729* (2025.01); *H10D 30/014* (2025.01); *H10D 30/43* (2025.01); *H10D 30/6735* (2025.01); *H10D 30/6757* (2025.01); *H10D 62/121* (2025.01); *H10D 64/017* (2025.01); *H10D 64/254* (2025.01); *H10W 20/427* (2026.01)

(58) Field of Classification Search

CPC ............. H10W 20/427; H10W 20/435; H10W 20/069; H10D 30/6735; H10D 30/6757; H10D 62/121; H10D 64/254

See application file for complete search history.

(56) References Cited

U.S. PATENT DOCUMENTS

| | | | |
|---|---|---|---|
| 11,450,665 | B2 | 9/2022 | Chiang et al. |
| 11,502,034 | B2 | 11/2022 | Chang et al. |
| 2022/0157722 | A1 | 5/2022 | Bouche et al. |

(Continued)

*Primary Examiner* — Reema Patel

(74) *Attorney, Agent, or Firm* — Muir Patent Law, PLLC

(57) ABSTRACT

A semiconductor device includes a back wiring line, a first fin-shaped pattern on the back wiring line, a second fin-shaped pattern spaced apart from the first fin-shaped pattern, a field insulating film on a first face of the back wiring line, covering side walls of the first and second fin-shaped patterns, and includes an upper face and a bottom face, a back contact guide pattern on the first face of the back wiring line between the first and second fin-shaped patterns, and including an upper face and a bottom face, the bottom face of the back contact guide pattern facing the first face of the back wiring line, a first source/drain pattern on the first fin-shaped pattern, and a back source/drain contact connecting the first source/drain pattern to the back wiring line wherein at least a part of the back source/drain contact is disposed in the first fin-shaped pattern.

20 Claims, 49 Drawing Sheets

(56) References Cited

U.S. PATENT DOCUMENTS

| | | | |
|---|---|---|---|
| 2022/0230947 | A1 | 7/2022 | Park et al. |
| 2022/0352326 | A1* | 11/2022 | Huang ................. H10D 64/017 |
| 2022/0399334 | A1 | 12/2022 | Guler et al. |
| 2023/0047194 | A1 | 2/2023 | Chen et al. |
| 2023/0163202 | A1 | 5/2023 | Lee et al. |
| 2023/0215767 | A1 | 7/2023 | Xie et al. |

* cited by examiner

SEMICONDUCTOR DEVICE

CROSS-REFERENCE TO RELATED APPLICATION

This application claims priority from Korean Patent Application No. 10-2023-0174024 filed on Dec. 5, 2023 in the Korean Intellectual Property Office, and all the benefits accruing therefrom under 35 U.S.C. 119, the contents of which in its entirety are herein incorporated by reference.

BACKGROUND

Technical Field

The present disclosure relates to a semiconductor device.

Description of the Related Art

As one of scaling technologies for increasing density of a semiconductor device, a multi gate transistor in which a multi-channel active pattern (or a silicon body) having a fin or nanowire shape is formed on a substrate and a gate is formed on a surface of the multi-channel active pattern has been proposed.

Since such a multi gate transistor utilizes a three-dimensional channel, scaling is easily performed. Further, even if a gate length of the multi gate transistor is not increased, the current control capability may be improved. Furthermore, a SCE (short channel effect) in which potential of a channel region is influenced by a drain voltage may be effectively suppressed.

On the other hand, as a pitch size of the semiconductor device decreases, it becomes important to reduce capacitance between contacts in the semiconductor device and ensure electrical stability.

SUMMARY

Aspects of the present disclosure provide a semiconductor device that may improve element performance and reliability.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an aspect of the present disclosure, there is provided a semiconductor device comprising a back wiring line which includes a first face and a second face that are opposite to each other in a first direction; a first fin-shaped pattern on the first face of the back wiring line, and extending in a second direction; a second fin-shaped pattern spaced apart from the first fin-shaped pattern in a third direction, the second fin-shaped pattern extending in the second direction; a field insulating film on the first face of the back wiring line, the field insulating film covering a side wall of the first fin-shaped pattern and a side wall of the second fin-shaped pattern, and including an upper face and a bottom face that are opposite to each other in the first direction, the bottom face of the field insulating film facing the first face of the back wiring line; a back contact guide pattern on the first face of the back wiring line between the first fin-shaped pattern and the second fin-shaped pattern, the back contact guide pattern including an upper face and a bottom face that are opposite to each other in the first direction, the bottom face of the back contact guide pattern facing the first face of the back wiring line; a first source/drain pattern on the first fin-shaped pattern; and a back source/drain contact which connects the first source/drain pattern to the back wiring line, wherein at least a part of the back source/drain contact is disposed in the first fin-shaped pattern.

According to another aspect of the present disclosure, there is provided a semiconductor device comprising a back wiring line which includes a first face and a second face that are opposite to each other in a first direction; a first fin-shaped pattern on the first face of the back wiring line and extending in a second direction; a field insulating film on the first face of the back wiring line, the field insulating film covering a side wall of the first fin-shaped pattern, and including an upper face and a bottom face that are opposite to each other in the first direction, the bottom face of the field insulating film facing the first face of the back wiring line; a source/drain pattern on the first fin-shaped pattern; a back source/drain contact which connects the source/drain pattern to the back wiring line; and a back contact guide pattern on both sides of the back source/drain contact and in contact with the back source/drain contact, wherein the back contact guide pattern includes an upper face and a bottom face that are opposite to each other in the first direction, the bottom face of the back contact guide pattern faces the first face of the back wiring line, and a height from the second face of the back wiring line to the bottom face of the field insulating film is smaller than a height from the second face of the back wiring line to the upper face of the back contact guide pattern.

According to still another aspect of the present disclosure, there is provided a semiconductor device comprising a substrate which includes an upper face and a bottom face that are opposite to each other in a first direction; a first fin-shaped pattern which protrudes from the upper face of the substrate in the first direction and extends in a second direction; a second fin-shaped pattern which protrudes from the upper face of the substrate in the first direction, is spaced apart from the first fin-shaped pattern in a third direction, and extends in the second direction; a field insulating film on the substrate, the field insulating film covering side walls of the first fin-shaped pattern and side walls of the second fin-shaped pattern; a back contact guide pattern between the first fin-shaped pattern and the second fin-shaped pattern, the back contact guide pattern being disposed in the field insulating film and the substrate; a source/drain pattern on the first fin-shaped pattern; a back wiring line on the bottom face of the substrate; and a back source/drain contact which connects the source/drain pattern to the back wiring line, and is in contact with the back contact guide pattern, wherein the back contact guide pattern includes a first portion disposed in the substrate, and a second portion disposed in the field insulating film, the back contact guide pattern includes a first side wall and a second side wall that are opposite to each other in the third direction, the first side wall of the back contact guide pattern is in contact with the back source/drain contact, and in the first portion of the back contact guide pattern, the second side wall of the back contact guide pattern forms an acute angle with the bottom face of the substrate.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION OF THE EMBODIMENTS

It will be understood that, although the terms "first," "second," and the like may be used herein to describe various elements, these elements should not be limited by these terms. These terms are only used to distinguish one element from another. Thus, a "first" element discussed below could also be termed a "second" element without departing from the teachings of the present disclosure.

Although drawings of a semiconductor device according to some embodiments show a fin-type transistor (FinFET) including a channel region of a fin-type pattern shape, a transistor including a nanowire or a nanosheet, and a MBCFET™ (Multi-Bridge Channel Field Effect Transistor) as an example, the embodiment is not limited thereto.

The semiconductor device according to some embodiments may, of course, include a tunneling transistor (tunneling FET), a three-dimensional (3D) transistor or a vertical transistor (vertical FET). The semiconductor device according to some embodiments may, of course, include a planar transistor. In addition, the technical idea of the present disclosure may be applied to a transistor based on two-dimensional material (2D material based FETs) and a heterostructure thereof. Further, the semiconductor device according to some embodiments may also include a bipolar junction transistor, a laterally diffused metal oxide semiconductor (LDMOS), or the like.

The semiconductor device according to some embodiments will be described with reference to FIGS. 1 to 10.

Figure 1:
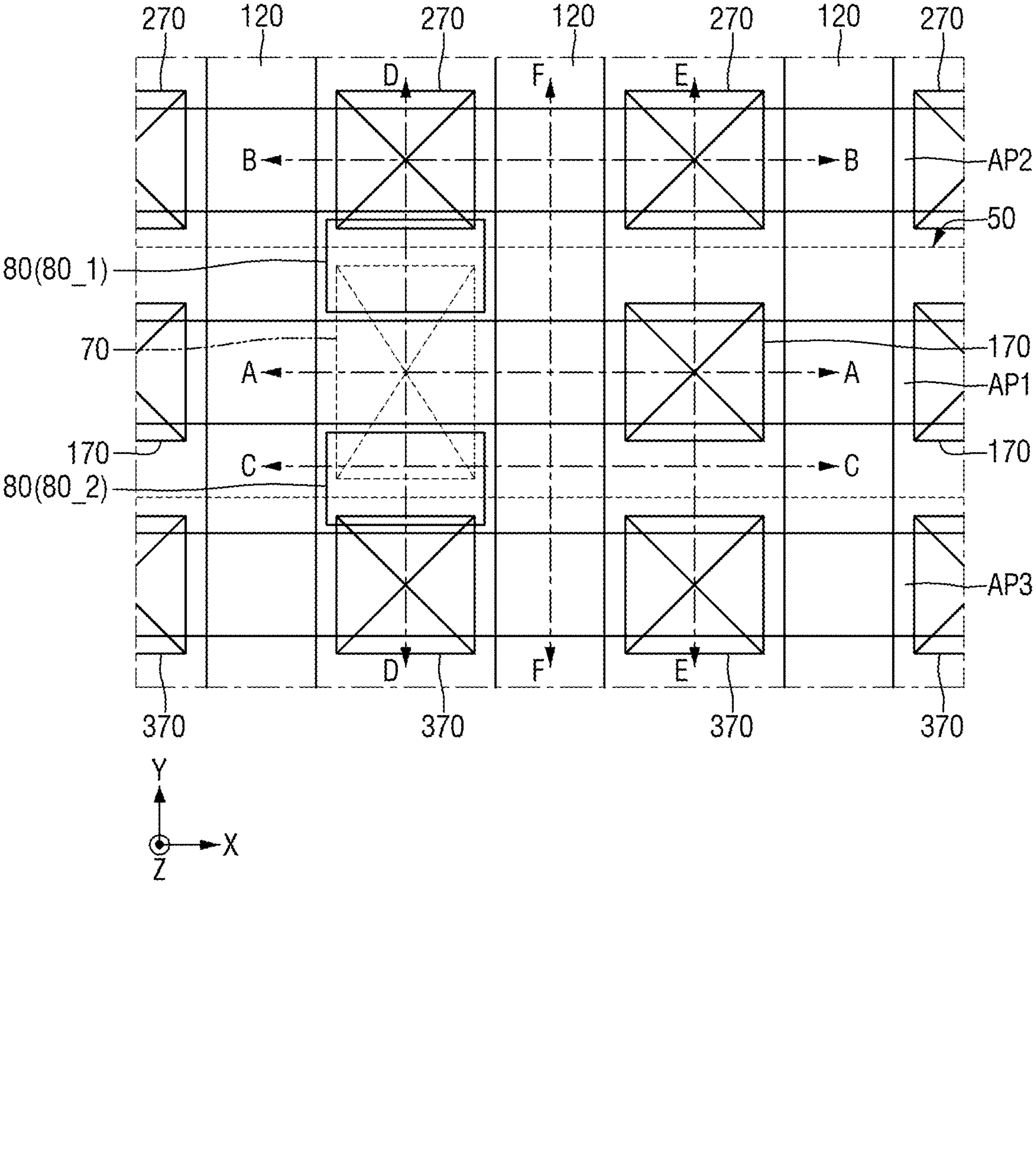
FIG. 1 is a layout diagram for explaining a semiconductor device according to some embodiments.
Figure 8:
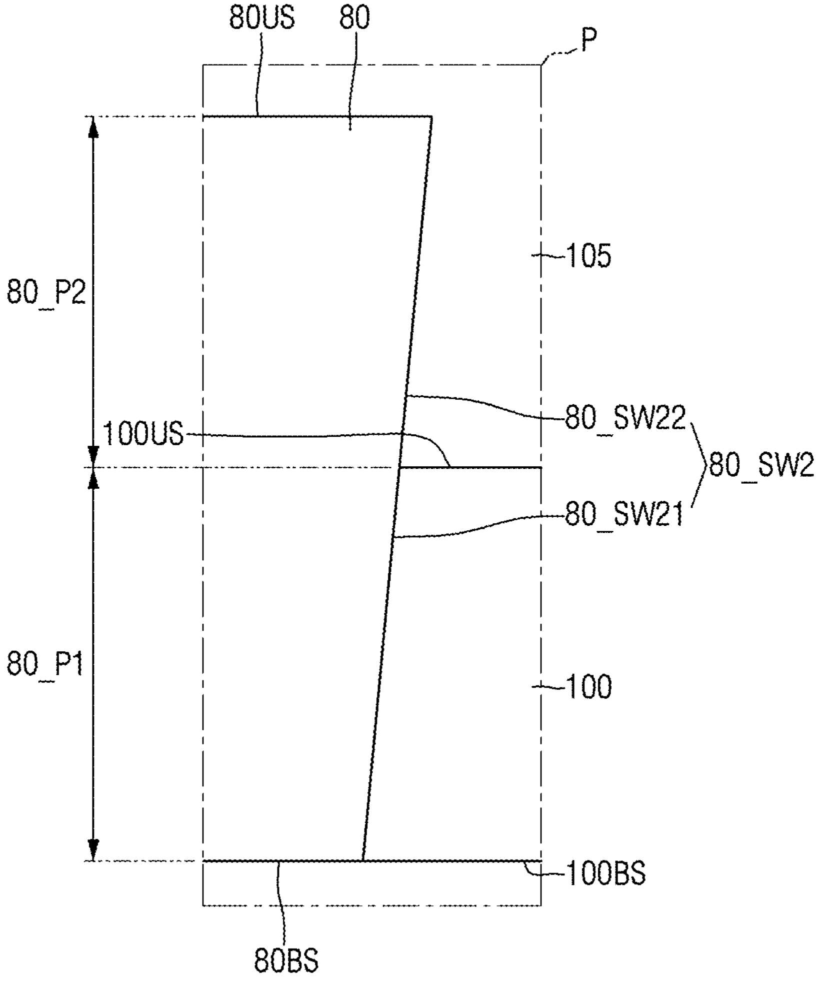
FIGS. 8 to 10 are enlarged views showing a portion P of FIG. 5, respectively.
Figure 9:
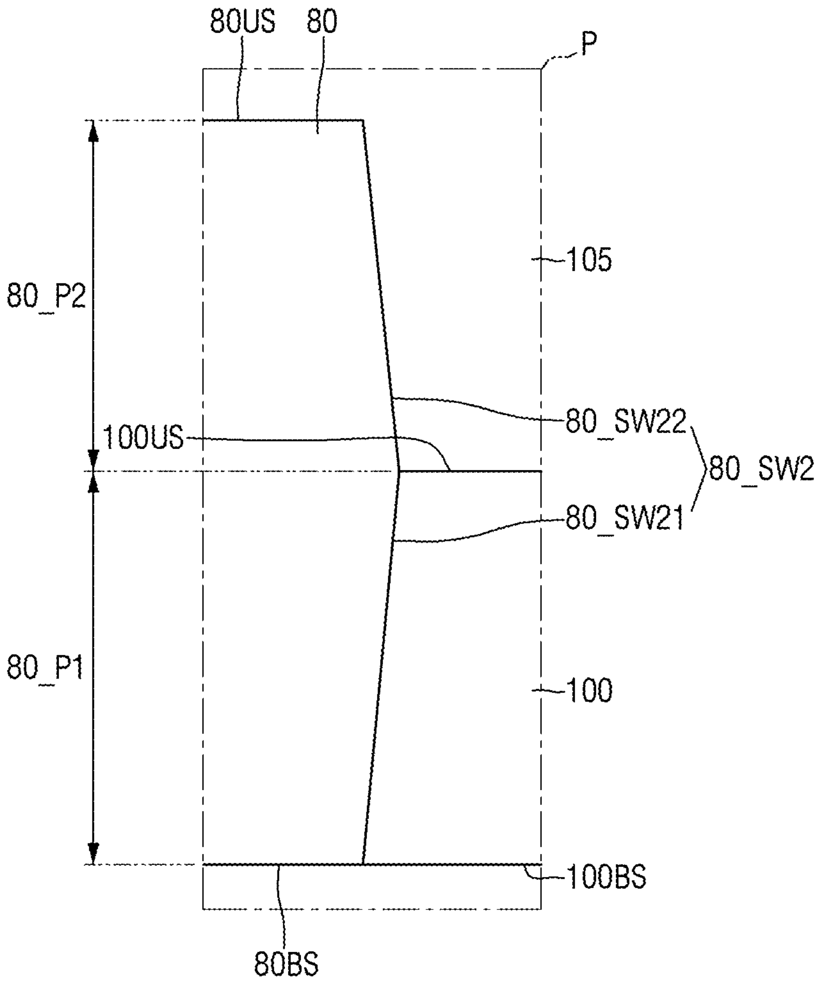
Figure 10:
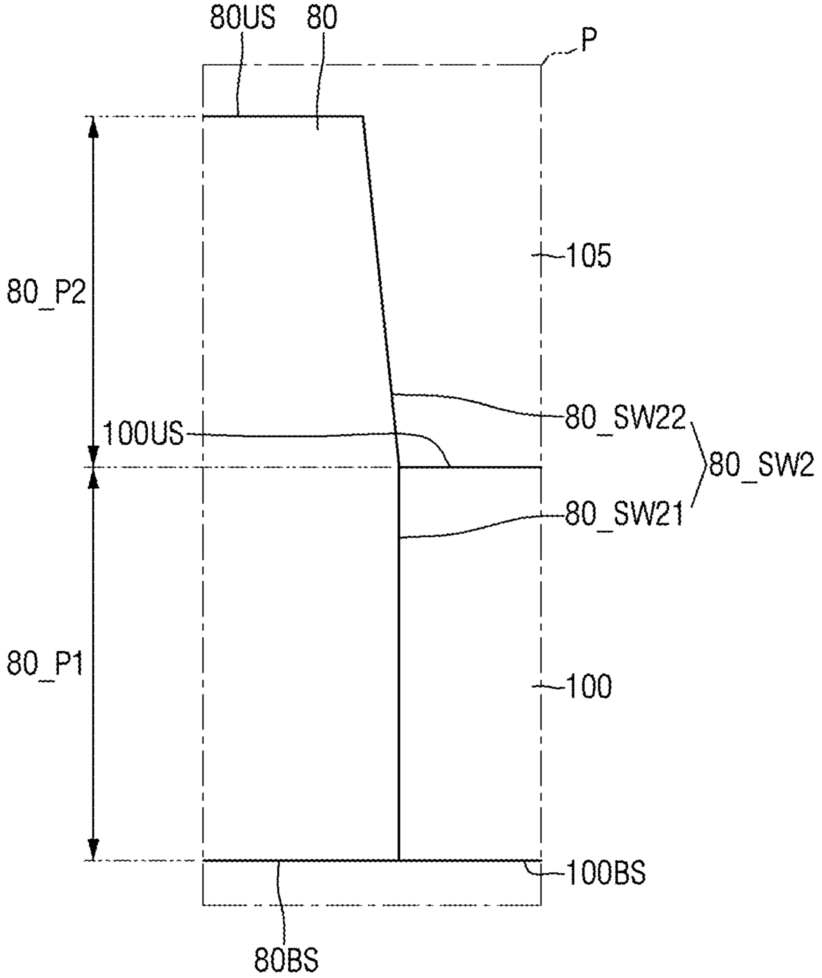

FIG. 1 is a layout diagram for explaining a semiconductor device according to some embodiments. FIGS. 2 to 7 are cross-sectional views taken along lines A-A, B-B, C-C, D-D, E-E, and F-F of FIG. 1. FIGS. 8 to 10 are enlarged views showing a portion P of FIG. 5.

For convenience of explanation, a front wiring line 197 and a front wiring via 196 are not shown in FIG. 1. Although not shown, a cross-sectional view taken along a third active pattern AP3 in the first direction X may be similar to that of FIG. 3.

Referring to FIGS. 1 to 10, the semiconductor device according to some embodiments may include a substrate 100, a field insulating film 105, a first active pattern AP1, a second active pattern AP2, a third active pattern AP3, a back wiring line 50, a back source/drain contact 70, a back contact guide pattern 80, a plurality of gate electrodes 120, a first source/drain pattern 150, a second source/drain pattern 250, a third source/drain pattern 350, a first front source/drain contact 170, a second front source/drain contact 270, a third front source/drain contact 370, and a source/drain etching stop film 185.

The substrate 100 may include a first face 100US and a second face 100BS that are opposite to each other in a third direction Z. Since the gate electrode 120 and the source/drain patterns 150, 250, and 350 may be disposed on the first face 100US of the substrate, the first face 100US of the substrate may be an upper face (e.g., a top face) of the substrate 100. A second face 100BS of the substrate opposite to the first face 100US of the substrate may be a lower face (e.g., a bottom face) of the substrate 100.

As used herein, a first element that is described as being "on" or "disposed on" a second element may be directly on and in contact with the second element, or there may be one or more other elements provided therebetween.

Spatially relative terms, such as "beneath," "below," "lower," "above," "upper," "top," "bottom," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The substrate 100 may be made up of or may include a semiconductor material. The substrate 100 may be a silicon substrate or a silicon-on-insulator (SOI) substrate. In contrast, the substrate 100 may include, for example, but not limited to, silicon germanium, silicon germanium on insulator (SGOI), indium antimonide, lead telluride, indium arsenide, indium phosphide, gallium arsenide or gallium antimonide.

Each of the active patterns AP1, AP2 and AP3 may be disposed on the substrate 100. For example, each of the active patterns AP1, AP2 and AP3 may be disposed on the first face 100US of the substrate. Each of the active patterns AP1, AP2, and AP3 may extend lengthwise in a first direction X, respectively.

As used herein, an item, layer, or portion of an item or layer described as "extending" or "extending lengthwise" in a particular direction has a length in the particular direction and a width perpendicular to that direction, where the length is greater than the width.

The first active pattern AP1 may be spaced apart from the second active pattern AP2 and the third active pattern AP3 in the second direction Y. The first active pattern AP1 may be disposed between the second active pattern AP2 and the third active pattern AP3. The second active pattern AP2 and the third active pattern AP3 may be adjacent to the first active pattern AP1 in the second direction Y, respectively.

As an example, the first active pattern AP1 and the second active pattern AP2 may be regions in which transistors of the same conductivity type are formed. The third active pattern AP3 may be a region in which a transistor of a conductivity type different from that of the first active pattern AP1 is formed. For example, if the first active pattern AP1 is a region in which a p-type transistor is formed, the second active pattern AP2 is a region in which the p-type transistor is formed, and the third active pattern AP3 may be a region in which an n-type transistor is formed.

As another example, the first active pattern AP1 and the third active pattern AP3 may be regions in which transistors of the same conductivity type are formed. The second active pattern AP2 may be a region in which a transistor of a conductivity type different from that of the first active pattern AP1 is formed. For example, if the first active pattern AP1 is a region in which the p-type transistor is formed, the second active pattern AP2 may be a region in which the n-type transistor is formed, and the third active pattern AP3 may be a region in which the p-type transistor is formed.

Each of the active patterns AP1, AP2 and AP3 may be a multi-channel active pattern. For example, the first active pattern AP1 may include a first lower pattern BP1 and a plurality of first sheet patterns NS1. The second active pattern AP2 may include a second lower pattern BP2 and a plurality of second sheet patterns NS2. The third active pattern AP3 may include a third lower pattern BP3 and a plurality of third sheet patterns NS3. In the semiconductor device according to some embodiments, each of the active patterns AP1, AP2 and AP3 may be an active pattern that includes a nanosheet or nanowire.

Each of the lower patterns BP1, BP2, and BP3 may protrude from the substrate 100. For example, each of the lower patterns BP1, BP2, and BP3 may protrude from the first face 100US of the substrate in the third direction Z. Each of the lower patterns BP1, BP2, and BP3 may be a fin-shaped pattern.

Each of the lower patterns BP1, BP2, and BP3 may extend lengthwise in the first direction X. The first lower pattern BP1 may be spaced apart from the second lower pattern BP2 and the third lower pattern BP3 in a second direction Y. The first lower pattern BP1 may be disposed between the second lower pattern BP2 and the third lower pattern BP3.

Each of the lower patterns BP1, BP2, and BP3 may be separated by a fin trench FT extending in the first direction X. For example, the first face 100US of the substrate may be a bottom face of the fin trench FT.

Figure 7:
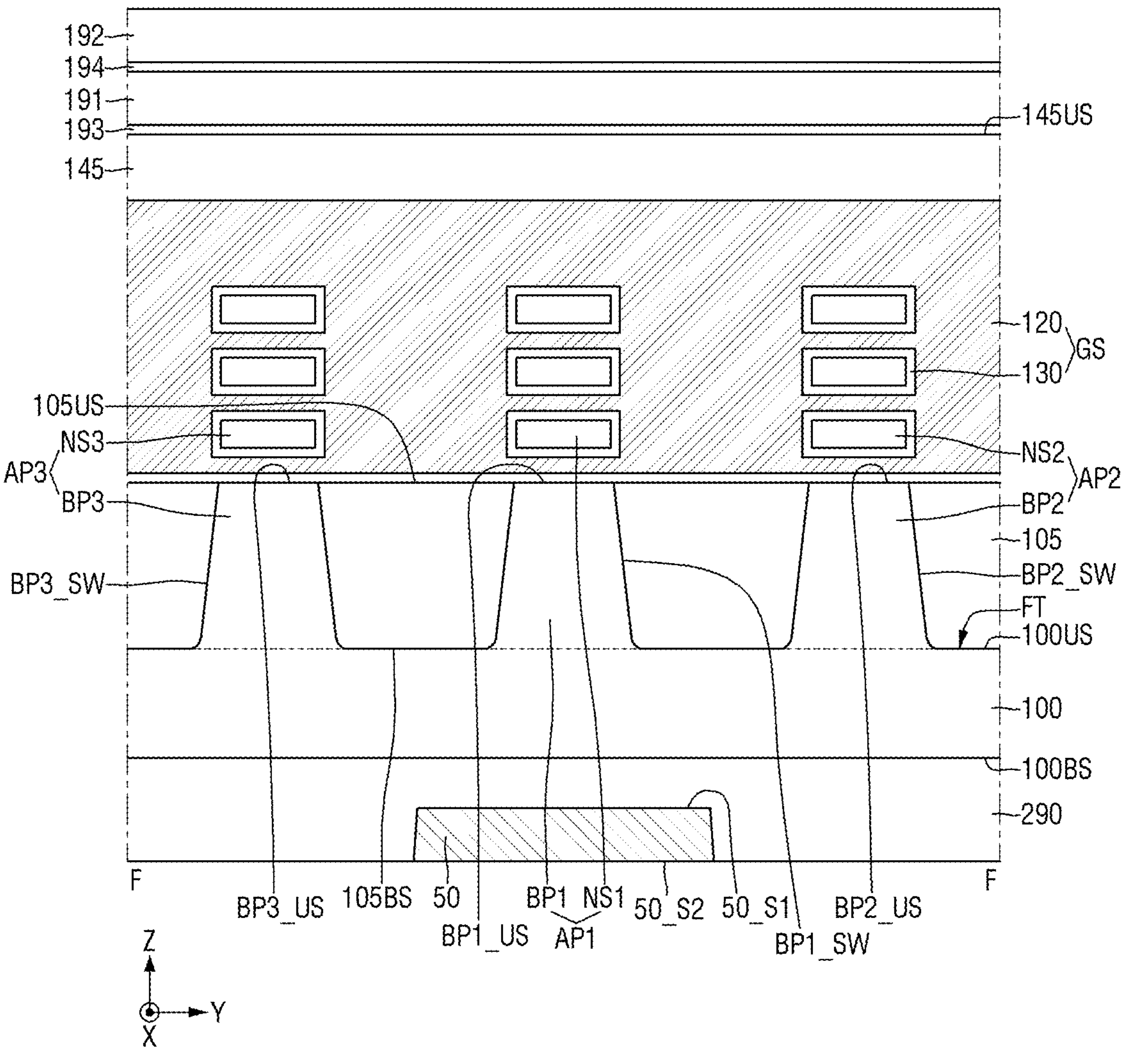

Referring to FIG. 7, for example, the first lower pattern BP1 may include a side wall BP1_SW extending in the first direction X. The second lower pattern BP2 may include a side wall BP2_SW extending in the first direction X. The third lower pattern BP3 may include a side wall BP3_SW extending in the first direction X. The side wall BP1_SW of the first lower pattern, the side wall BP2_SW of the second lower pattern, and the side wall BP3_SW of the third lower pattern may each be defined by the fin trench FT.

The plurality of first sheet patterns NS1 may be disposed on the first lower pattern BP1. The plurality of first sheet patterns NS1 may be spaced apart from the upper face BP1_US of the first lower pattern in the third direction Z.

The plurality of second sheet patterns NS2 may be disposed on the second lower pattern BP2. The plurality of second sheet patterns NS2 may be spaced apart from the upper face BP2_US of the second lower pattern in the third direction Z.

The plurality of third sheet patterns NS3 may be disposed on the third lower pattern BP3. The plurality of third sheet patterns NS3 may be spaced apart from the upper face BP3_US of the third lower pattern in the third direction Z. The first sheet pattern NS1, the second sheet pattern NS2, and the third sheet pattern NS3 may be disposed on the first face 100US of the substrate.

Here, the first direction X may intersect the second direction Y and the third direction Z. Further, the second direction Y may intersect the third direction Z. The third direction Z may be a thickness direction of the first substrate 100.

The sheet patterns NS1, NS2, and NS3 may each include an upper face (e.g., a top face) and a bottom face (e.g., a lower face) that are opposite to each other in the third direction Z. The bottom faces of the sheet patterns NS1, NS2, and NS3 may face the substrate 100, respectively. Although three sheet patterns NS1, NS2, and NS3 are shown as being disposed in the third direction Z, this is only for convenience of explanation, and the embodiment is not limited thereto.

The upper face AP1_US of the first active pattern may be an upper face of the first sheet pattern NS1 disposed at the uppermost part among the plurality of first sheet patterns NS1. The upper face AP2_US of the second active pattern may be the upper face of the second sheet pattern NS2 disposed at the uppermost part among the plurality of second sheet patterns NS2. Although not shown, the upper face of the third active pattern AP3 may be the upper face of the third sheet pattern NS3 disposed at the uppermost part among the plurality of third sheet patterns NS3.

Each of the lower patterns BP1, BP2, and BP3 may be formed by etching a part of the substrate 100, or may include an epitaxial layer grown from the substrate 100. Each of the lower patterns BP1, BP2, and BP3 may be formed of or include silicon or germanium, which is an elemental semiconductor material. Further, each of the lower patterns BP1, BP2, and BP3 may include a compound semiconductor, and may include, for example, a group IV-IV compound semiconductor or a group III-V compound semiconductor.

The group IV-IV compound semiconductor may be, for example, a binary compound or a ternary compound including at least two or more of carbon (C), silicon (Si), germanium (Ge) and tin (Sn), or a compound obtained by doping these elements with a group IV element.

The group III-V compound semiconductor may be, for example, one of a binary compound, a ternary compound or a quaternary compound formed by combining at least one of aluminum (Al), gallium (Ga) and indium (In) as a group III element with one of phosphorus (P), arsenic (As) and antimony (Sb) as a group V element.

Each of the sheet patterns NS1, NS2 and NS3 may be formed of or include one of silicon or germanium which is an elemental semiconductor material, a group IV-IV compound semiconductor, or a group III-V compound semiconductor. Taking the first sheet pattern NS1 as an example, a width of the first sheet pattern NS1 in the second direction Y may increase or decrease in proportion to a width of the first lower pattern BP1 in the second direction Y. Although the widths in the second direction Y of each first sheet pattern NS1 disposed on the first lower pattern BP1 are shown as being the same, the embodiment is not limited thereto.

A field insulating film 105 is disposed on the substrate 100. For example, the field insulating film 105 may be disposed on the first face 100US of the substrate. The field insulating film 105 may fill at least a part of the fin trench FT that separates the lower patterns BP1, BP2, and BP3.

The field insulating film 105 (see, e.g., FIGS. 4-7) may be disposed on the substrate 100 between the lower patterns BP1, BP2, and BP3. The field insulating film 105 may cover the side walls BP1_SW of the first lower pattern, the side walls BP2_SW of the second lower pattern, and the side walls BP3_SW of the third lower pattern.

As an example, the field insulating film 105 may cover the entire side wall BP1_SW of the first lower pattern, the entire side wall BP2_SW of the second lower pattern, and the entire side wall BP3_SW of the third lower pattern. Unlike the shown example, as another example, the field insulating film 105 may cover a part of the side walls of the lower patterns BP1, BP2, and BP3. In this case, a part of the lower patterns BP1, BP2, and BP3 may protrude in the third direction Z beyond the upper face of the field insulating film 105.

The field insulating film 105 does not cover the upper face BP1_US of the first lower pattern. The field insulating film 105 does not cover the upper face BP2_US of the second lower pattern. The field insulating film 105 does not cover the upper face BP3_US of the third lower pattern.

The field insulating film 105 may include an upper face (e.g., a top face) 105US and a bottom face (e.g., a lower face) 105BS that are opposite to each other in the third direction Z. The bottom face 105BS of the field insulating film may face the substrate 100. The upper face 105US of the field insulating film may face the gate electrode 120. Each of the sheet patterns NS1, NS2 and NS3 is disposed to be higher than the upper face 105US of the field insulating film 105.

The field insulating film 105 may be formed of or include, for example, an oxide film, a nitride film, an oxynitride film or a combined film thereof. Although the field insulating film 105 is shown as being a single film, this is for convenience of explanation, and the embodiment is not limited thereto.

Figure 5:
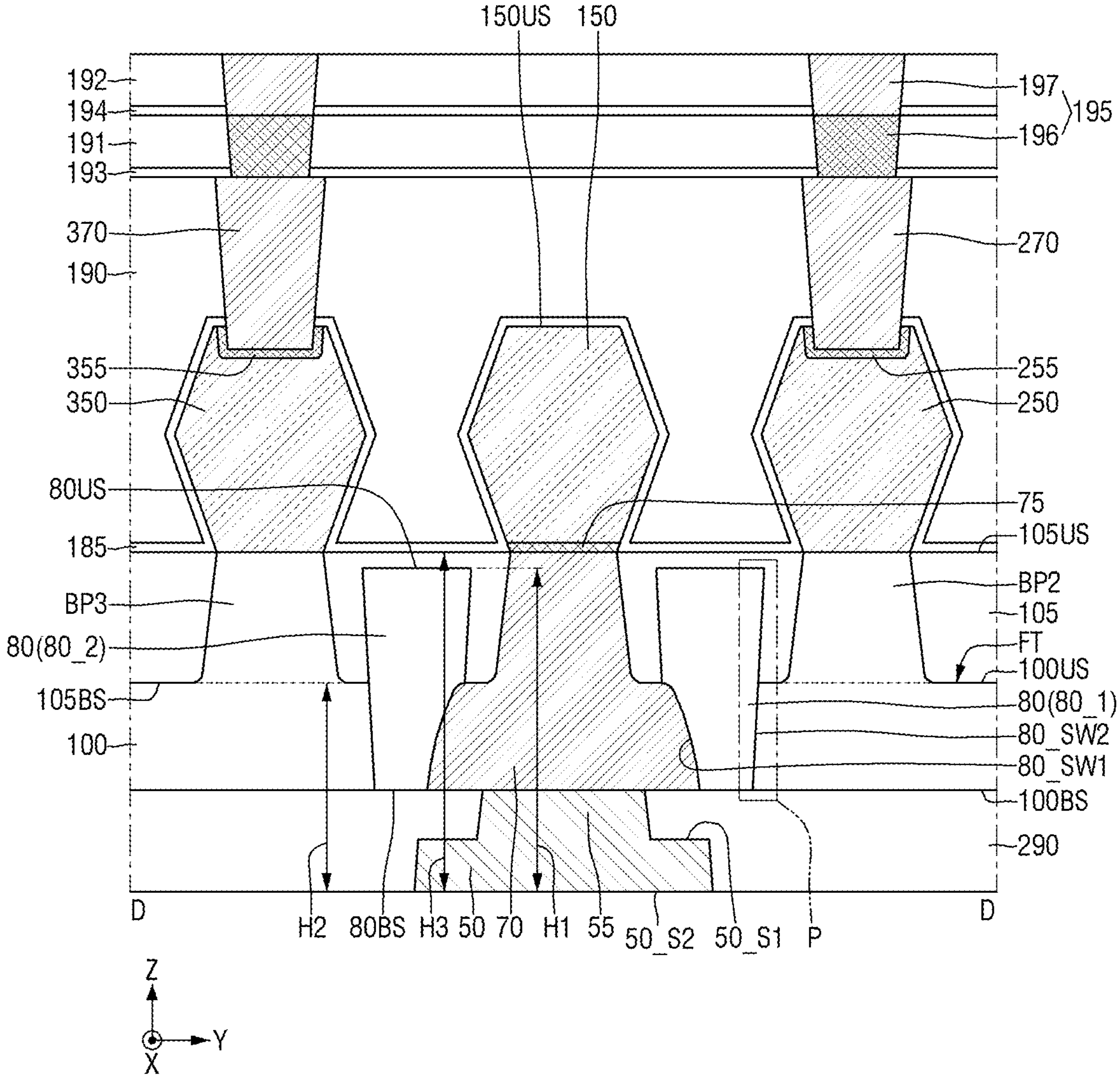
Figure 6:
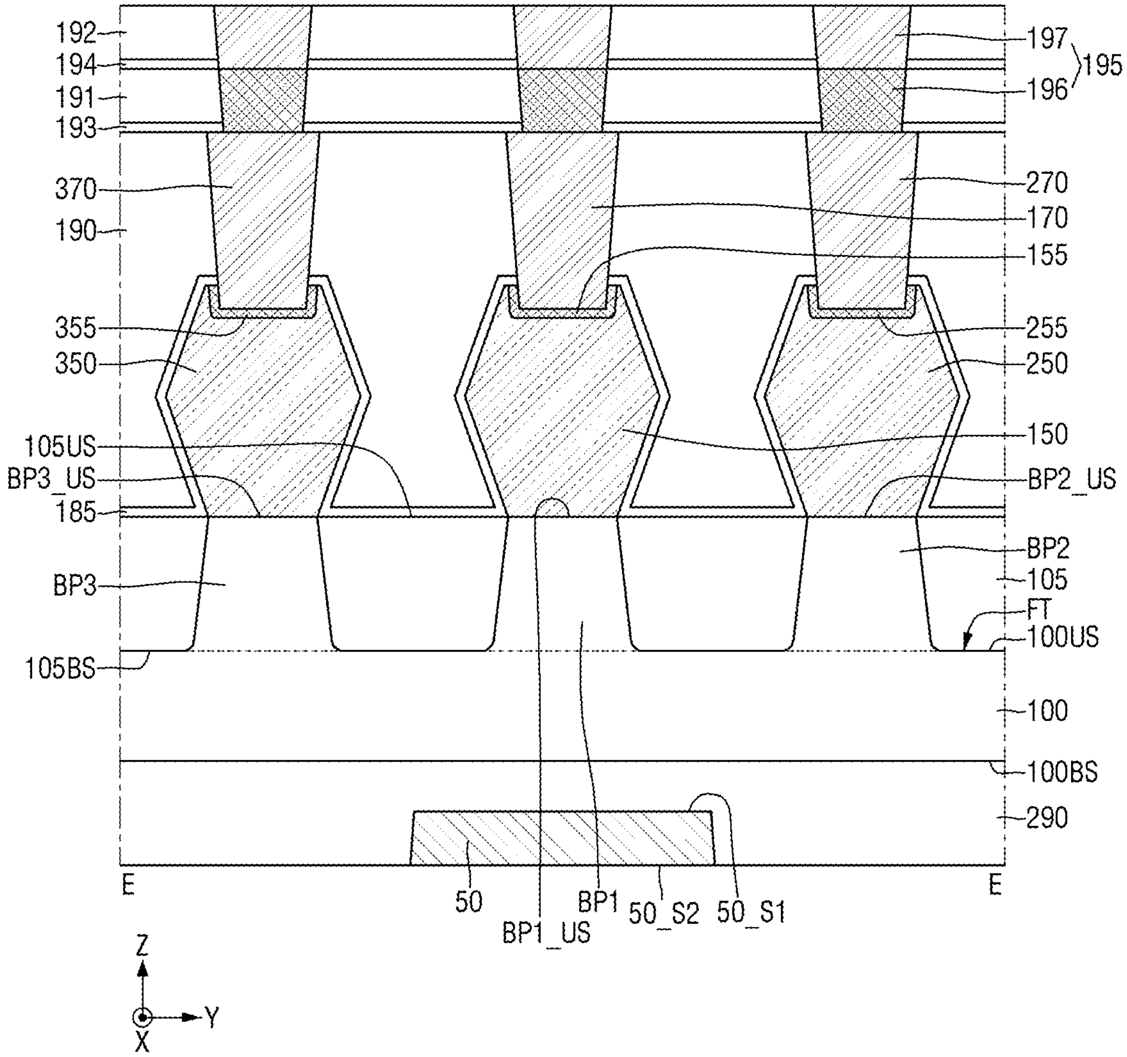

In FIGS. 5 to 7, although the upper face 105US of the field insulating film between the first lower pattern BP1 and the second lower pattern BP2, and the upper face 105US of the field insulating film between the first lower pattern BP1 and the third lower pattern BP3 are shown as being coplanar, the embodiment is not limited thereto.

The first lower pattern BP1 will be explained as an example. The first lower pattern includes a first region that overlaps the first sheet pattern NS1 in the third direction Z, and a second region that overlaps the first source/drain pattern 150 in the third direction Z. The upper face BP1_US of the first lower pattern in the first region of the first lower pattern BP1 may be higher than the upper face BP1_US of the first lower pattern in the second region of the first lower pattern BP1. While forming the first source/drain pattern 150, a part of the first lower pattern BP1 may be etched to lower the upper face BP1_US of the first lower pattern.

The field insulating film 105 may include a first region that overlaps the gate electrode 120 in the third direction Z, and a second region disposed between the gate electrodes 120. The upper face 105US of the field insulating film in the first region of the field insulating film 105 may be higher than the upper face 105US of the field insulating film in the second region of the field insulating film 105. While forming the first source/drain pattern 150, a part of the field insulating film 105 disposed between the gate electrodes 120 may be etched to lower the upper face 105US of the field insulating film 105.

A plurality of gate structures GS may be disposed on the first face 100US of the substrate. Each gate structure GS may extend in the second direction Y. The gate structures GS may be spaced apart in the first direction X. The gate structures GS may be adjacent to each other in the first direction X.

The gate structure GS may be disposed on each of the active patterns AP1, AP2 and AP3. For example, the gate structure GS may intersect the first active pattern AP1, the second active pattern AP2, and the third active pattern AP3. The gate structure GS may be disposed on the upper face 105US of the field insulating film 105.

The gate structure GS may be disposed on the first lower pattern BP1, the second lower pattern BP2, and the third lower pattern BP3. The gate structure GS may intersect the first lower pattern BP1, the second lower pattern BP2, and the third lower pattern BP3. The gate structure GS may surround each first sheet pattern NS1 (see, e.g., FIG. 7). The gate structure GS may surround each second sheet pattern NS2. The gate structure GS may surround each third sheet pattern NS3.

Although the gate structure GS is shown as being disposed over the first to third active patterns AP1, AP2, and AP3, the embodiment is not limited thereto. Unlike the shown example, at least one of the gate structures GS may be separated into two or more portions.

The gate structure GS may include, for example, a gate electrode 120 and a gate insulating film 130.

The gate structure GS may include a plurality of inner gate structures I_GS disposed between the first sheet patterns NS1 adjacent in the third direction Z, and between the first lower pattern BP1 and the first sheet pattern NS1. The plurality of inner gate structures I_GS may be disposed between the second sheet patterns NS2 adjacent to each other in the third direction Z, and between the second lower pattern BP2 and the second sheet pattern NS2. Although not shown, the plurality of inner gate structures I_GS may be disposed between the third sheet patterns NS3 adjacent to each other in the third direction Z, and between the third lower pattern BP3 and the third sheet pattern NS3.

The first active pattern AP1 and the inner gate structure I_GS will be explained as an example. The inner gate structure I_GS may be disposed between the upper face BP1_US of the first lower pattern and the lower face of the lowermost first sheet pattern NS1, and between the upper face BP1_US of the first sheet pattern NS1 and the bottom face of an adjacent first sheet pattern NS1 facing each other in the third direction Z.

The number of inner gate structures I_GS may be the same as the number of first sheet patterns NS1. The inner gate structure I_GS is in contact with the upper face BP1_US of the first lower pattern, the upper face of the first sheet pattern NS1, and the bottom face of the first sheet pattern NS1. The inner gate structure I_GS includes a gate electrode 120 and a gate insulating film 130 disposed between adjacent first sheet patterns NS1, and between the first lower pattern BP1 and the first sheet pattern NS1.

As an example, the inner gate structure I_GS may be in contact with a first source/drain pattern 150 and a second source/drain pattern 250, which will be described below. Although not shown, the inner gate structure I_GS may be in contact with the third source/drain pattern 350. As another example, since an inner spacer is disposed between the inner gate structure I_GS and the third source/drain pattern 350, the inner gate structure I_GS may not be in contact with the third source/drain pattern 350.

Unlike the shown example, as an example, the inner gate structure I_GS may not be in contact with the first source/drain pattern 150 and the second source/drain pattern 250. The inner gate structure I_GS may be in contact with the third source/drain pattern 350. As another example, the inner gate structure I_GS may not be in contact with the first source/drain pattern 150 and the third source/drain pattern 350. The inner gate structure I_GS may be in contact with the second source/drain pattern 250.

The gate electrode 120 may be disposed on the first lower pattern BP1, the second lower pattern BP2, and the third lower pattern BP3. The gate electrode 120 may intersect the first lower pattern BP1, the second lower pattern BP2, and the third lower pattern BP3. The gate electrode 120 may surround the first sheet pattern NS1, the second sheet pattern NS2, and the third sheet pattern NS3.

Figure 2:
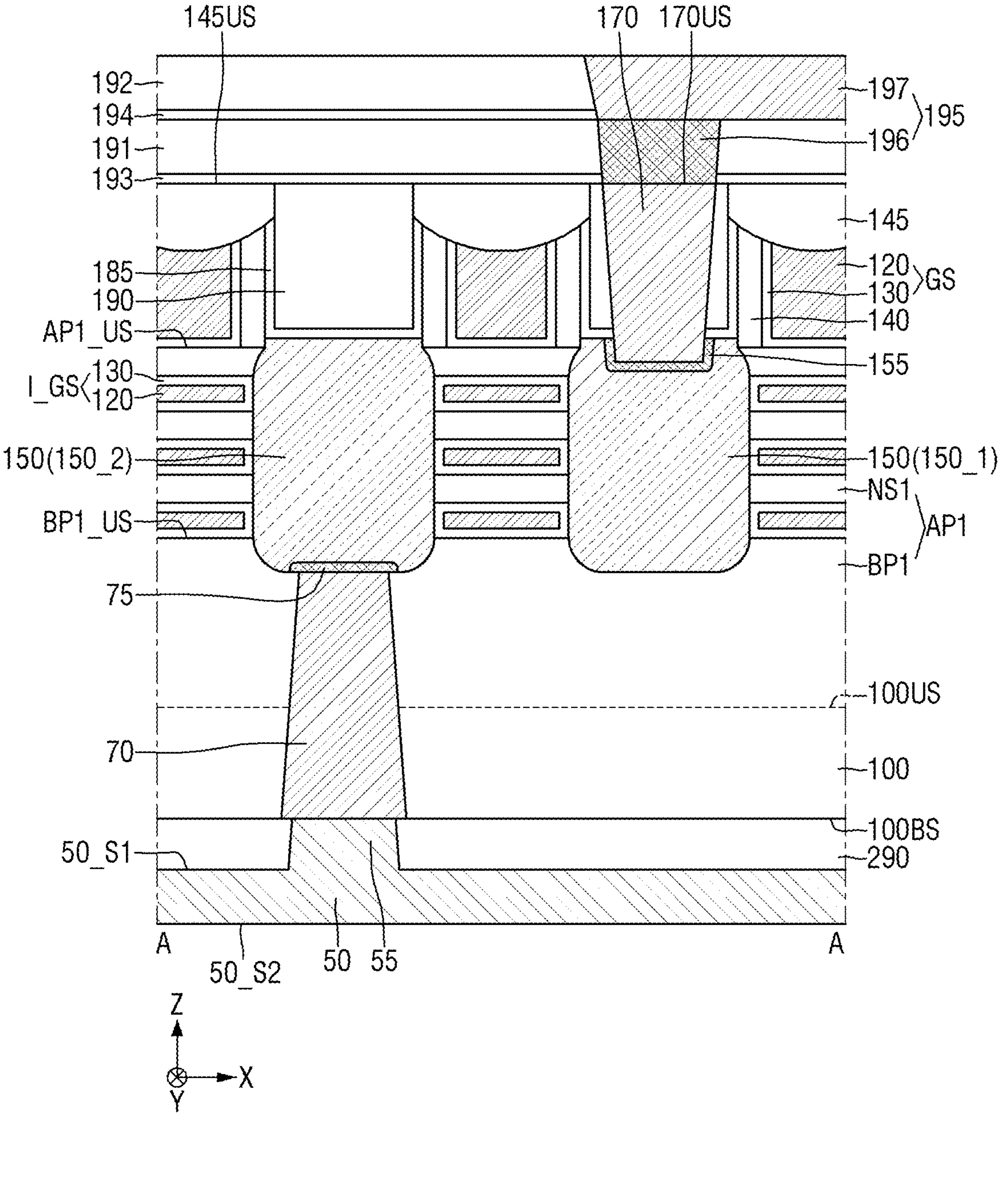
FIGS. 2 to 7 are cross-sectional views taken along lines A-A, B-B, C-C, D-D, E-E, and F-F of FIG. 1.
Figure 3:
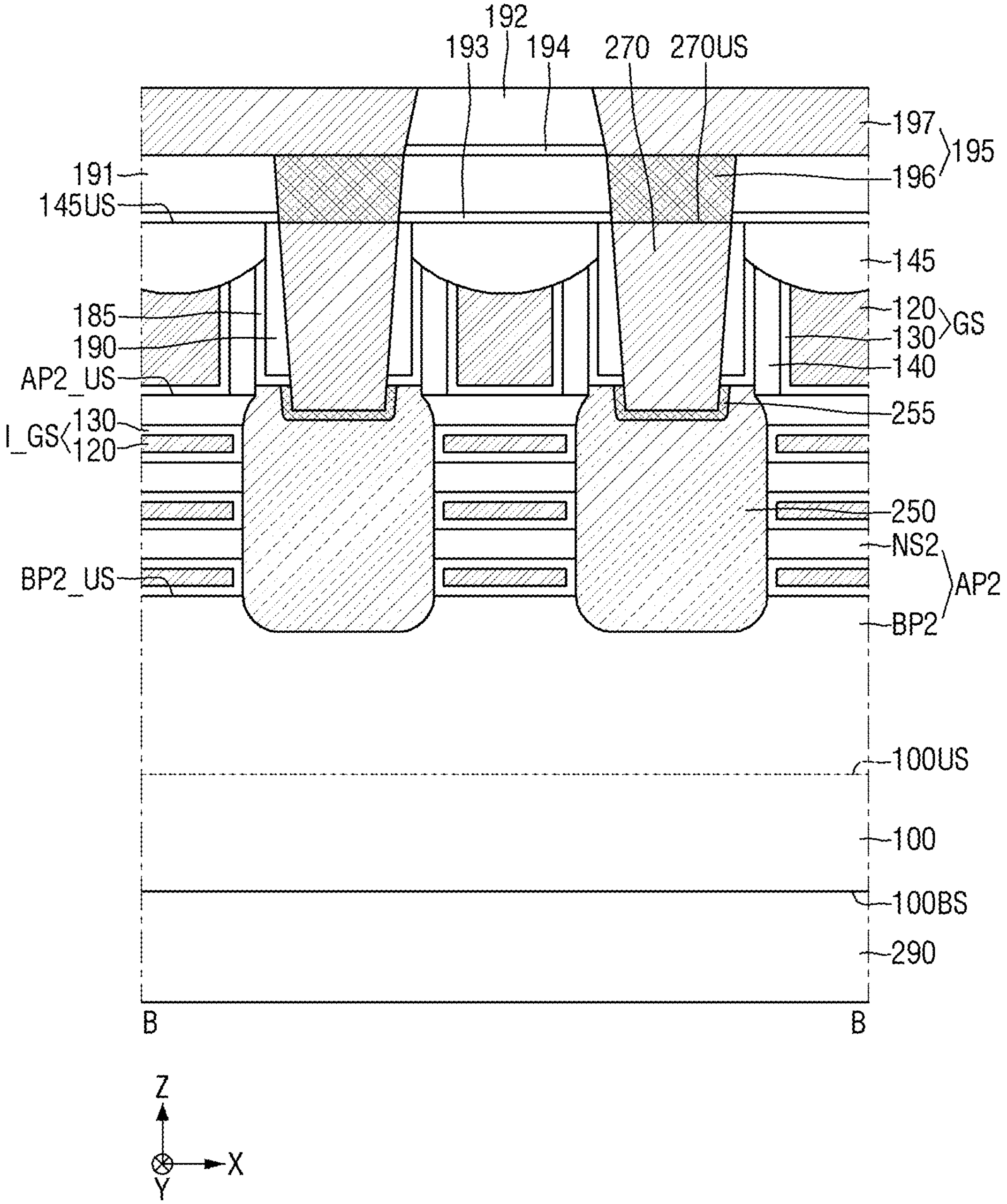

Although the upper face of the gate electrode 120 is shown as being a concave curved face in the cross-sectional views shown in FIGS. 2 and 3, the embodiment is not limited thereto. The upper face of the gate electrode 120 may be a plane.

The gate electrode 120 may be formed of or include at least one of a metal, a conductive metal nitride, a metal silicide, a doped semiconductor material, a conductive metal oxide, and a conductive metal oxynitride. The gate electrode 120 may include, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlCN), titanium aluminum carbide (TiAlC), titanium carbide (TIC), tantalum carbonitride (TaCN), tungsten (W), aluminum (Al), copper (Cu), cobalt (Co), titanium (Ti), tantalum (Ta), nickel (Ni), platinum (Pt), nickel platinum (NiPt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and combinations thereof. The conductive metal oxide and conductive metal oxynitride may include, but are not limited to, oxidized forms of the aforementioned materials.

The gate insulating film 130 may extend along the upper face 105US of the field insulating film, the upper face BP1_US of the first lower pattern, the upper face BP2_US of the second lower pattern, and the upper face BP3_US of the third lower pattern. The gate insulating film 130 may surround the plurality of first sheet patterns NS1. The gate insulating film 130 may surround the plurality of second sheet patterns NS2. The gate insulating film 130 may surround the plurality of third sheet patterns NS3. The gate insulating film 130 may be disposed along the periphery of the first sheet pattern NS1, the periphery of the second sheet pattern NS2, and the periphery of the third sheet pattern NS2. The gate electrode 120 is disposed on the gate insulating film 130.

The gate insulating film 130 is disposed between the gate electrode 120 and the first sheet pattern NS1, between the gate electrode 120 and the second sheet pattern NS2, and between the gate electrode 120 and the third sheet pattern NS3. When the inner gate structure I_GS and the first source/drain pattern 150 are in contact with each other, the gate insulating film 130 included in the inner gate structure I_GS may be in contact with the first source/drain pattern 150.

The gate insulating film 130 may be formed of or include silicon oxide, silicon oxynitride, silicon nitride, or a high dielectric constant material having a higher dielectric constant than silicon oxide. The high dielectric constant material may include, for example, one or more of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate.

Although the gate insulating film 130 is shown as being a single film, this example is only for convenience of explanation and is not limited thereto. The gate insulating film 130 may include a plurality of films. The first active pattern AP1 will be explained as an example. The gate insulating film 130 may include an interfacial layer disposed between the first active pattern AP1 and the gate electrode 120, and a high dielectric constant insulating film. For example, an interfacial layer may not be formed along a profile of the upper face 105US of the field insulating film.

The semiconductor device according to some embodiments may include an NC (Negative Capacitance) FET that uses a negative capacitor. For example, the gate insulating film 130 may include a ferroelectric material film having ferroelectric properties, and a paraelectric material film having paraelectric properties.

The ferroelectric material film may have a negative capacitance, and the paraelectric material film may have a positive capacitance. For example, when two or more capacitors are connected in series and the capacitance of each capacitor has a positive value, the overall capacitances decrease from the capacitance of each of the individual capacitors. On the other hand, if at least one of the capacitances of two or more capacitors connected in series has a negative value, the overall capacitances may be greater than an absolute value of each of the individual capacitances, while having a positive value.

When the ferroelectric material film having the negative capacitance and the paraelectric material film having the positive capacitance are connected in series, the overall capacitance values of the ferroelectric material film and the paraelectric material film connected in series may increase. By the use of the increased overall capacitance value, a transistor including the ferroelectric material film may have a subthreshold swing (SS) below 60 mV/decade at room temperature.

The ferroelectric material film may have ferroelectric properties. The ferroelectric material film may be formed of or include, for example, at least one of hafnium oxide, hafnium zirconium oxide, barium strontium titanium oxide, barium titanium oxide, and lead zirconium titanium oxide. Here, as an example, the hafnium zirconium oxide may be a material obtained by doping hafnium oxide with zirconium (Zr). As another example, the hafnium zirconium oxide may be a compound of hafnium (Hf), zirconium (Zr), and oxygen (O).

The ferroelectric material film may further include a dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). The type of dopant included in the ferroelectric material film may vary, depending on which type of ferroelectric material is included in the ferroelectric material film.

When the ferroelectric material film includes hafnium oxide, the dopant included in the ferroelectric material film may include, for example, at least one of gadolinium (Gd), silicon (Si), zirconium (Zr), aluminum (Al), and yttrium (Y).

When the dopant is aluminum (Al), the ferroelectric material film may include 3 to 8 at % (atomic %) aluminum. Here, a ratio of the dopant may be a ratio of aluminum to the sum of hafnium and aluminum.

When the dopant is silicon (Si), the ferroelectric material film may include 2 to 10 at % silicon. When the dopant is yttrium (Y), the ferroelectric material film may include 2 to 10 at % yttrium. When the dopant is gadolinium (Gd), the ferroelectric material film may include 1 to 7 at % gadolinium. When the dopant is zirconium (Zr), the ferroelectric material film may include 50 to 80 at % zirconium.

The paraelectric material film may have the paraelectric properties. The paraelectric material film may be formed of or include at least one of, for example, a silicon oxide and a metal oxide having a high dielectric constant. The metal oxide included in the paraelectric material film may include, for example, but not limited to, at least one of hafnium oxide, zirconium oxide, and aluminum oxide.

The ferroelectric material film and the paraelectric material film may include the same material. The ferroelectric material film has ferroelectric properties, but the paraelectric material film may not have ferroelectric properties. For example, when the ferroelectric material film and the paraelectric material film include hafnium oxide, a crystal structure of hafnium oxide included in the ferroelectric material film is different from a crystal structure of hafnium oxide included in the paraelectric material film.

The ferroelectric material film may have a thickness having the ferroelectric properties. The thickness of the ferroelectric material film may be, for example, but not limited to, 0.5 to 10 nm. Since a critical thickness that exhibits the ferroelectric properties may vary for each ferroelectric material, the thickness of the ferroelectric material film may vary depending on the ferroelectric material.

As an example, the gate insulating film 130 may include a single ferroelectric material film. As another example, the gate insulating film 130 may include a plurality of ferroelectric material films spaced apart from each other. The gate insulating film 130 may have a stacked film structure in which the plurality of ferroelectric material films and the plurality of paraelectric material films are alternately stacked.

The gate spacer 140 may be disposed on the side wall of the gate electrode 120. For example, the gate spacer 140 may be disposed on a long side wall of the gate structure GS. The long side wall of the gate structure GS may extend in the second direction Y. The gate spacer 140 may not be disposed between the first lower pattern BP1 and the first sheet pattern NS1, and between adjacent first sheet patterns NS1 in the third direction Z. The gate spacer 140 may not be disposed between the second lower pattern BP2 and the second sheet pattern NS2, and between adjacent second sheet patterns NS2 in the third direction Z.

The gate spacer 140 may be formed of or include, for example, at least one of silicon nitride (SiN), silicon oxynitride (SiON), silicon oxide ($SiO_2$), silicon oxycarbonitride (SiOCN), silicon boronitride (SiBN), silicon oxyboronitride (SiOBN), silicon oxycarbide (SiOC), and combinations thereof. Although the gate spacer 140 is shown as being a single film, this example is only for convenience of explanation, and the embodiment is not limited thereto.

A gate capping pattern 145 may be disposed on the gate electrode 120. The gate capping pattern 145 may be disposed on the upper face of the gate spacer 130. Unlike the shown example, the gate capping pattern 145 may be disposed between the gate spacers 140.

The gate capping pattern 145 may be formed of or include, for example, at least one of silicon nitride (SiN), silicon oxynitride (SiON), silicon carbonitride (SiCN), silicon oxycarbonitride (SiOCN), and combinations thereof.

Unlike the shown example, the gate capping pattern 145 may not be disposed on the gate electrode 120. In this case, the gate electrode 120 may be in contact with the first etching stop film 193.

The first source/drain pattern 150 may be disposed on the first active pattern AP1. The first source/drain pattern 150 may be disposed on the first lower pattern BP1. The first source/drain pattern 150 may be disposed between gate electrodes 120 adjacent in the first direction. The first source/drain pattern 150 may be in contact with the first active pattern AP1. The first source/drain pattern 150 may be in contact with the first sheet pattern NS1. The first source/drain pattern 150 is connected to the first sheet pattern NS1 on the first face 100US of the substrate.

The second source/drain pattern 250 may be disposed on the second active pattern AP2. The second source/drain pattern 250 may be disposed on the second lower pattern BP2. The second source/drain pattern 250 may be disposed between the gate electrodes 120 adjacent in the first direction. The second source/drain pattern 250 may be in contact with the second active pattern AP2. The second source/drain pattern 250 may be in contact with the second sheet pattern NS2. The second source/drain pattern 250 is connected to the second sheet pattern NS2 on the first face 100US of the substrate.

The third source/drain pattern 350 may be disposed on the third active pattern AP3. The third source/drain pattern 350 may be disposed on the third lower pattern BP3. Although not shown, the third source/drain pattern 350 may be in contact with the third sheet pattern NS3.

The source/drain patterns 150, 250 and 350 may include bottom faces (e.g., lower faces) that face the lower patterns BP1, BP2 and BP3, and side walls that extend in the third direction Z from the bottom faces of the source/drain patterns 150, 250 and 350. The side walls of the source/drain patterns 150, 250, and 350 may include, but are not limited to, facet intersections on which inclined faces join.

For example, the source/drain patterns 150, 250 and 350 may include upper faces (e.g., top faces) connected to the side walls of the source/drain patterns 150, 250 and 350. The upper face 150US of the first source/drain pattern, which is not connected to the first front source/drain contact 170, may be a plane in terms of a cross-sectional view (see, e.g., FIG. 2).

Unlike the shown example, the source/drain patterns 150, 250 and 350 may not include the upper face. That is, two side walls extending in the third direction Z from the bottom faces of the source/drain patterns 150, 250, and 350 may directly join.

Although FIGS. 5 and 6 show that the outer shapes of the source/drain patterns 150, 250, and 350 are similar to a hexagon, the shape is not limited thereto. Unlike the shown example, the outer shapes of the source/drain patterns 150, 250, and 350 may be similar to a pentagon or a square.

The first source/drain pattern 150 may be included in the source/drain of a transistor that uses the first sheet pattern NS1 as a channel region. The second source/drain pattern 250 may be included in the source/drain of a transistor that uses the second sheet pattern NS2 as a channel region. The third source/drain pattern 350 may be included in the source/drain of a transistor that uses the third sheet pattern NS3 as a channel region.

Taking the first source/drain pattern 150 as an example, the first source/drain pattern 150 may include a first upper connecting source/drain pattern 150_1 and a first lower connecting source/drain pattern 150_2. The first upper connecting source/drain pattern 150_1 may be connected to the first front source/drain contact 170. The first lower connecting source/drain pattern 150_2 may be connected to the back source/drain contact 70. Although not shown, each of the second source/drain pattern 250 and the third source/drain pattern 350 may include a front connecting source/drain pattern and a back connecting source/drain pattern.

Each of the source/drain patterns 150, 250, and 350 may include an epitaxial pattern. Each of the source/drain patterns 150, 250, and 350 may be formed of or include a semiconductor material.

Some of the source/drain patterns 150, 250 and 350 may include p-type dopants. The p-type dopants may include, but are not limited to, at least one of boron (B) and gallium (Ga). The remainder of the source/drain patterns 150, 250, and 350 may include n-type dopants. The n-type dopants may include, but are not limited to, at least one of phosphorus (P), arsenic (As), antimony (Sb), and bismuth (Bi).

The source/drain etching stop film 185 may extend along the outer wall of the gate spacer 140 and the side walls of the source/drain patterns 150, 250, and 350. The source/drain etching stop film 185 may extend along the upper face 105US of the field insulating film. The source/drain etching stop film 185 may extend along the upper face of the source/drain patterns 150, 250, and 350. For example, the source/drain etching stop film 185 may extend along the upper face 150US of the first source/drain pattern.

The source/drain etching stop film 185 may not extend along the side walls of the gate capping pattern 145. Unlike the shown example, the source/drain etching stop film 185 may extend along the side walls of the gate capping pattern 145.

The source/drain etching stop film 185 may be formed of or include, for example, at least one of silicon nitride (SiN), silicon oxynitride (SiON), silicon oxycarbonitride (SiOCN), silicon boronitride (SiBN), silicon oxyboronitride (SiOBN), silicon oxycarbide (SiOC), and combinations thereof.

A first front interlayer insulating film 190 is disposed on the first face 100US of the substrate. The first front interlayer insulating film 190 is disposed on the upper face 105US of the field insulating film. The first front interlayer insulating film 190 may be disposed on the source/drain patterns 150, 250, and 350.

The first front interlayer insulating film 190 may not cover the upper face 145US of the gate capping pattern. For example, the upper face of the first front interlayer insulating film 190 may be disposed, but not limited to, on the same plane as the upper face 145US of the gate capping pattern.

The first front interlayer insulating film 190 may be formed of or include, for example, at least one of silicon oxide, silicon nitride, silicon oxynitride, and a low dielectric constant material. The dielectric constant of the low dielectric constant material may have a value smaller than 3.9, which is the dielectric constant of silicon oxide.

The first front source/drain contact 170 may be disposed on the first face 100US of the substrate. The first front source/drain contact 170 may be disposed on the first source/drain pattern 150. For example, the first front source/drain contact 170 may be disposed on the first upper connecting source/drain pattern 150_1. The first front source/drain contact 170 is electrically connected to the first source/drain pattern 150. The first source/drain pattern 150 is disposed between the first front source/drain contact 170 and the first lower pattern BP1.

The second front source/drain contact 270 may be disposed on the first face 100US of the substrate. The second front source/drain contact 270 may be disposed on the second source/drain pattern 250. The second front source/drain contact 270 is electrically connected to the second source/drain pattern 250. The second source/drain pattern 250 is disposed between the second front source/drain contact 270 and the second lower pattern BP2.

The third front source/drain contact 370 may be disposed on the first face 100US of the substrate. The third front source/drain contact 370 may be disposed on the third source/drain pattern 350. The third front source/drain contact 370 is electrically connected to the third source/drain pattern 350. The third source/drain pattern 350 is disposed between the third front source/drain contact 370 and the third lower pattern BP3.

A height from the upper face AP1_US of the first active pattern to the upper face 170US of the first front source/drain contact may be the same as a height from the upper face AP1_US of the first active pattern to the upper face 145US of the gate capping pattern. A height from the upper face AP2_US of the second active pattern to the upper face 270US of the second front source/drain contact may be the same as a height from the upper face AP2_US of the second active pattern to the upper face 145US of the gate capping pattern. For example, the upper face of the third front source/drain contact 370 may be disposed in the same plane as the upper face 170US of the first front source/drain contact and the upper face 270US of the second front source/drain contact.

Although the front source/drain contacts 170, 270 and 370 are shown to have a single conductive film structure, the embodiment not limited thereto. The front source/drain contacts 170, 270, and 370 may have multiple conductive film structures including a front contact barrier film and a front contact plug. The front source/drain contacts 170, 270 and 370 may be formed of or include, for example, at least one of a metal, a conductive metal nitride, a conductive metal carbide, a conductive metal oxide, a conductive metal carbonitride, and a two-dimensional (2D) material.

The 2D material may include a 2D allotrope or a 2D compound, and may include, for example, but not limited to, at least one of graphene, boron nitride (BN), molybdenum sulfide, molybdenum selenide, tungsten sulfide, tungsten selenide, and tantalum sulfide. That is, since the above-mentioned 2D materials are only listed by way of example, the 2D materials that may be included in the semiconductor device of the present disclosure are not limited by the above-mentioned materials.

A first front contact silicide film 155 may be disposed between the first source/drain pattern 150 and the first front source/drain contact 170. A second front contact silicide film 255 may be disposed between the second source/drain pattern 250 and the second front source/drain contact 270. A third front contact silicide film 355 may be disposed between the third source/drain pattern 350 and the third front source/drain contact 370. Each of the front contact silicide films 155, 255 and 355 may be formed of or include a metal silicide material.

A back interlayer insulating film 290 may be disposed on the second face 100BS of the substrate. The back interlayer insulating film 290 may be formed of or include, for example, at least one of silicon oxide, silicon nitride, silicon carbonitride, silicon oxynitride, and a low dielectric constant material. The dielectric constant of the low dielectric constant material may have a value smaller than 3.9, which is the dielectric constant of silicon oxide.

The back wiring line 50 may be disposed in the back interlayer insulating film 290. The back wiring line 50 may be disposed on the second face 100BS of the substrate. In the semiconductor device according to some embodiments, the substrate 100 may be disposed between the back wiring line 50 and the first lower pattern BP1. The substrate 100 may be disposed between the back wiring line 50 and the second lower pattern BP2, and between the back wiring line 50 and the third lower pattern BP3.

The back wiring line 50 may extend in the first direction X, but the embodiment is not limited thereto. Unlike the shown example, the back wiring line 50 may extend in the second direction Y. In such a case, the shape of the cross-sectional view taken along lines A-A, B-B, C-C, D-D, E-E, and F-F of FIG. 1 may change.

As an example, the back wiring line 50 may be a power line that supplies power to the semiconductor device. As another example, the back wiring line 50 may be a signal line that supplies operating signals of the semiconductor device.

The back wiring line 50 may include a first face 50_S1 and a second face 50_S2 that are opposite to each other in the third direction Z. The first face 50_S1 of the back wiring line may face the substrate 100. The substrate 100 may be disposed on the first face 50_S1 of the back wiring line.

The first lower pattern BP1, the second lower pattern BP2, and the third lower pattern BP3 may be disposed on the first face 50_S1 of the back wiring line. The field insulating film 105 may be disposed on the first face 50_S1 of the back wiring line. The bottom face 105BS of the field insulating film may face the first face 50_S1 of the back wiring line.

Although the back wiring line 50 is shown to have a trapezoidal cross section (see, e.g., FIGS. 6 and 7), the embodiment is not limited thereto. For example, a width of the first face 50_S1 of the back wiring line in the second direction Y may be smaller than a width of the second face 50_S2 of the back wiring line in the second direction Y. Unlike the shown example, the back wiring line 50 may have a rectangular cross section.

The back wiring via 55 may be disposed in the back interlayer insulating film 290. The back wiring via 55 may protrude in the third direction Z from the first face 50_S1 of the back wiring line.

The back wiring via 55 may connect the back source/drain contact 70 to the back wiring line 50. Unlike the shown example, the back wiring line 50 may be connected to the back source/drain contact 70 without the back wiring via 55.

The back wiring line 50 and the back wiring via 55 may have, but are not limited to, an integrated structure without being divided by an interface. Unlike the shown example, the back wiring line 50 and the back wiring via 55 may be divided by the interface.

Although the back wiring line 50 and the back wiring via 55 are shown to have a single conductive film structure, the embodiment is not limited thereto. Unlike the shown example, the back wiring line 50 and the back wiring via 55 may have multiple conductive film structures.

The back wiring line 50 and the back wiring via 55 may be formed of or include, for example, at least one of a metal, a conductive metal nitride, a conductive metal carbide, a conductive metal oxide, a conductive metal carbonitride, and a two-dimensional material.

The back contact guide pattern 80 may be disposed on the first face 50_S1 of the back wiring line. The back contact guide pattern 80 may be disposed between the first active pattern AP1 and the second active pattern AP2, and between the first active pattern AP1 and the third active pattern AP3.

A pair of back contact guide patterns 80 may be disposed on both sides of the first active pattern AP1. For example, one of the back contact guide patterns 80 may be disposed on one side of the first active pattern AP1 and another of the back contact guide patterns 80 may be disposed on the other side of the first active pattern AP1. The back contact guide pattern 80 may include a first back contact guide pattern 80_1 and a second back contact guide pattern 80_2.

The first back contact guide pattern 80_1 may be disposed between the first lower pattern BP1 and the second lower pattern BP2. The second back contact guide pattern 80_2 may be disposed between the first lower pattern BP1 and the third lower pattern BP3. The first lower pattern BP1 may be disposed between the first back contact guide pattern 80_1 and the second back contact guide pattern 80_2.

The back contact guide pattern 80 may include an upper face (e.g., a top face) 80US and a bottom face (e.g., a lower face) 80BS that are opposite to each other in the third direction Z. The bottom face 80BS of the back contact guide pattern may face the first face 50_S1 of the back wiring line.

The back interlayer insulating film 290 may be disposed on the bottom face 80BS of the back contact guide pattern. For example, the bottom face 80BS of the back contact guide pattern may be in contact with the back interlayer insulating film 290. The substrate 100 may not be disposed between the back contact guide pattern 80 and the back interlayer insulating film 290. The substrate 100 may not cover the bottom face 80BS of the back contact guide pattern.

The back contact guide pattern 80 may be disposed in the substrate 100 and the field insulating film 105. A part of the back contact guide pattern 80 protrudes in the third direction Z beyond the first face 100US of the substrate. A height H2 from the second face 50_S2 of the back wiring line to the bottom face 105BS of the field insulating film may be smaller than a height H1 from the second face 50_S2 of the back wiring line to the upper face 80US of the back contact guide pattern.

For example, a part of the back contact guide pattern 80 may be disposed in the field insulating film 105. The remainder of the back contact guide pattern 80 may be disposed in the substrate 100.

The back contact guide pattern 80 may include a first side wall 80_SW1 and a second side wall 80_SW2 that connect the upper face 80US of the back contact guide pattern and the bottom face 80BS of the back contact guide pattern. The first side wall 80_SW1 of the back contact guide pattern may be opposite to the second side wall 80_SW2 of the back contact guide pattern in the second direction Y.

The first side wall 80_SW1 of the back contact guide pattern may be in contact with the back source/drain contact 70. The second side wall 80_SW2 of the back contact guide pattern may not be in contact with the back source/drain contact 70.

The back contact guide pattern 80 may include a first portion 80_P1 disposed in the substrate 100, and a second portion 80_P2 disposed in the field insulating film 105. The interface between the first portion 80_P1 of the back contact guide pattern and the second portion 80_P2 of the back contact guide pattern may be the first face 100US of the substrate.

The second side wall 80_SW2 of the back contact guide pattern may include a first portion 80_SW21 that is in contact with the substrate 100, and a second portion 80_SW22 that is in contact with the field insulating film 105. The first portion 80_SW21 of the second side wall of the back contact guide pattern may be the second side wall of the back contact guide pattern in the first portion 80_P1 of the back contact guide pattern. The second portion 80_SW22 of the second side wall of the back contact guide pattern may be the second side wall of the back contact guide pattern in the second portion 80_P2 of the back contact guide pattern.

In FIGS. 8 and 9, in the first portion 80_P1 of the back contact guide pattern, the first portion 80_SW21 of the second side wall of the back contact guide pattern may form an acute angle with the second face 100BS of the substrate. For example, a horizontal distance from a central vertical axis of the back contact guide pattern 80 to an upper edge of the first portion 80_SW21 of the second side wall of the back contact guide pattern may be greater than a horizontal distance from the central vertical axis of the back contact guide pattern 80 to a lower edge of the first portion 80_SW21 of the second side wall of the back contact guide pattern. For example, the width of a bottom face 80BS of the back contact guide pattern in the second direction Y may be smaller than a width of the back contact guide pattern at a middle portion in the Z direction of the back contact guide pattern (see, e.g., FIGS. 5, 8, and 9).

In FIG. 10, in the first portion 80_P1 of the back contact guide pattern, the first portion 80_SW21 of the second side wall of the back contact guide pattern may be perpendicular to the second face 100BS of the substrate.

In FIG. 8, in the second portion 80_P2 of the back contact guide pattern, the second portion 80_SW22 of the second side wall of the back contact guide pattern may form an acute angle with the second face 100BS of the substrate. For example, a horizontal distance from the central vertical axis of the back contact guide pattern 80 to an upper edge of the second portion 80_SW22 of the second side wall of the back contact guide pattern may be greater than a horizontal distance from the central vertical axis of the back contact guide pattern 80 to a lower edge of the second portion 80_SW22 of the second side wall of the back contact guide pattern. For example, the width of the back contact guide pattern 80 may increase from the bottom face 80BS of the back contact guide pattern to the upper face 80US of the back contact guide pattern.

In FIGS. 9 and 10, in the second portion 80_P2 of the back contact guide pattern, the second portion 80_SW22 of the second side wall of the back contact guide pattern may form an obtuse angle with the second face 100BS of the substrate. For example, a horizontal distance from the central vertical axis of the back contact guide pattern 80 to an upper edge of the second portion 80_SW22 of the second side wall of the back contact guide pattern may be less than a horizontal distance from the central vertical axis of the back contact guide pattern 80 to a lower edge of the second portion 80_SW22 of the second side wall of the back contact guide pattern.

In the semiconductor device according to some embodiments, the field insulating film 105 may cover the upper face 80US of the back contact guide pattern. A height H3 from the second face 50_S2 of the back wiring line to the upper face 105US of the field insulating film may be greater than the height H1 from the second face 50_S2 of the back wiring line to the upper face 80US of the back contact guide pattern. The upper face 80US of the back contact guide pattern may not be in contact with the source/drain etching stop film 185.

The back contact guide pattern 80 may be spaced apart from the first lower pattern BP1 and the second lower pattern BP2 in the second direction Y. The back contact guide pattern 80 may be spaced apart from the third lower pattern BP3 in the second direction Y. The back contact guide pattern 80 is spaced apart from the lower patterns BP1, BP2, and BP3 in the second direction Y, and the back contact guide pattern 80 does not overlap the upper face BP1_US of the first lower pattern, the upper face BP2_US of the second lower pattern, and the upper face BP3_US of the third lower pattern in the third direction Z.

The first active pattern AP1 will be explained as an example. Since the back contact guide pattern 80 does not overlap the upper face BP1_US of the first lower pattern in the third direction Z, the first sheet pattern NS1 does not overlap the back contact guide pattern 80 in the third direction Z.

Figure 4:
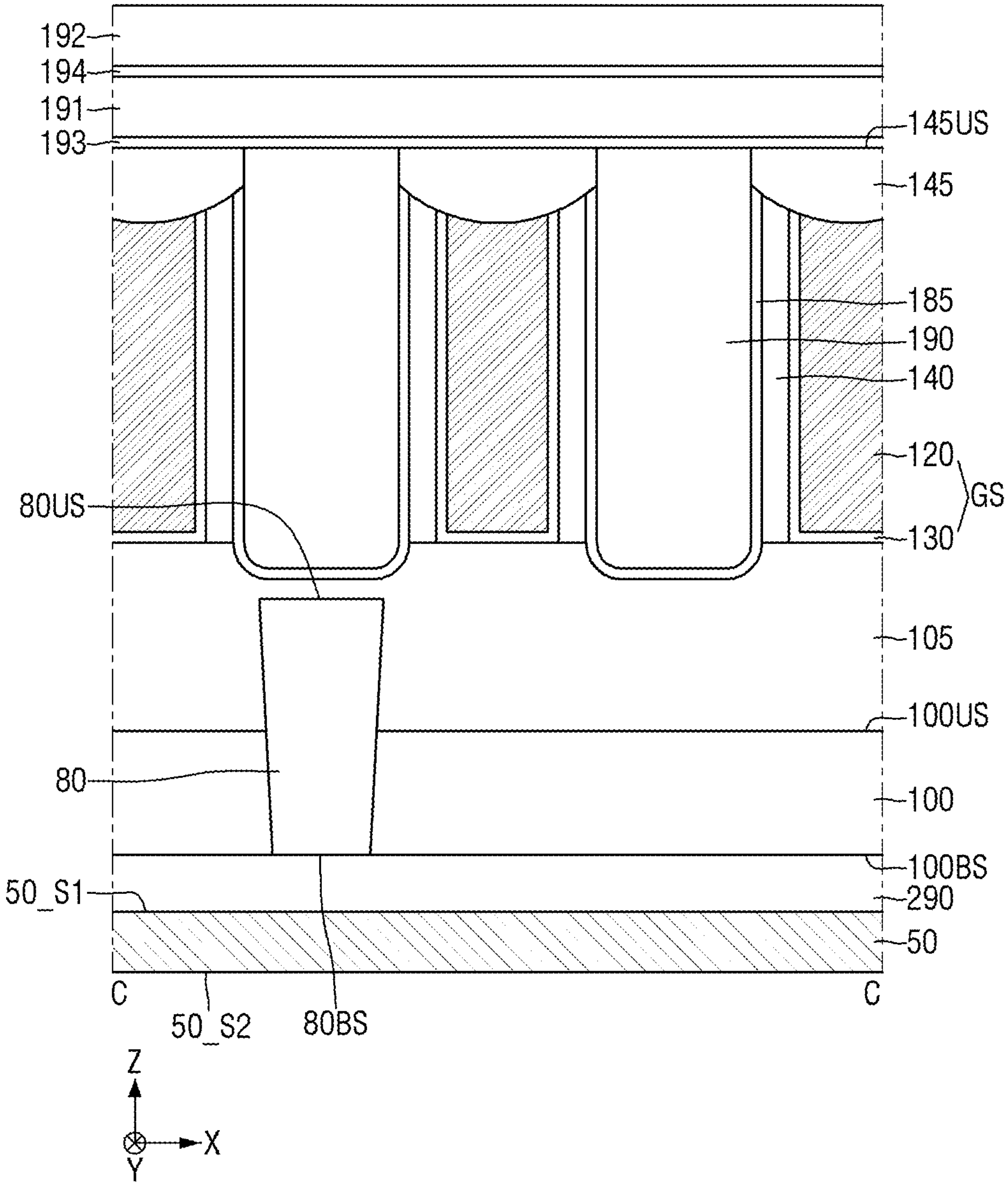

In FIG. 4, the back contact guide pattern 80 may be disposed between the gate structures GS adjacent to each other in the first direction X. The back contact guide pattern 80 may not overlap the gate structure GS in the third direction Z.

The back contact guide pattern 80 may be formed of or include an insulating material. The back contact guide pattern 80 may include, for example, at least one of silicon nitride (SiN), silicon oxynitride (SiON), silicon oxide ($SiO_2$), silicon oxycarbonitride (SiOCN), silicon boronitride (SiBN), silicon oxyboronitride (SiOBN), silicon oxycarbide (SiOC), aluminum oxide (AlO), and combinations thereof. Although the back contact guide pattern 80 is shown as being a single film, the embodiment is not limited thereto.

The back source/drain contact 70 may be disposed between the back wiring line 50 and the first source/drain pattern 150. The back source/drain contact 70 may connect the first lower connecting source/drain contact 150_2 to the back wiring line 50. The back source/drain contact 70 may be disposed on the first face 50_S1 of the back wiring line.

The back source/drain contacts 70 may be disposed between back contact guide patterns 80 adjacent to each other in the second direction Y. The back source/drain contact 70 may be disposed between the first back contact guide pattern 80_1 and the second back contact guide pattern 80_2.

The back contact guide pattern 80 may be disposed on both sides of the back source/drain contact 70. The back source/drain contact 70 may be in contact with the back contact guide pattern 80.

At least a part of the back source/drain contact 70 may be disposed in the first lower pattern BP1. In the semiconductor device according to some embodiments, a part of the back source/drain contact 70 may be disposed in the first lower pattern BP1, and the remainder of the back source/drain contact 70 may be disposed in the substrate 100 (see, e.g., FIG. 5).

Although the back source/drain contact 70 is shown to have a single conductive film structure, the embodiment is not limited thereto. The back source/drain contact 70 may have multiple conductive film structures including a back contact barrier film and a back contact plug. The back source/drain contact 70 may be formed of or include, for example, at least one of a metal, a conductive metal nitride, a conductive metal carbide, a conductive metal oxide, a conductive metal carbonitride, and a two-dimensional material.

The back contact guide pattern 80 may function as a mask for forming the back source/drain contact 70. That is, by utilizing the back contact guide pattern 80, the back source/drain contact 70 may be formed in the form of a self-aligned contact (SAC). Since the back contact guide pattern 80 defines a region in which the back source/drain contact 70 is formed, it is possible to prevent the back source/drain contact 70 from being misaligned.

In addition, since the back contact guide pattern 80 is disposed between the lower patterns adjacent to each other in the first direction, the back contact guide pattern 80 may prevent the source/drain patterns 250 and 350 that are not connected to the back source/drain contact 70 from being connected to the back source/drain contact 70. Accordingly, the performance and reliability of the semiconductor device can be improved.

The second front interlayer insulating film 191 may be disposed on the first front interlayer insulating film 190. The first etching stop film 193 is disposed between the first front interlayer insulating film 190 and the second front interlayer insulating film 191.

The back contact silicide film 75 may be disposed between the first source/drain pattern 150 and the back source/drain contact 70. The back contact silicide film 75 may be formed of or include a metal silicide material.

The second etching stop film 194 and the third front interlayer insulating film 192 may be sequentially disposed on the second front interlayer insulating film 191. The second etching stop film 194 may be disposed between the second front interlayer insulating film 191 and the third front interlayer insulating film 192.

The first etching stop film 193 and the second etching stop film 194 may be formed of or include, for example, at least one of silicon nitride (SiN), silicon oxynitride (SiON), silicon oxycarbonitride (SiOCN), silicon boronitride (SiBN), silicon oxyboronitride (SiOBN), silicon oxycarbide (SiOC), aluminum oxide (AlO), aluminum nitride (AlN), aluminum oxycarbide (AlOC), and combinations thereof. The second front interlayer insulating film 191 and the third front interlayer insulating film 192 may each be formed of or include, for example, at least one of silicon oxide, silicon nitride, silicon carbonitride, silicon oxynitride, and a low dielectric constant material.

A front wiring structure 195 is disposed on the first face 100US of the substrate. The front wiring structure 195 may be connected to the first front source/drain contact 170, the second front source/drain contact 270, and the third front source/drain contact 370.

The front wiring structure 195 may include a front wiring via 196 and a front wiring line 197. The front wiring via 196 may be disposed in the second front interlayer insulating film 191. The front wiring via 196 may pass through the first etching stop film 193, and may be connected to the first front source/drain contact 170, the second front source/drain contact 270, and the third front source/drain contact 370.

The front wiring line 197 may be disposed in the third upper interlayer insulating film 192. The front wiring line 197 may be connected to the front source/drain contacts 170, 270 and 370 through the front wiring via 196. The front wiring line 197 penetrates the second etching stop film 194, and may be connected to the front wiring via 196.

Unlike the shown example, the front wiring line 197 may be connected to the front source/drain contacts 170, 270 and 370 without the front wiring via 196.

Each of the front wiring via 196 and the front wiring line 197 may be formed of or include, for example, at least one of a metal, a conductive metal nitride, a conductive metal carbide, a conductive metal oxide, a conductive metal carbonitride, and a two-dimensional material.

Although the front wiring via 196 and the front wiring line 197 are each shown to have a single conductive film structure, this is only for convenience of explanation, and the embodiment is not limited thereto. Unlike the shown example, as an example, at least one of the front wiring via 196 and the front wiring line 197 may have multiple conductive film structures. As another example, the front wiring structure 195 may have an integrated structure with no interface division between the front wiring via 196 and the front wiring line 197.

Unlike the shown example, at least one of the first etching stop film 193 and the second etching stop film 194 may be omitted.

Figure 11:
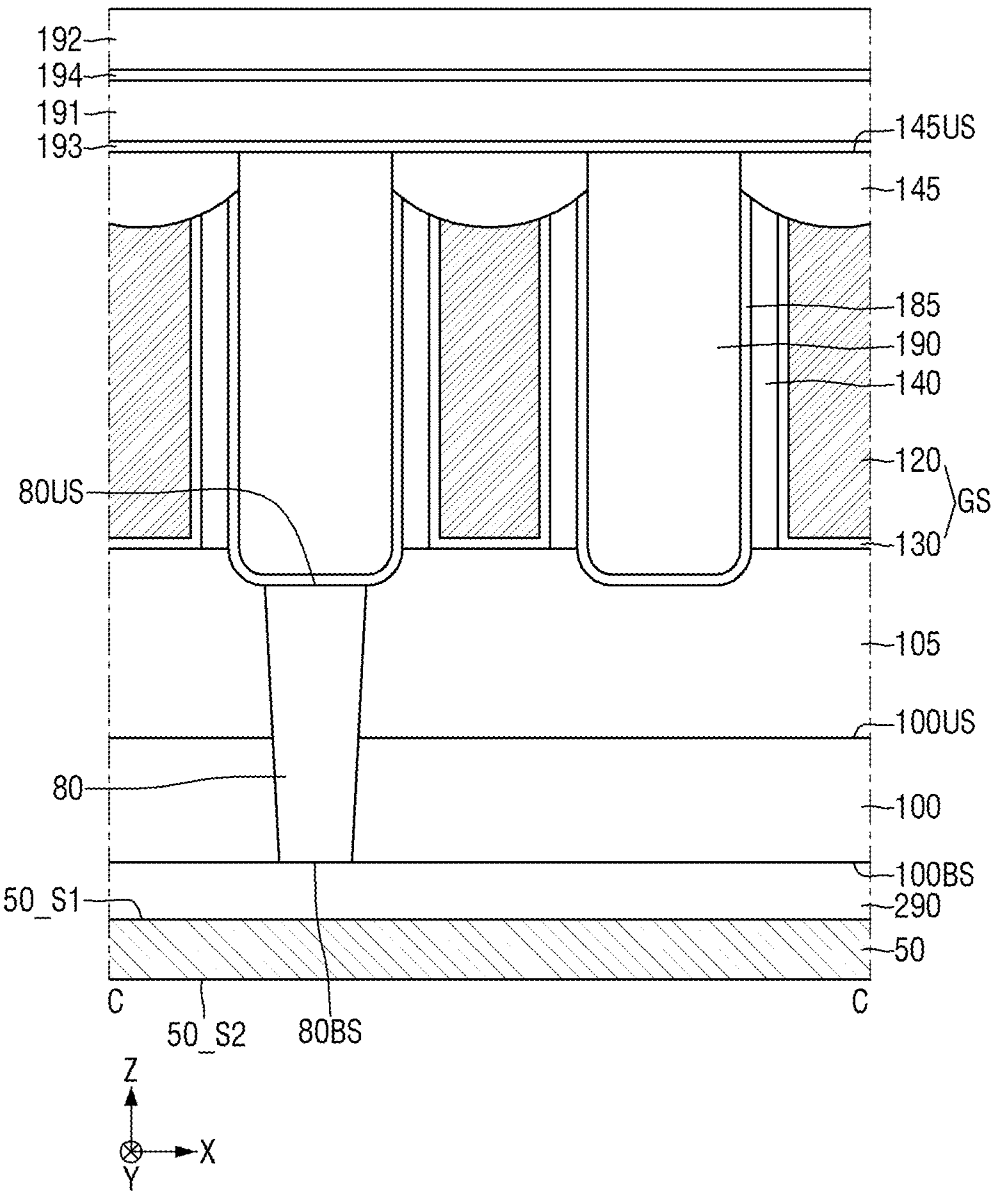
FIGS. 11 and 12 are diagrams for explaining a semiconductor device according to some embodiments.
Figure 12:
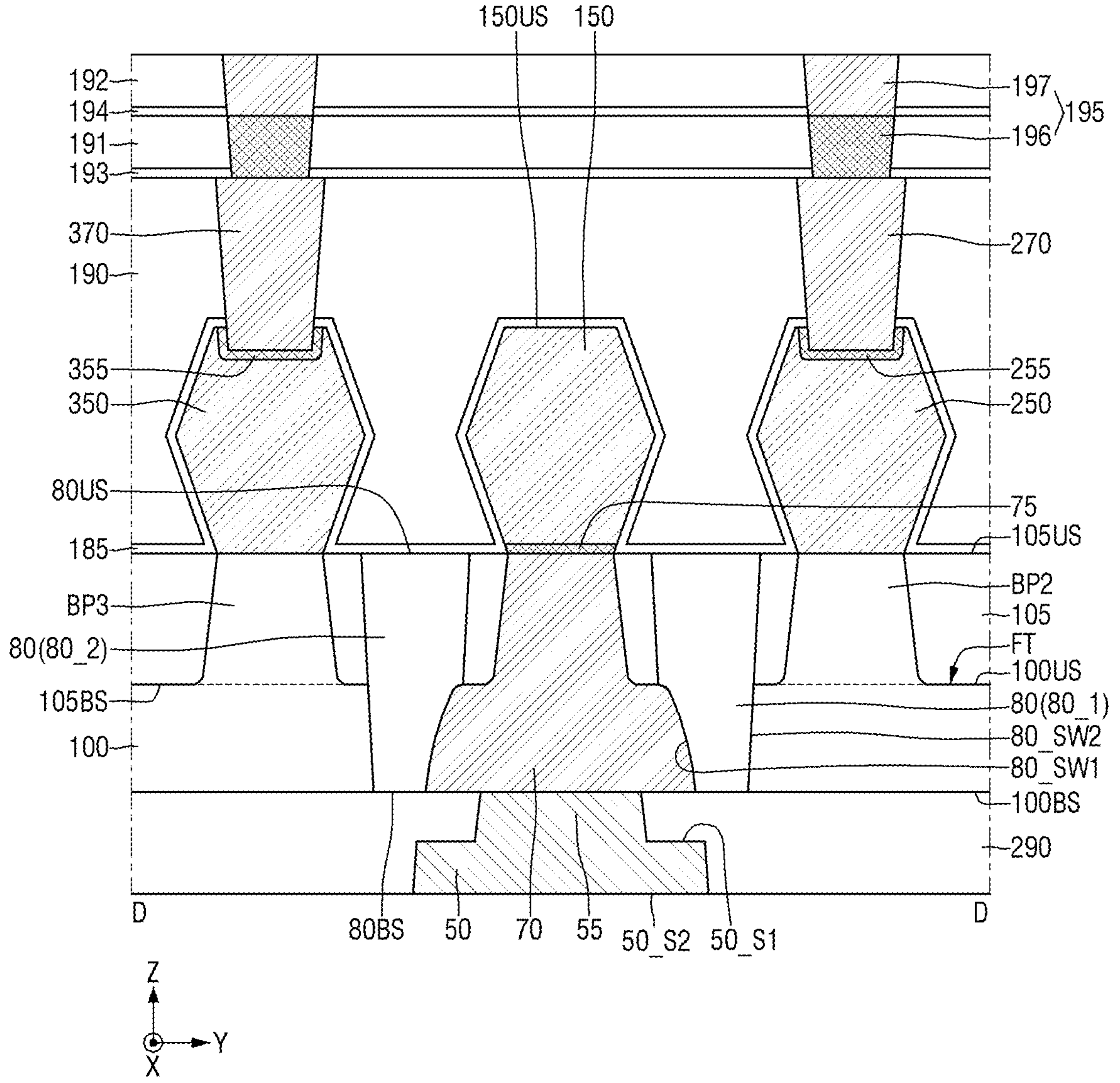
Figure 13:
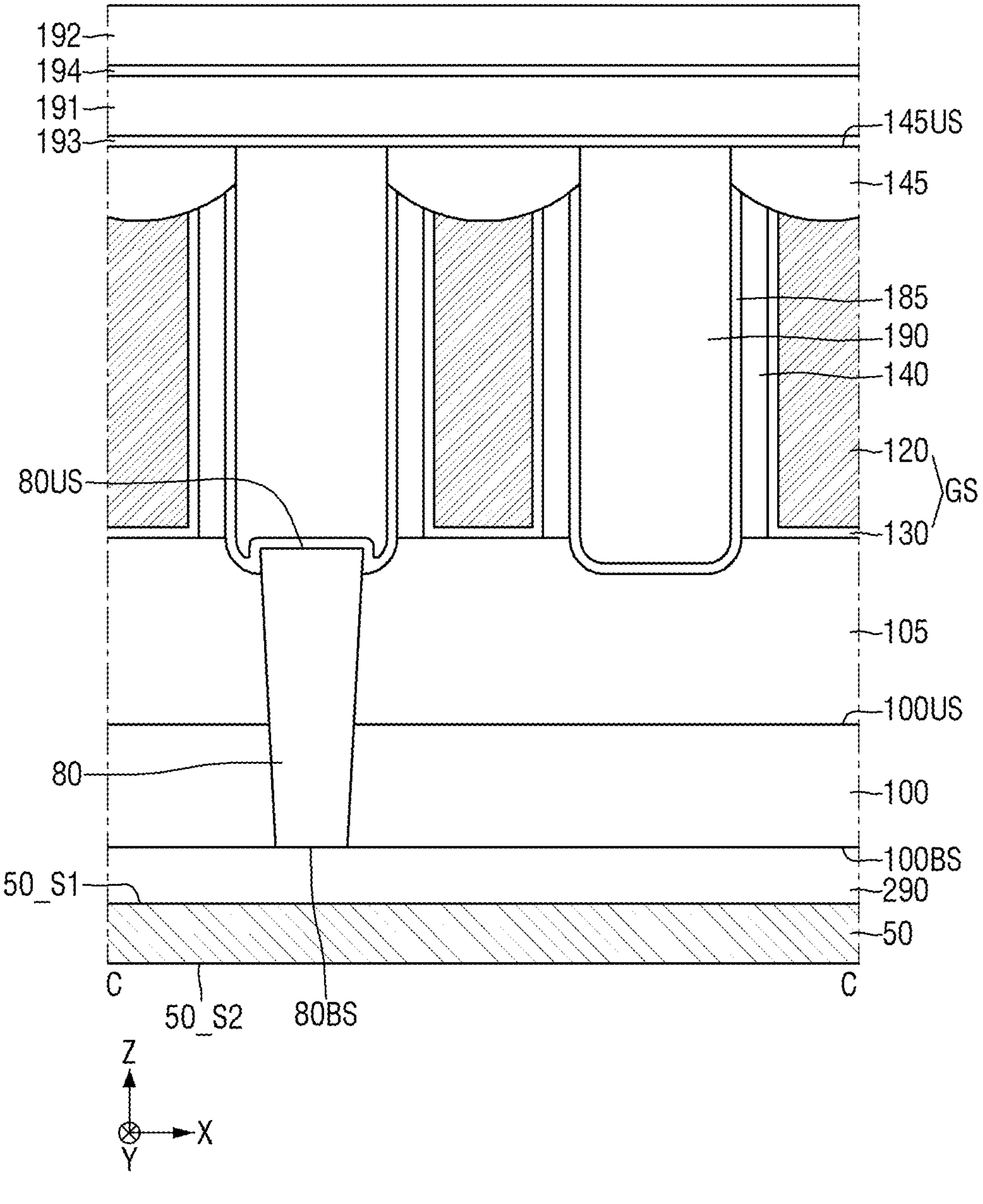
FIGS. 13 and 14 are diagrams for explaining a semiconductor device according to some embodiments.
Figure 14:
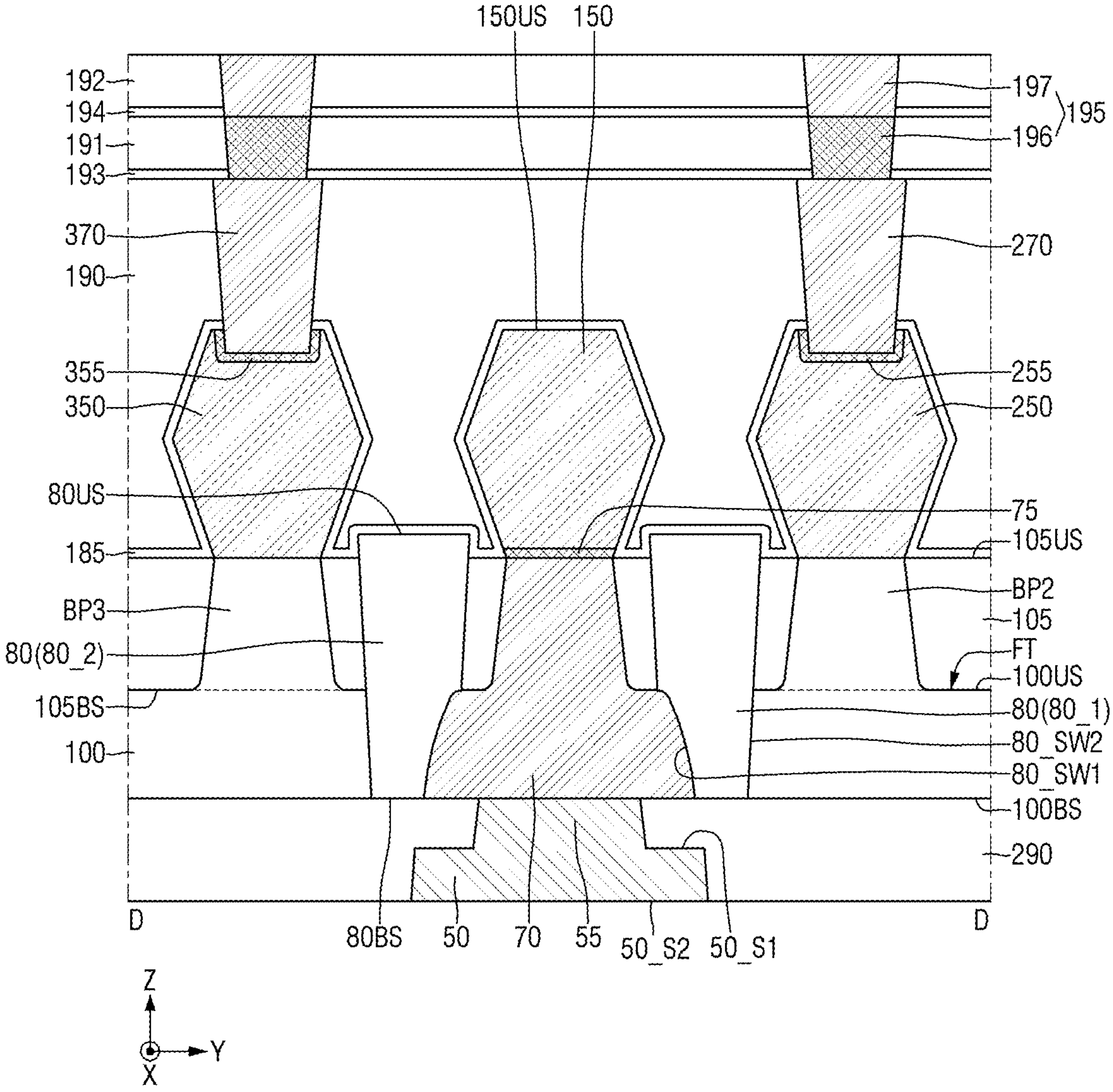

FIGS. 11 and 12 are diagrams for explaining a semiconductor device according to some embodiments. FIGS. 13 and 14 are diagrams for explaining a semiconductor device according to some embodiments. For convenience of explanation, points that are different from those described using FIGS. 1 to 10 will be mainly explained.

Referring to FIGS. 11 to 14, in the semiconductor device according to some embodiments, the field insulating film 105 does not cover the upper face 80US of the back contact guide pattern.

The source/drain etching stop film 185 may be in contact with the upper face 80US of the back contact guide pattern. The source/drain etching stop film 185 may extend along the upper face 80US of the back contact guide pattern.

In FIGS. 11 and 12, the back contact guide pattern 80 may not include a portion that protrudes beyond the upper face 105US of the field insulating film.

In contrast, as shown, e.g., in FIGS. 13 and 14, a part of the back contact guide pattern 80 may protrude beyond the upper face 105US of the field insulating film. A part of the side walls 80_SW1 and 80_SW2 of the back contact guide pattern 80 may be in contact with the source/drain etching stop film 185.

Figure 15:
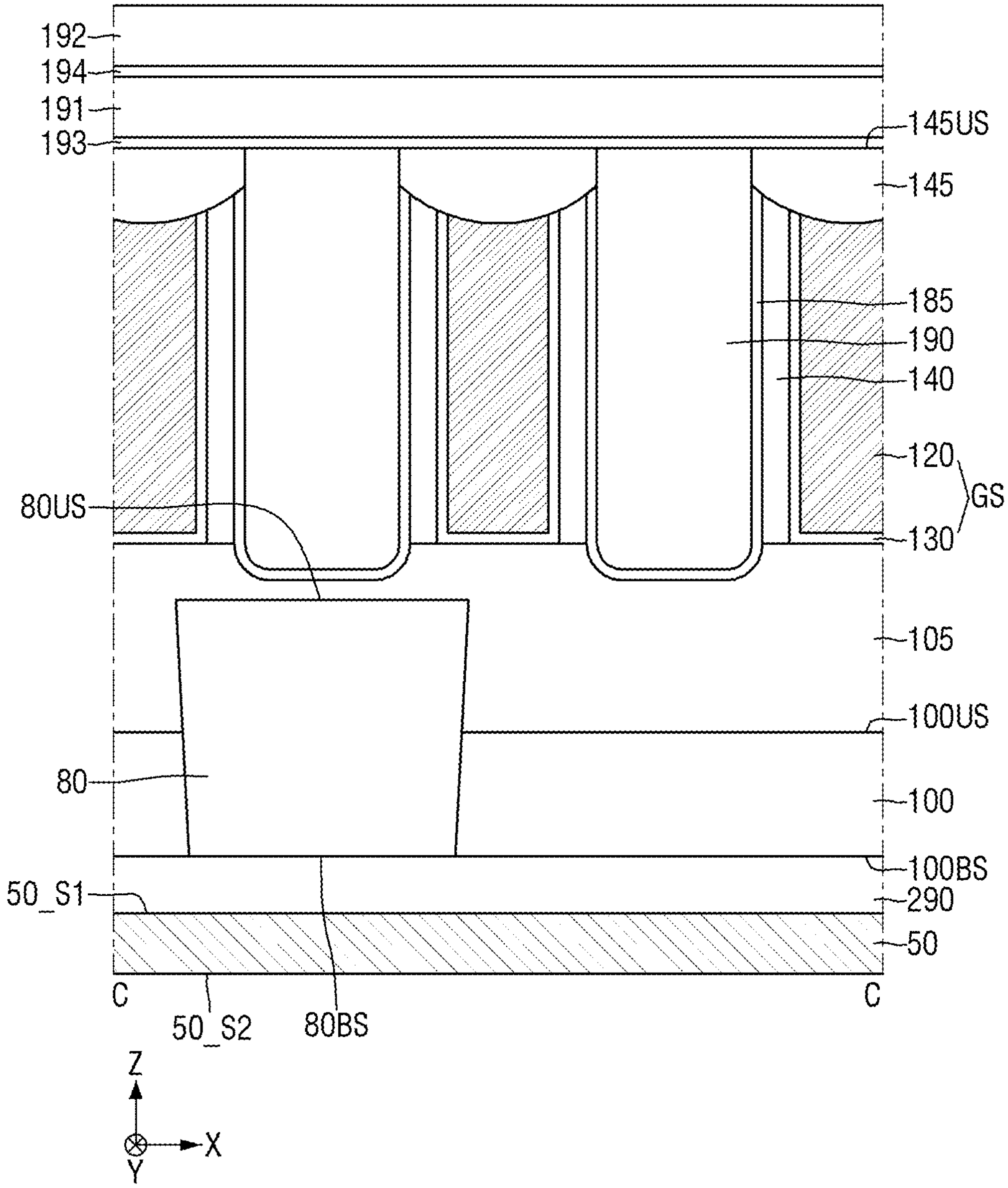
FIGS. 15 to 17 are diagrams for explaining a semiconductor device according to some embodiments.
Figure 16:
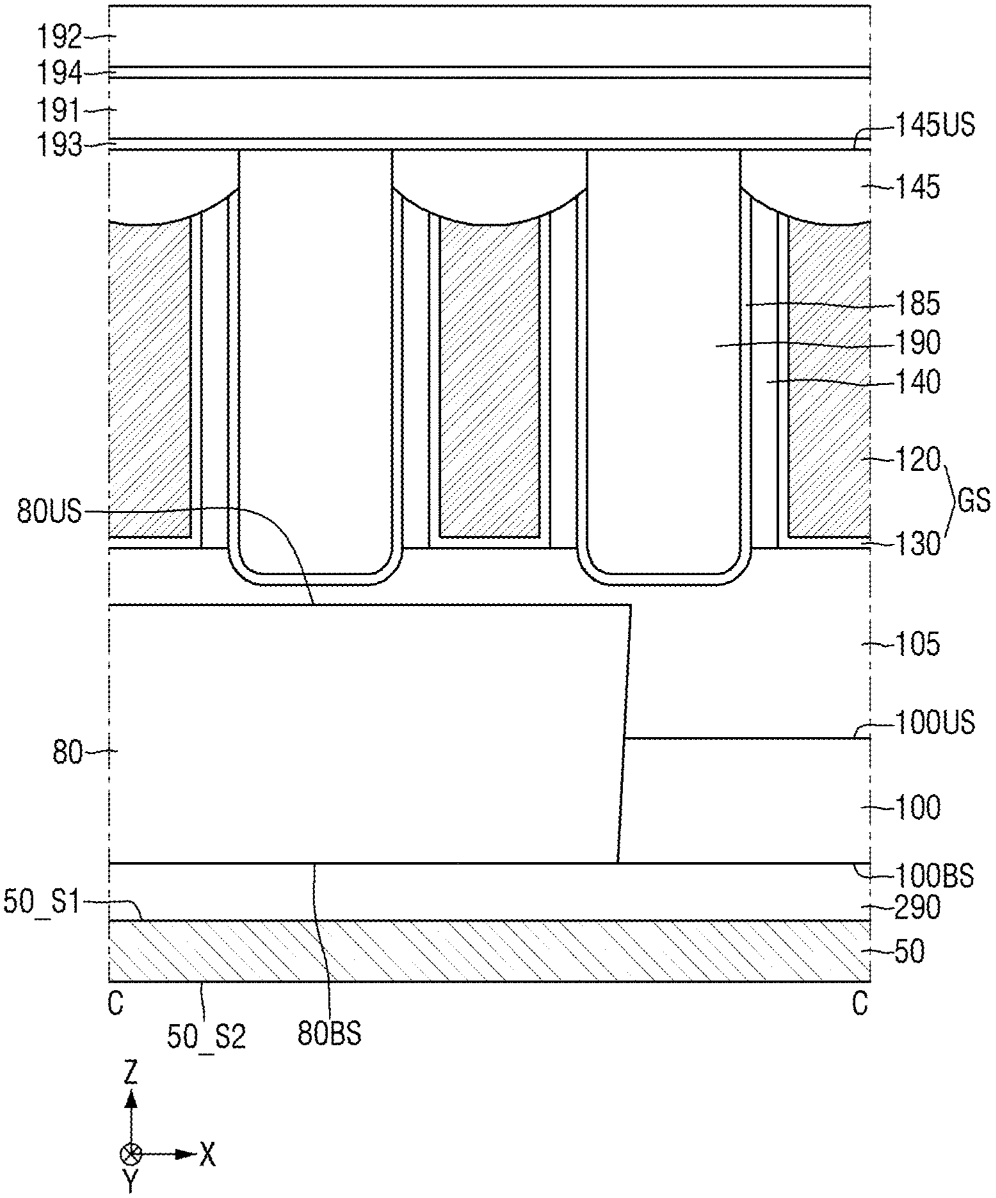
Figure 17:
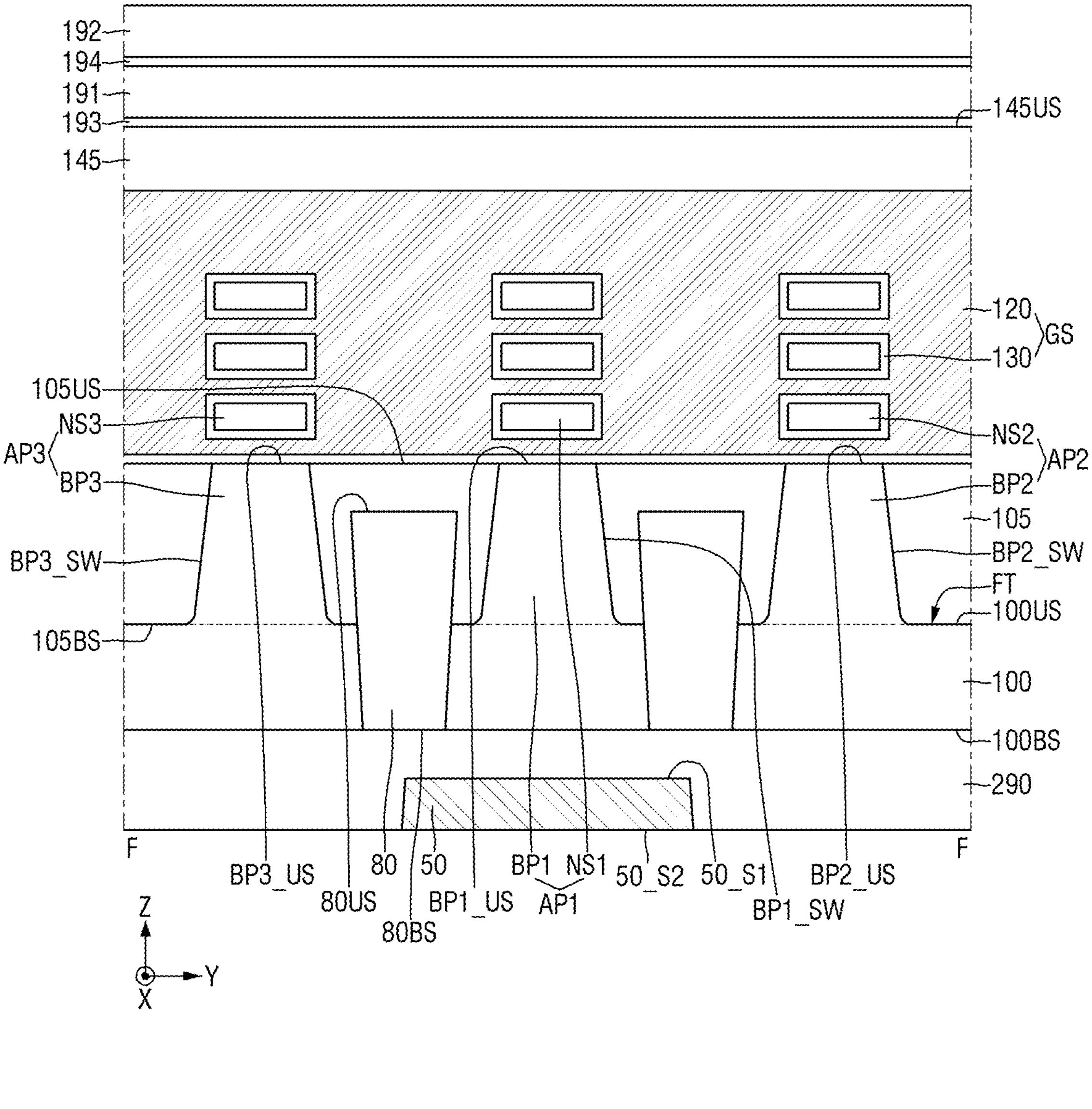

FIGS. 15 to 17 are diagrams for explaining a semiconductor device according to some embodiments. For convenience of explanation, points that are different from those described using FIGS. 1 to 10 will be mainly explained.

Referring to FIGS. 15 to 17, in the semiconductor device according to some embodiments, a part of the upper face 80US of the back contact guide pattern may overlap the gate structure GS when viewed in the third direction Z.

At least a part of the plurality of gate structures GS may overlap the back contact guide pattern 80 when viewed in the third direction Z. The plurality of gate structures GS may include a first sub-gate structure GS and a second sub-gate structure GS that overlap the back contact guide pattern 80 when viewed in the third direction Z. The first sub-gate structure GS and the second sub-gate structure GS may be directly adjacent to each other in the first direction X.

From the viewpoint of a cross-sectional view as in FIG. 15, a part of the first and second sub-gate structures GS overlaps the upper face 80US of the back contact guide pattern when viewed in the third direction Z, and the remainder of the first and second sub-gate structures GS may not overlap the upper face 80US of the back contact guide pattern when viewed in the third direction Z.

From the viewpoint of the cross-sectional view as in FIG. 16, the first and second sub-gate structures GS may entirely overlap the upper face 80US of the back contact guide pattern when viewed in the third direction Z. Unlike that shown in FIG. 16, the back contact guide pattern 80 may have a linear shape that extends lengthwise in the first direction X along the first lower pattern BP1. The back contact guide pattern 80 may overlap three or more gate structures GS when viewed in the third direction Z.

From the viewpoint of a cross-sectional view as in FIG. 17, the gate structure GS may be disposed on the back contact guide pattern 80.

When the back contact guide pattern 80 is disposed as in FIG. 15, the cross section taken along F-F of FIG. 1 may be the same as that of FIG. 7. That is, in the portion in which the gate structure GS and the field insulating film 105 overlap in the third direction Z, the back contact guide pattern 80 may not be visible.

Figure 18:
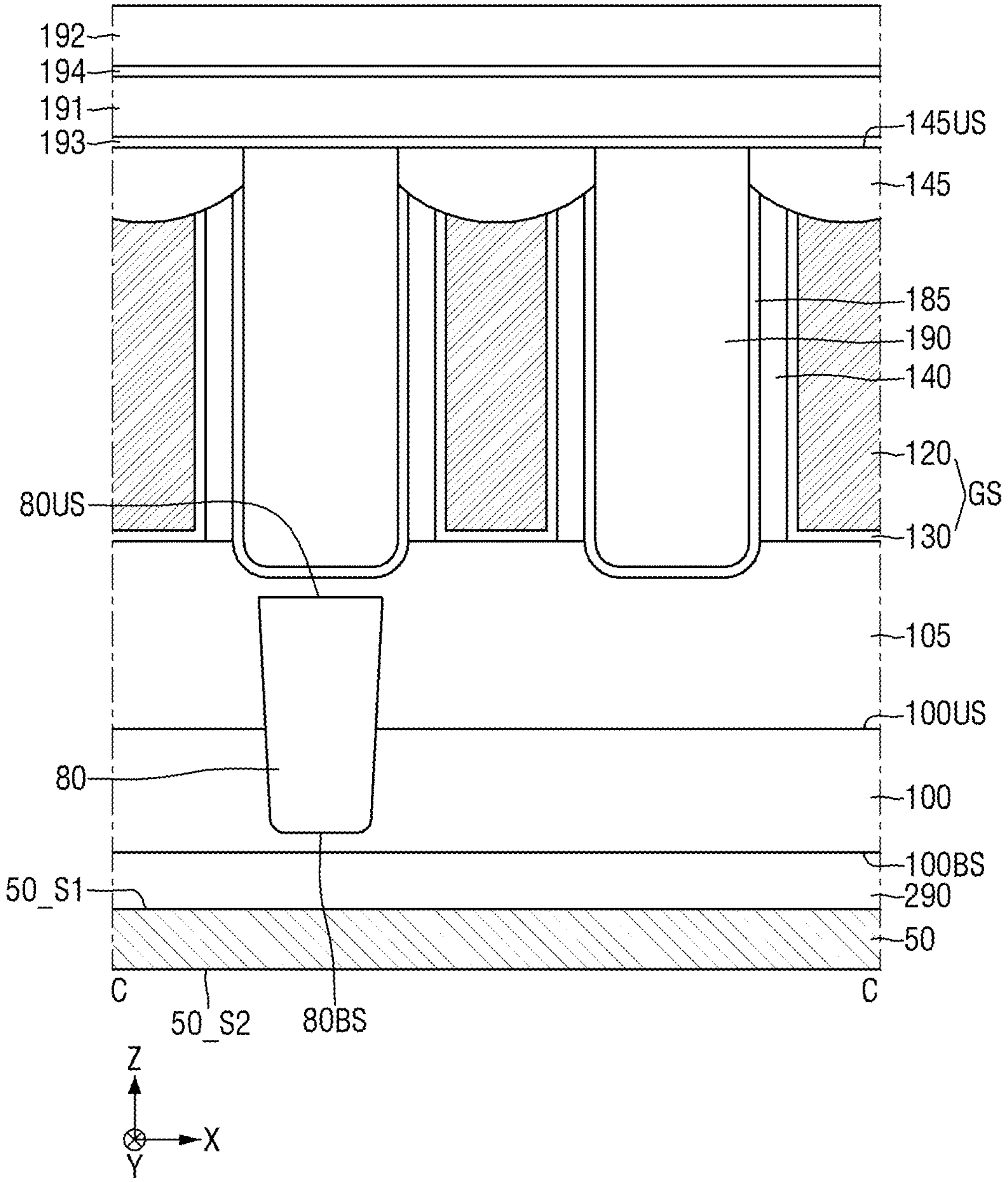
FIGS. 18 and 19 are diagrams for explaining a semiconductor device according to some embodiments.
Figure 19:
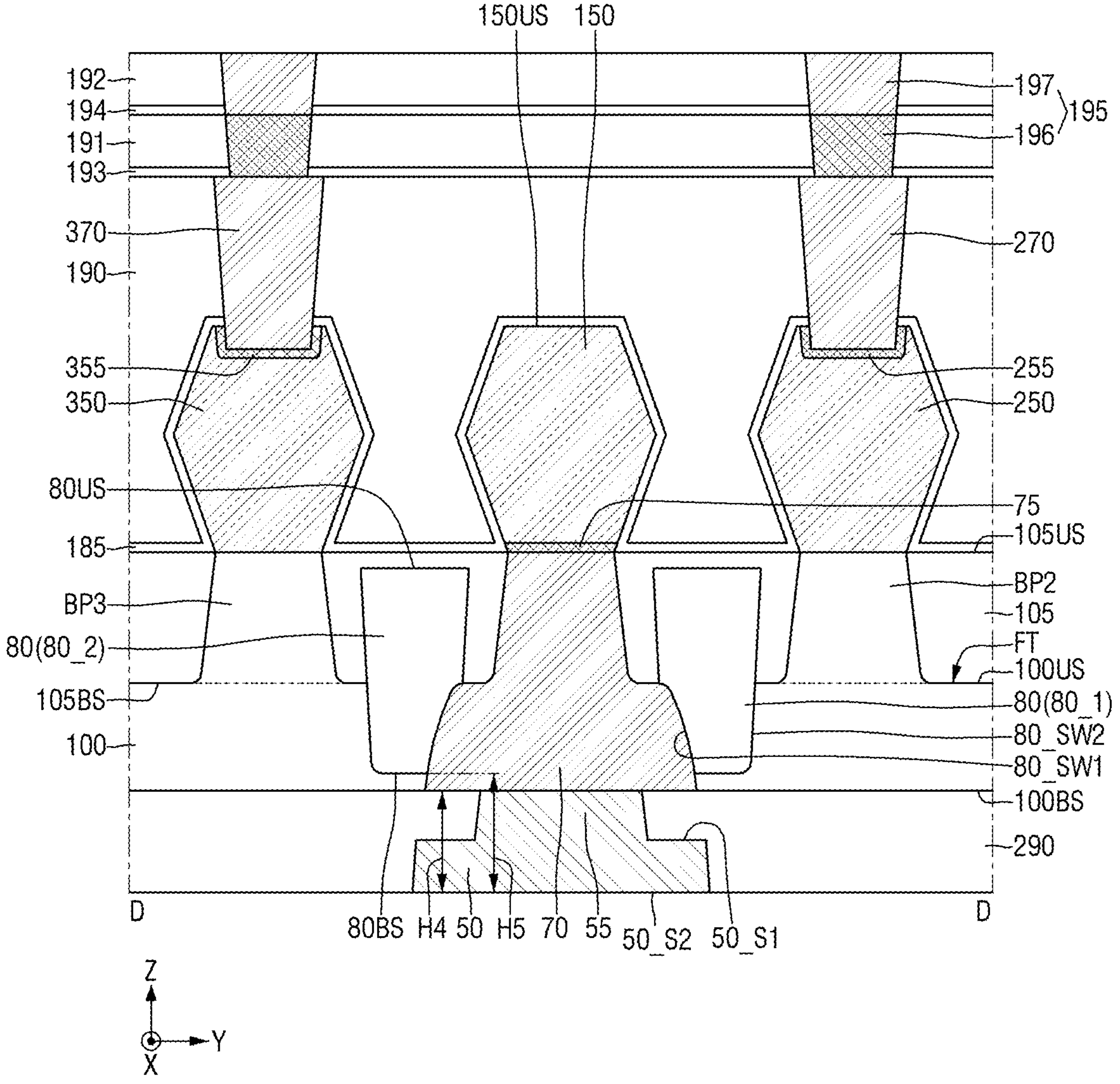
Figure 20:
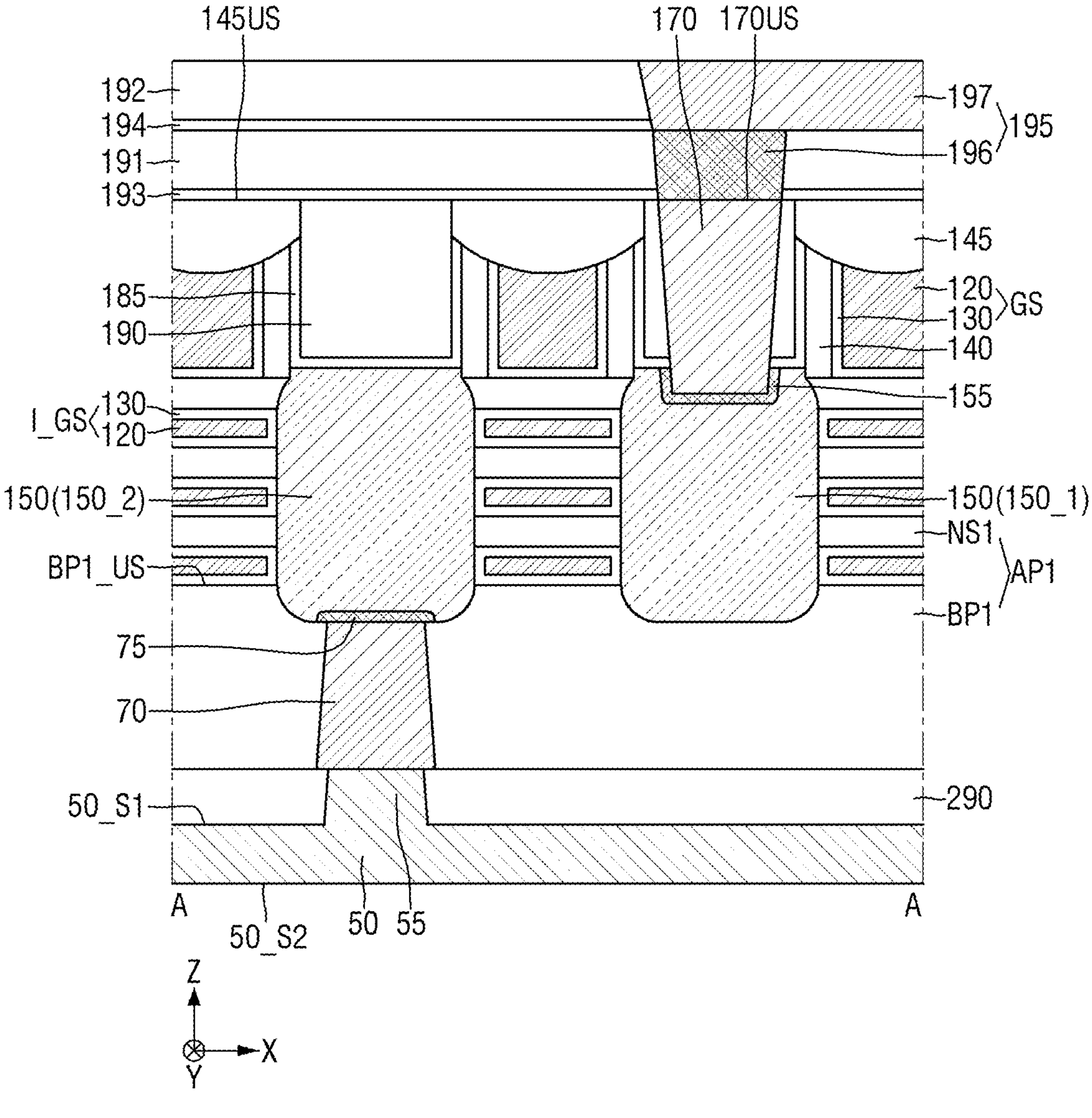
FIGS. 20 to 23 are diagrams for explaining a semiconductor device according to some embodiments.
Figure 21:
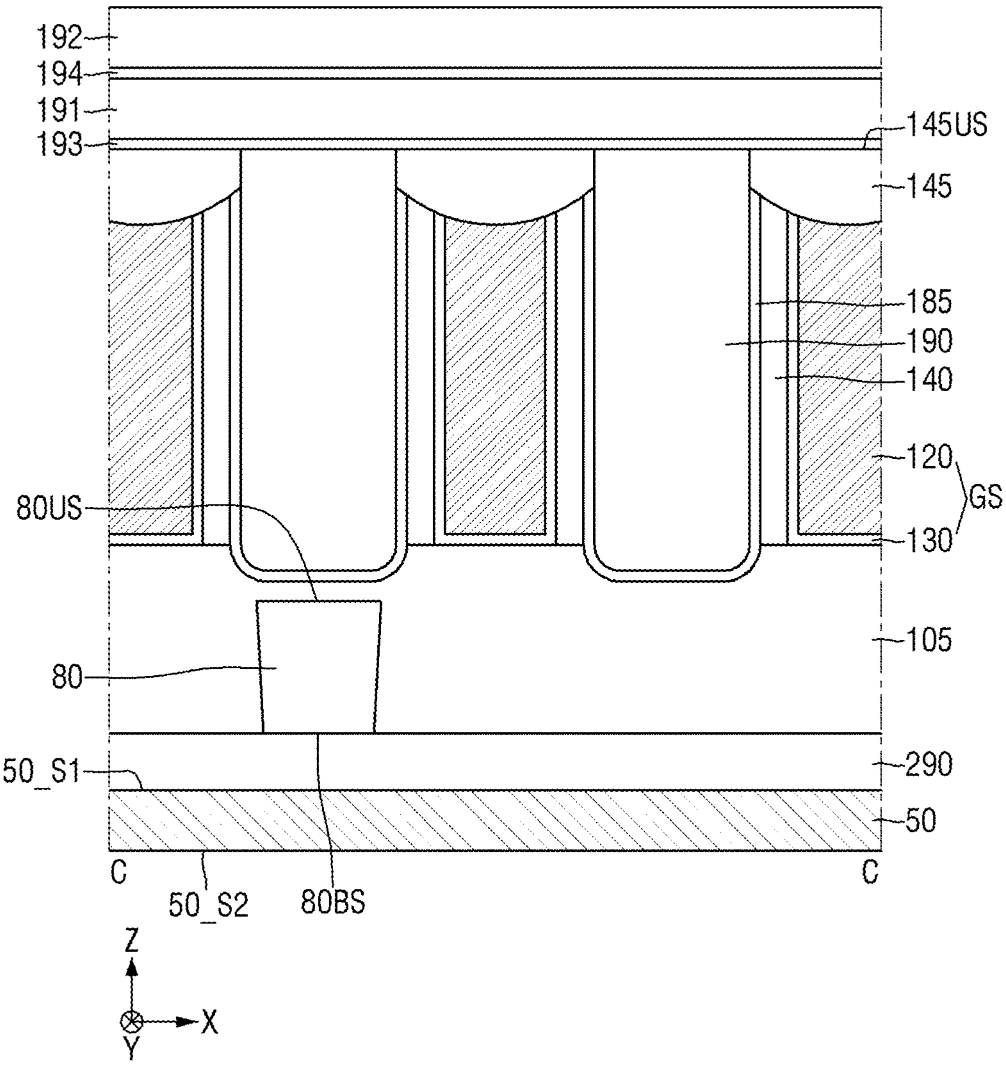
Figure 22:
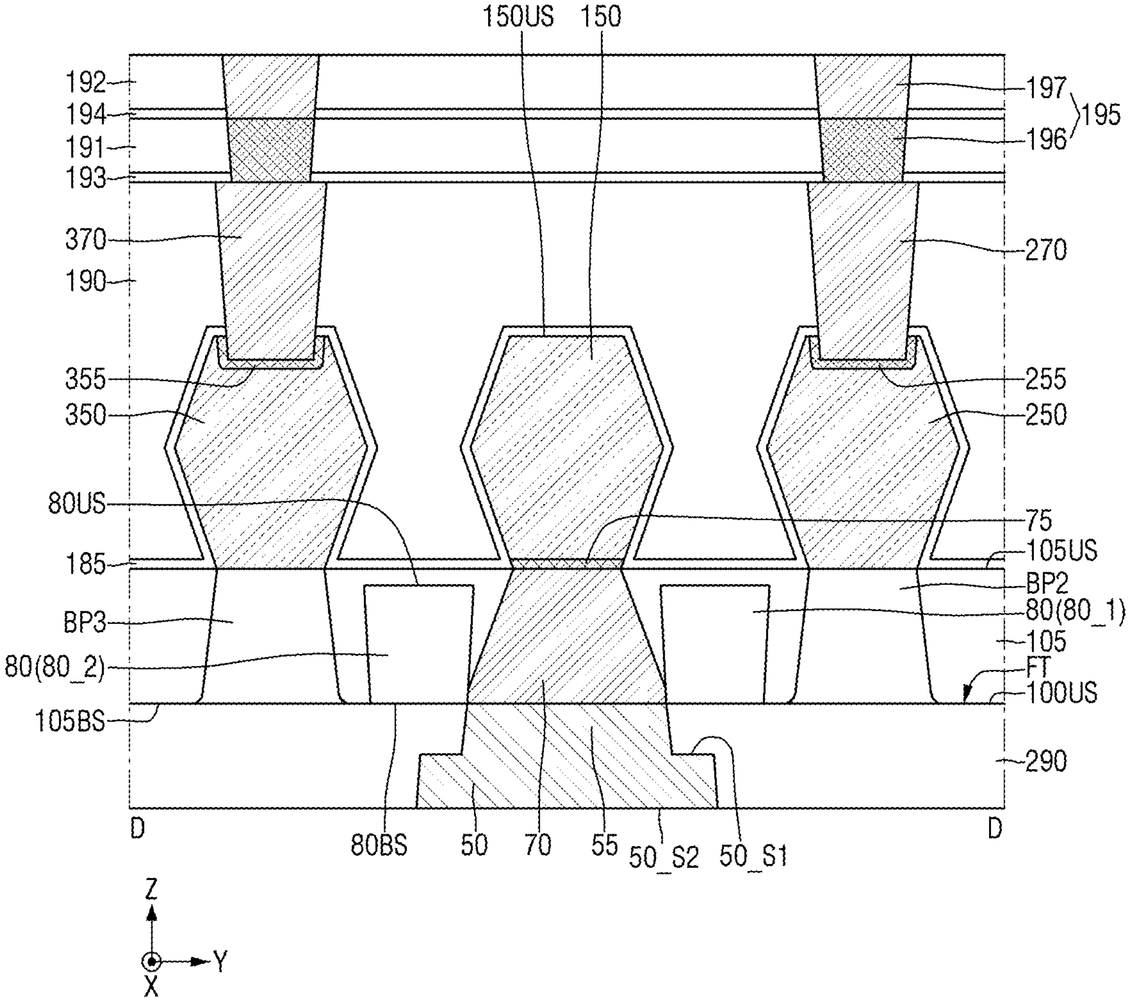
Figure 23:
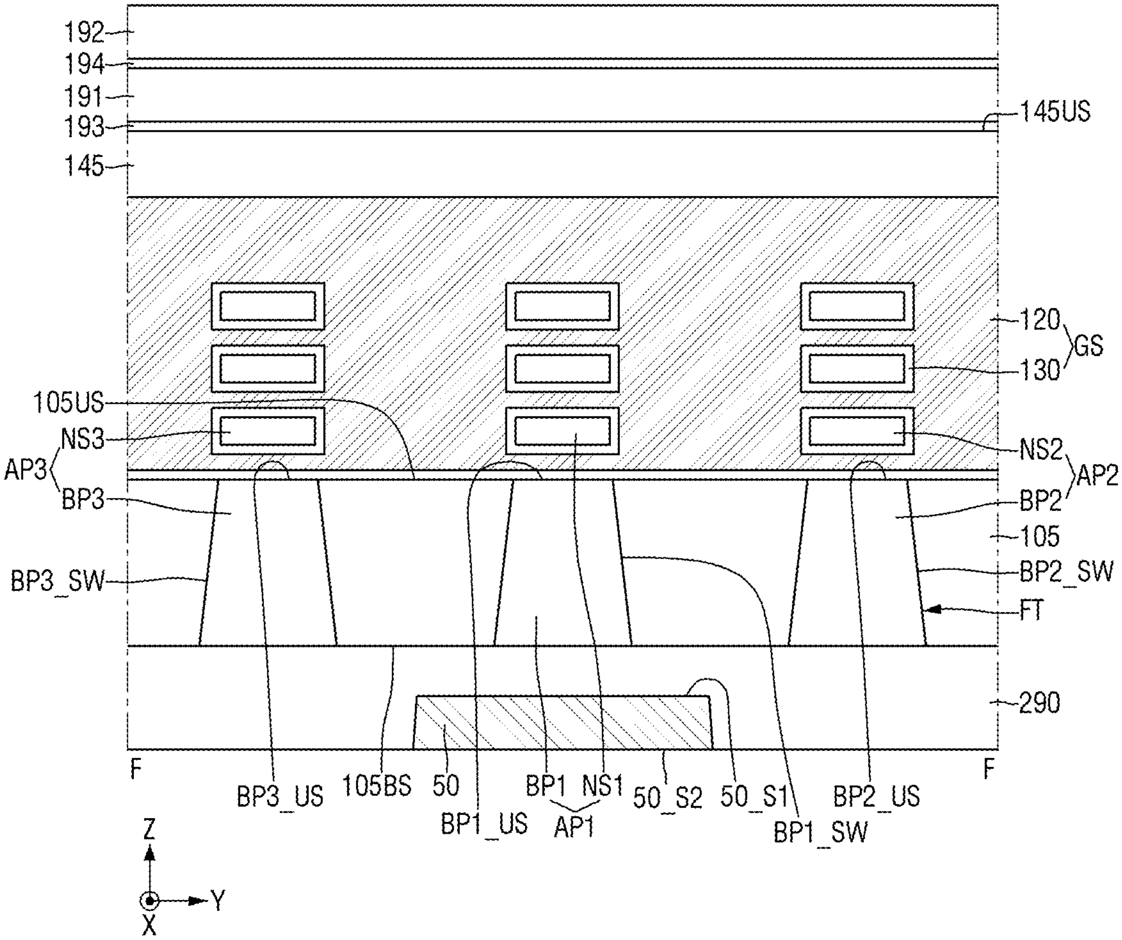
Figure 24:
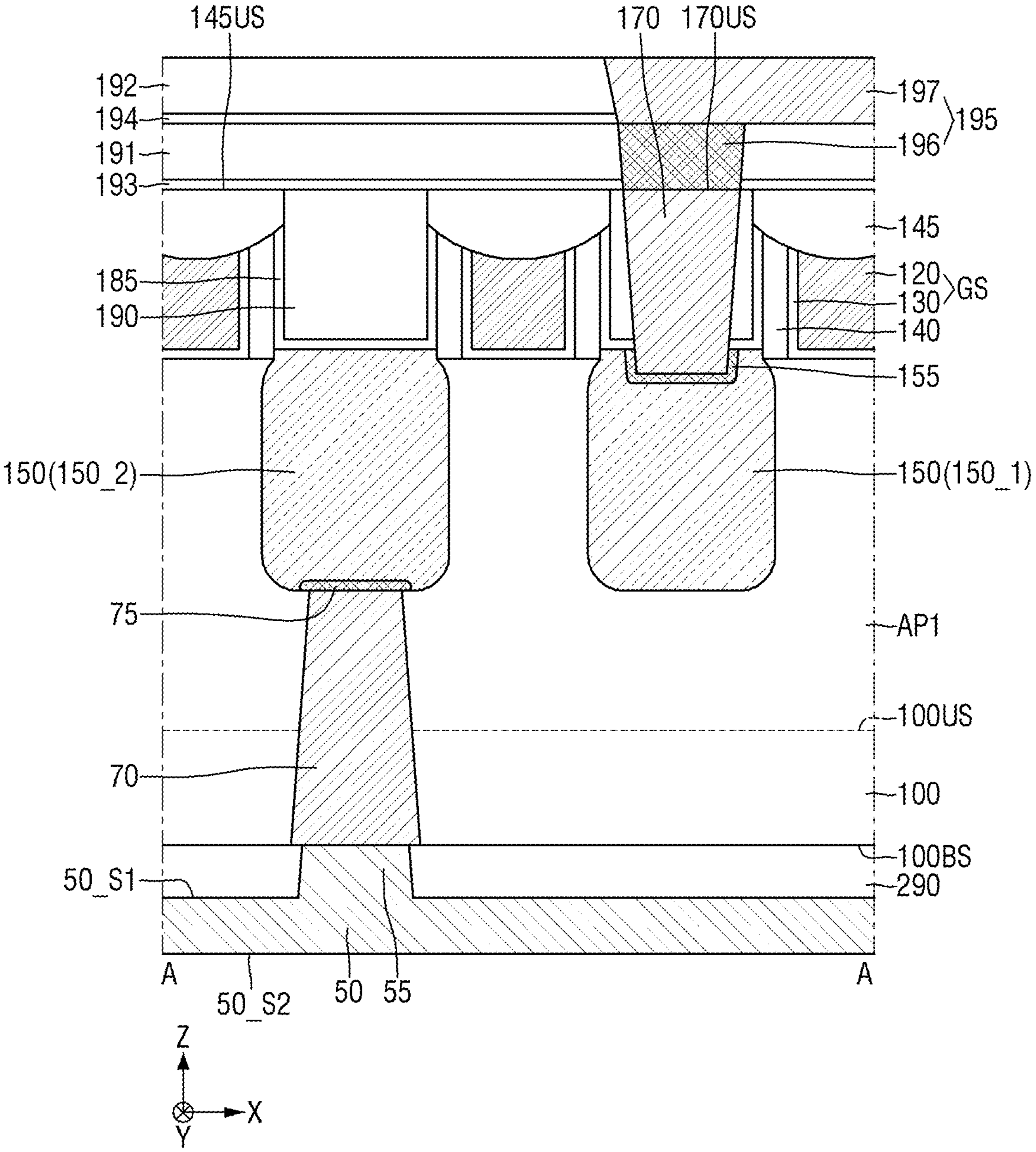
FIGS. 24 and 25 are diagrams for explaining a semiconductor device according to some embodiments.
Figure 25:
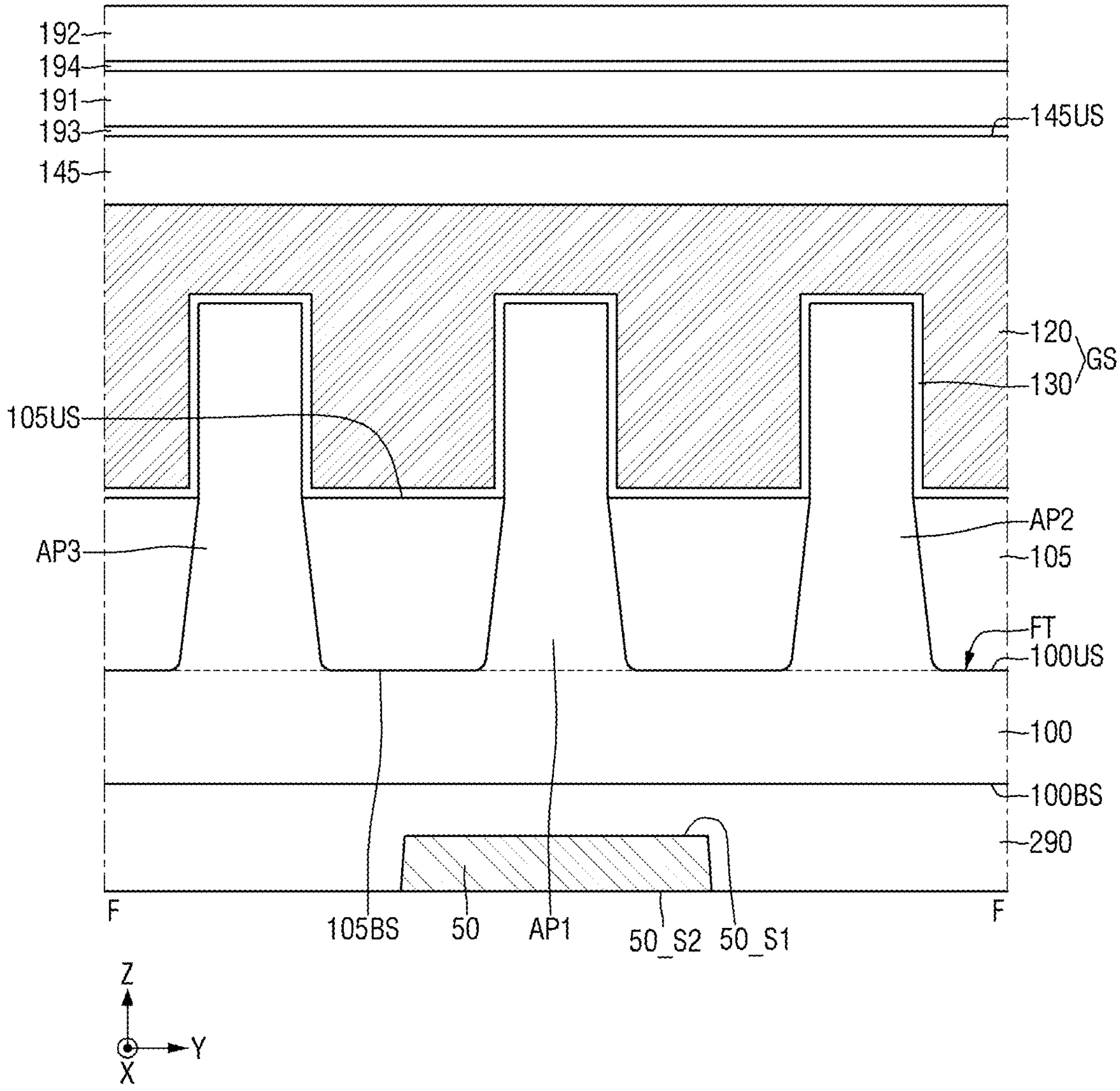

FIGS. 18 and 19 are diagrams for explaining a semiconductor device according to some embodiments. FIGS. 20 to 23 are diagrams for explaining a semiconductor device according to some embodiments. FIGS. 24 and 25 are diagrams for explaining a semiconductor device according to some embodiments. For convenience of explanation, points that are different from those described using FIGS. 1 to 10 will be mainly explained.

Referring to FIGS. 18 and 19, in the semiconductor device according to some embodiments, a part of the substrate 100 may be disposed between the back contact guide pattern 80 and the back interlayer insulating film 290.

The substrate 100 may cover the bottom face 80BS of the back contact guide pattern. The bottom face 80BS of the back contact guide pattern may not be in contact with the back interlayer insulating film 290.

A height H4 (see, e.g., FIG. 19) from the second face 50_S2 of the back wiring line to the second face 100BS of the substrate may be smaller than a height H5 from the second face 50_S2 of the back wiring line to the bottom face 80BS of the back contact guide pattern.

Referring to FIGS. 20 to 23, in the semiconductor device according to some embodiments, a substrate (100 of FIGS. 2 to 7) may not be disposed between the lower patterns BP1, BP2 and BP3 and the lower interlayer insulating film 290.

The lower interlayer insulating film 290 may be in contact with the first lower pattern BP1, the second lower pattern BP2, and the third lower pattern BP3. The lower interlayer insulating film 290 may be in contact with the field insulating film 105.

Referring to FIGS. 24 and 25, in the semiconductor device according to some embodiments, each of the first active pattern AP1, the second active pattern AP2, and the third active pattern AP3 does not include a sheet pattern.

The first active pattern AP1, the second active pattern AP2, and the third active pattern AP3 may be fin-shaped patterns that protrude above the upper face 105US of the field insulating film. In FIG. 25, the field insulating film 105 may cover a part of the side walls of the active patterns AP1, AP2, and AP3.

The gate structure GS does not include the inner gate structure I_GS.

Figure 26:
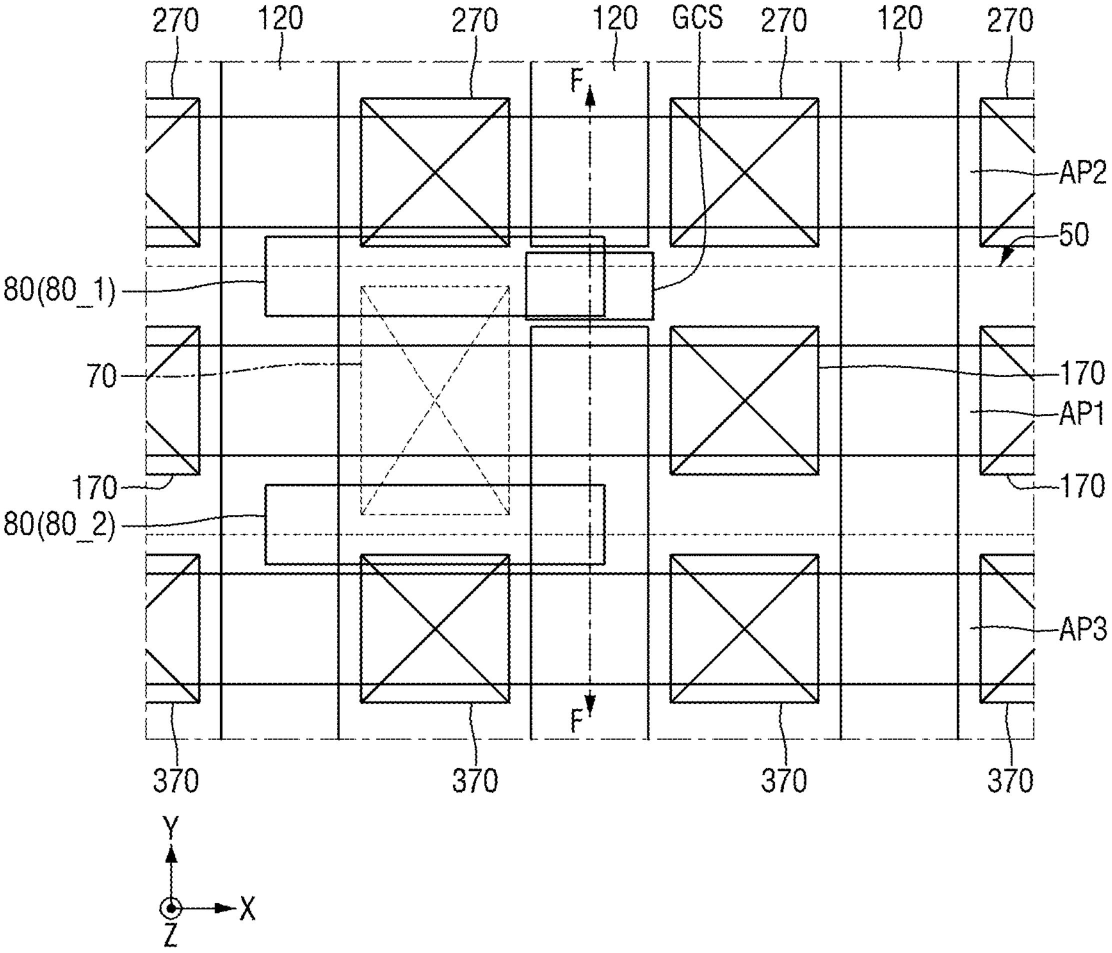
FIGS. 26 to 28 are diagrams for explaining a semiconductor device according to some embodiments.
Figure 27:
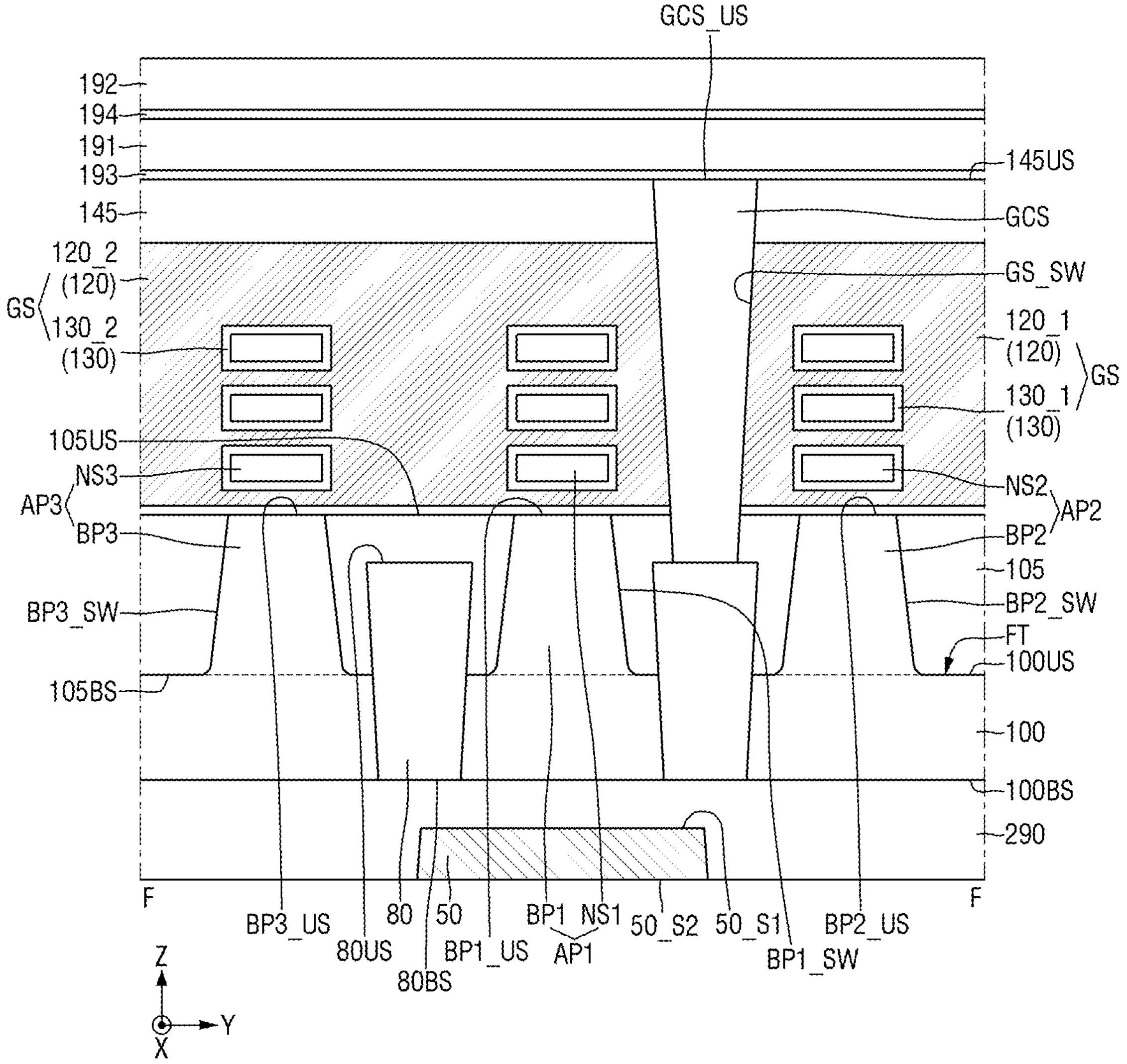
Figure 28:
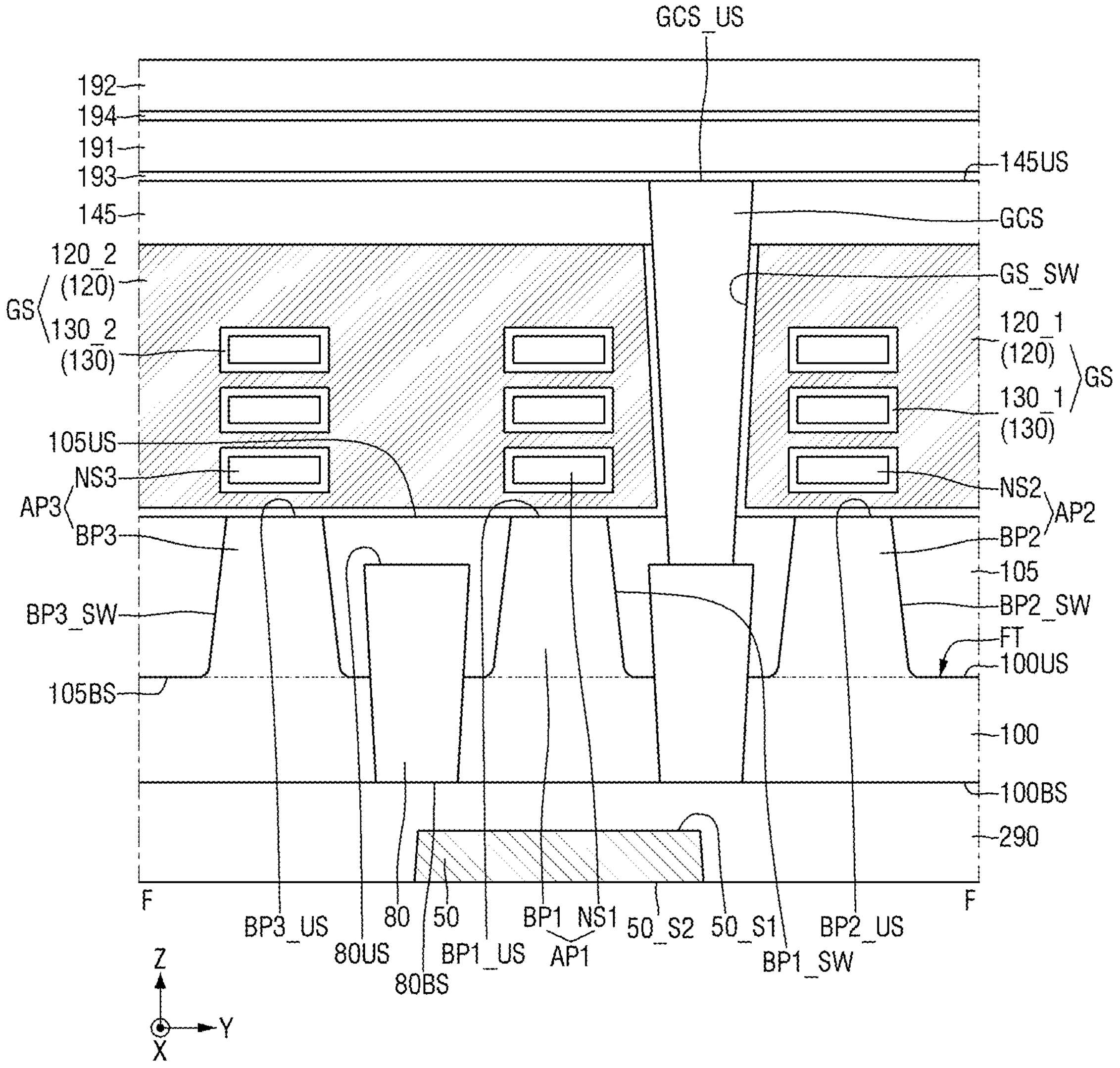

FIGS. 26 to 28 are diagrams for explaining a semiconductor device according to some embodiments. For convenience of explanation, points different from those described using FIGS. 1 to 10 and 15 to 17 will be mainly explained.

For reference, FIG. 26 is a layout diagram for explaining a semiconductor device according to some embodiments. FIGS. 27 and 28 are cross-sectional views taken along line F-F of FIG. 26, respectively.

Referring to FIGS. 26 to 28, the semiconductor device according to some embodiments may further include a gate isolation structure GCS disposed on the back contact guide pattern 80.

The gate isolation structure GCS may be disposed on the upper face 80US of the back contact guide pattern. The gate isolation structure GCS may be in contact with the back contact guide pattern 80.

The gate isolation structures GCS may be formed of or include, for example, at least one of silicon nitride (SiN), silicon oxynitride (SiON), silicon oxide ($SiO_2$), silicon oxycarbonitride (SiOCN), silicon boronitride (SiBN), silicon oxyboronitride (SiOBN), silicon oxycarbide (SiOC), aluminum oxide (AlO), and combinations thereof. Although the gate isolation structure GCS is shown as being a single film, the embodiment is not limited thereto.

The gate isolation structure GCS may separate at least one gate structure GS into two portions. The gate isolation structure GCS may separate the gate structure GS into a first portion and a second portion.

The gate isolation structure GCS may separate one gate electrode 120 into a first portion 120_1 of the gate electrode and a second portion 120_2 of the gate electrode. The gate isolation structure GCS may separate one gate insulating film 130 into a first portion 130_1 of the gate insulating film and a second portion 130_2 of the gate insulating film.

The gate isolation structure GCS may separate the gate capping pattern 145 into two portions. The upper face GCS_US of the gate isolation structure may be disposed in the same plane as the upper face 145US of the gate capping pattern.

The first portion of the gate structure GS may include a first portion 120_1 of the gate electrode and a first portion 130_1 of the gate insulating film. The second portion of the gate structure GS may include a second portion 120_2 of the gate electrode and a second portion 130_2 of the gate insulating film.

The first portion of the gate structure GS and the second portion of the gate structure GS may each include a side wall GS_SW that faces the gate isolation structure GCS. A side wall GS_SW of the first portion of the gate structure GS and a side wall GS_SW of the second portion of the gate structure GS may be in contact with the gate isolation structure GCS.

In FIG. 27, the first portion 120_1 of the gate electrode and the second portion 120_2 of the gate electrode may be in contact with the gate isolation structure GCS. The first portion 130_1 of the gate insulating film and the second portion 130_2 of the gate insulating film do not extend in the third direction Z along the side walls of the gate isolation structure GCS.

In FIG. 28, the first portion 130_1 of the gate insulating film and the second portion 130_2 of the gate insulating film may extend in the third direction Z along the side walls of the gate isolation structure GCS. The first portion 120_1 of the gate electrode and the second portion 120_2 of the gate electrode may not be in contact with the gate isolation structure GCS.

FIGS. 29 to 44 are intermediate stage diagrams for explaining a method for fabricating a semiconductor device according to some embodiments.

Figure 29:
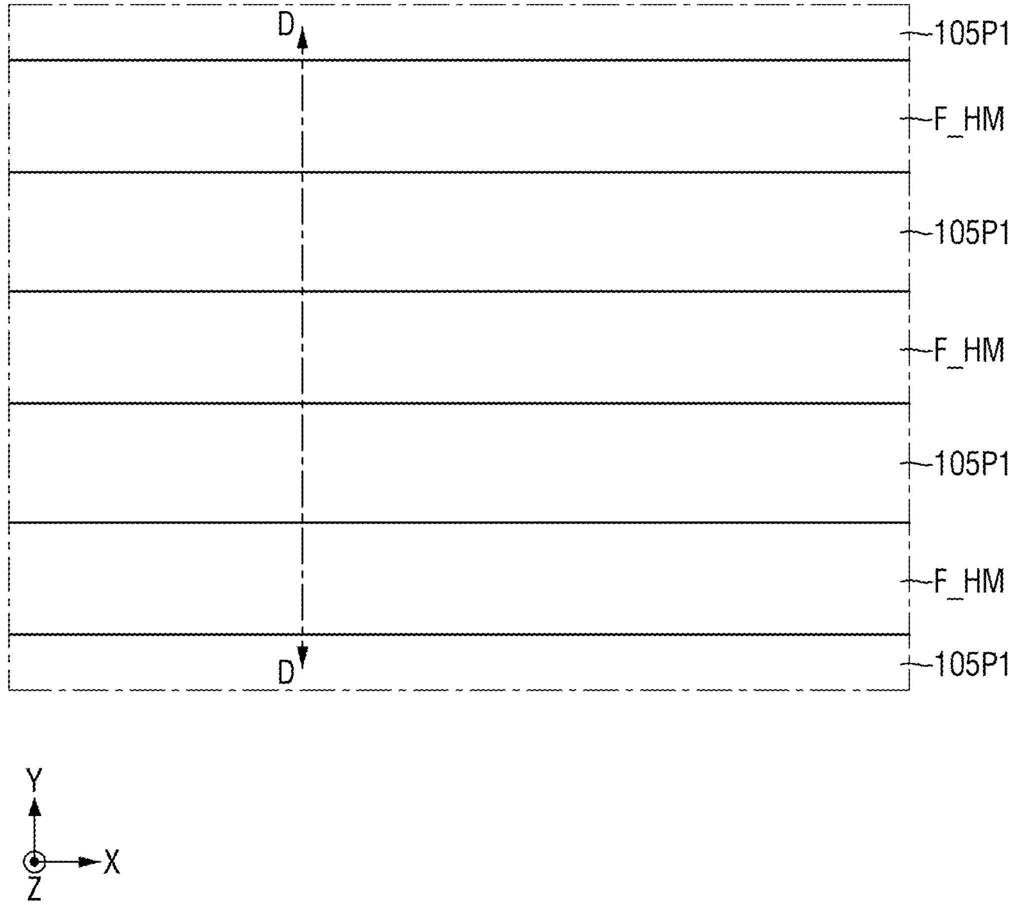
FIGS. 29 to 44 are intermediate stage diagrams for explaining a method for fabricating a semiconductor device according to some embodiments.
Figure 30:
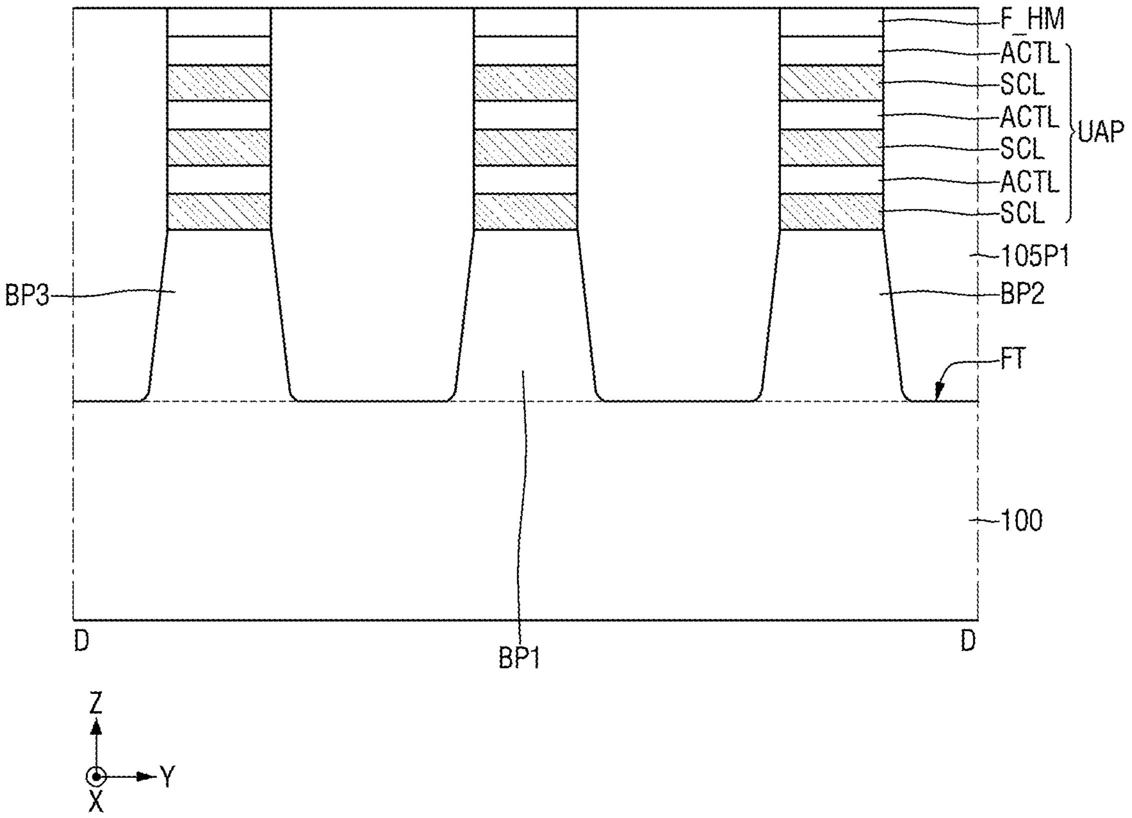

Referring to FIGS. 29 and 30, the first lower pattern BP1, the second lower pattern BP2, and the third lower pattern BP3 may be formed on the substrate 100.

The first lower pattern BP1, the second lower pattern BP2, and the third lower pattern BP3 may be separated by a fin trench FT. While the lower patterns BP1, BP2, and BP3 are being formed, the upper pattern structure UAP may be formed on each of the first lower pattern BP1, the second lower pattern BP2, and the third lower pattern BP3. The upper pattern structure UAP may extend in the first direction.

The upper pattern structure UAP may include a plurality of sacrificial patterns SCL and a plurality of active patterns ACTL, which are alternately stacked on the lower patterns BP1, BP2, and BP3. For example, the sacrificial pattern SCL may be formed of or include a silicon-germanium film. The active pattern ACTL may be formed of or include a silicon film.

A fin hard mask F_HM may be formed on each upper pattern structure UAP. The upper pattern structure UAP and the lower patterns BP1, BP2, and BP3 may be formed, by using the fin hard mask F_HM as an etching mask. The fin hard mask F_HM may be formed of or include, but is not limited to, silicon nitride.

Subsequently, a pre-field insulating film 105P1 may be formed on the substrate 100. The pre-field insulating film 150P1 may fill the fin trench FT. The pre-field insulating film 105P1 may cover the side walls of the lower patterns BP1, BP2, and BP3 and the side walls of the upper pattern structure UAP. The pre-field insulating film 105P1 may not cover the upper face of the fin hard mask F_HM.

Figure 31:
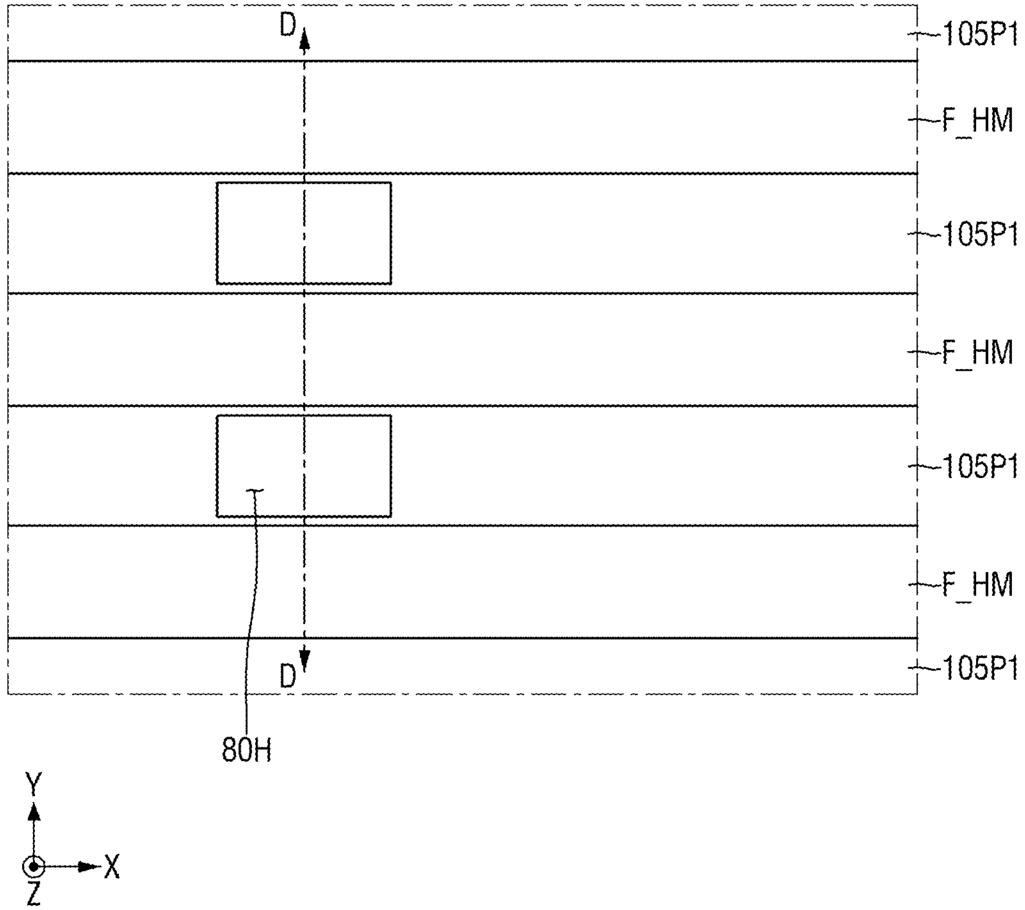
Figure 32:
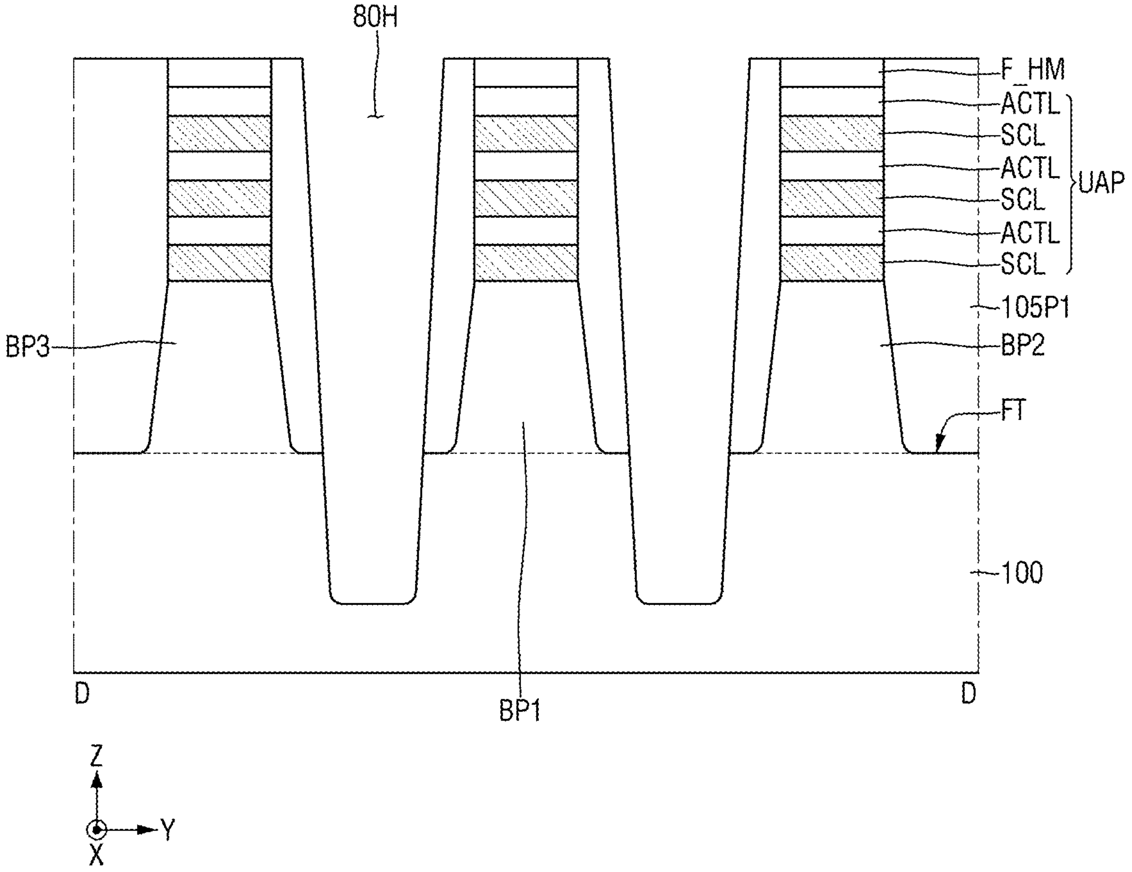

Referring to FIGS. 31 and 32, a back contact guide hole 80H may be formed in the pre-field insulating film 105P1 and the substrate 100.

The back contact guide hole 80H may be formed between upper pattern structures UAP adjacent to each other in the second direction Y. The back contact guide hole 80H is formed between the first lower pattern BP1 and the second lower pattern BP2, and between the first lower pattern BP1 and the third lower pattern BP3.

Figure 33:
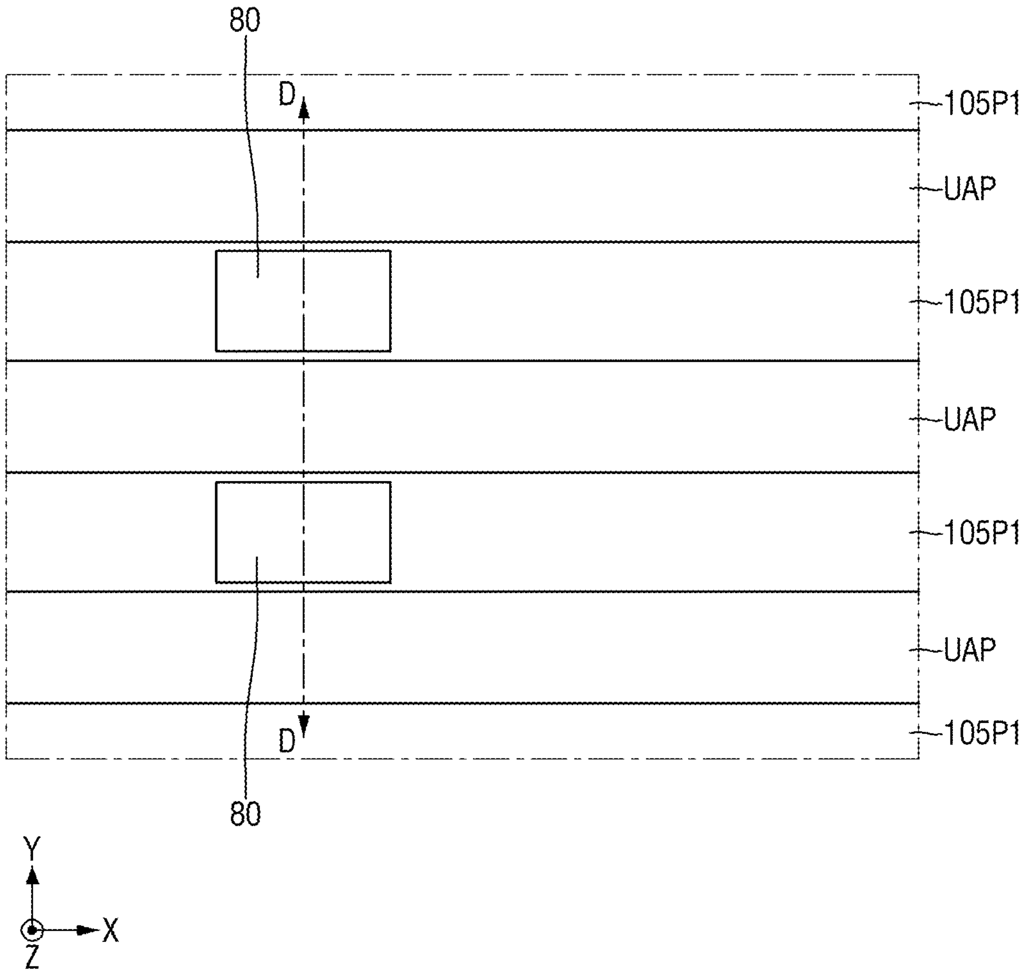
Figure 34:
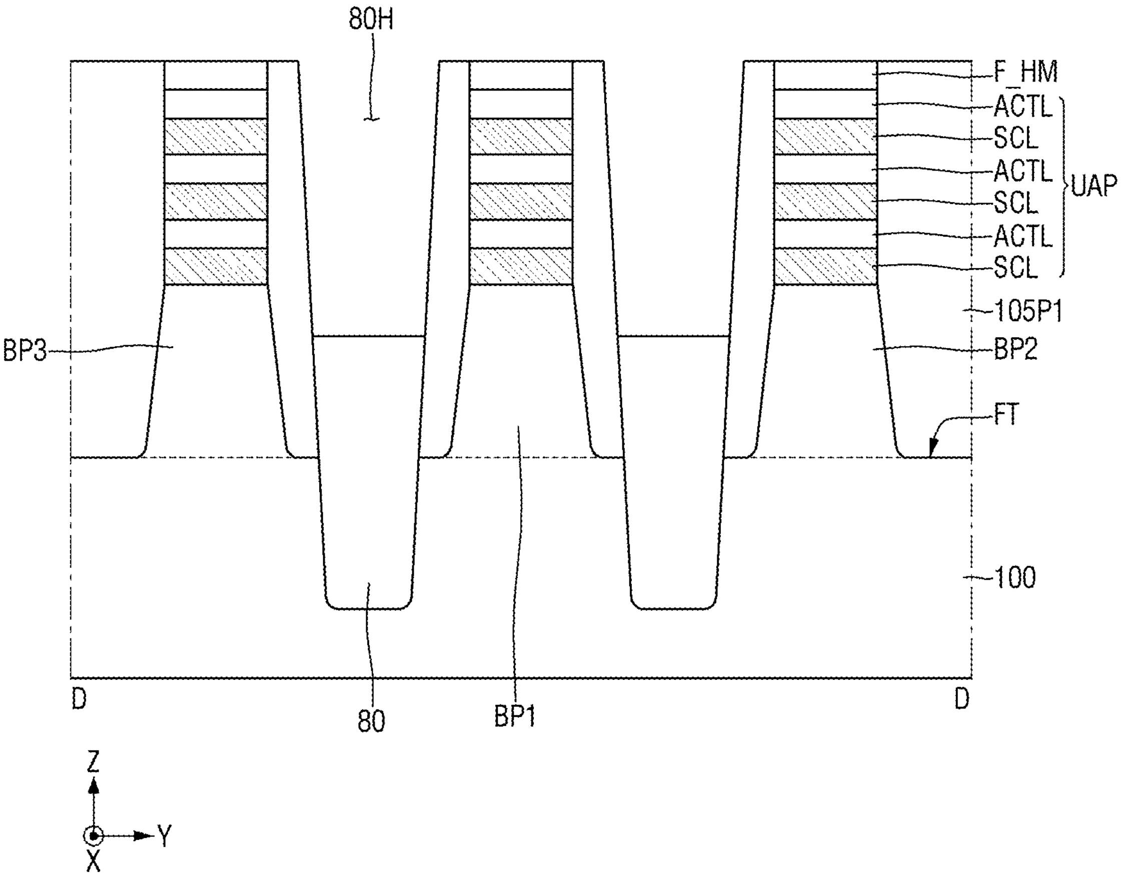

Referring to FIGS. 33 and 34, a back contact guide pattern 80 may be formed in the back contact guide hole 80H.

The back contact guide pattern 80 may fill a part of the back contact guide hole 80H. The fin hard mask F_HM may be removed while the back contact guide pattern 80 is being formed, but the embodiment is not limited thereto.

More specifically, a pre-contact guide film may be formed in the back contact guide hole 80H. The pre-contact guide film may fill the back contact guide hole 80H. The pre-contact guide film may also be formed on the fin hard mask F_HM. The back contact guide pattern 80 may be formed in the back contact guide hole 80H, by etching a part of the pre-contact guide film. The fin hard mask F_HM may be removed, while a part of the pre-contact guide film is being removed.

Figure 35:
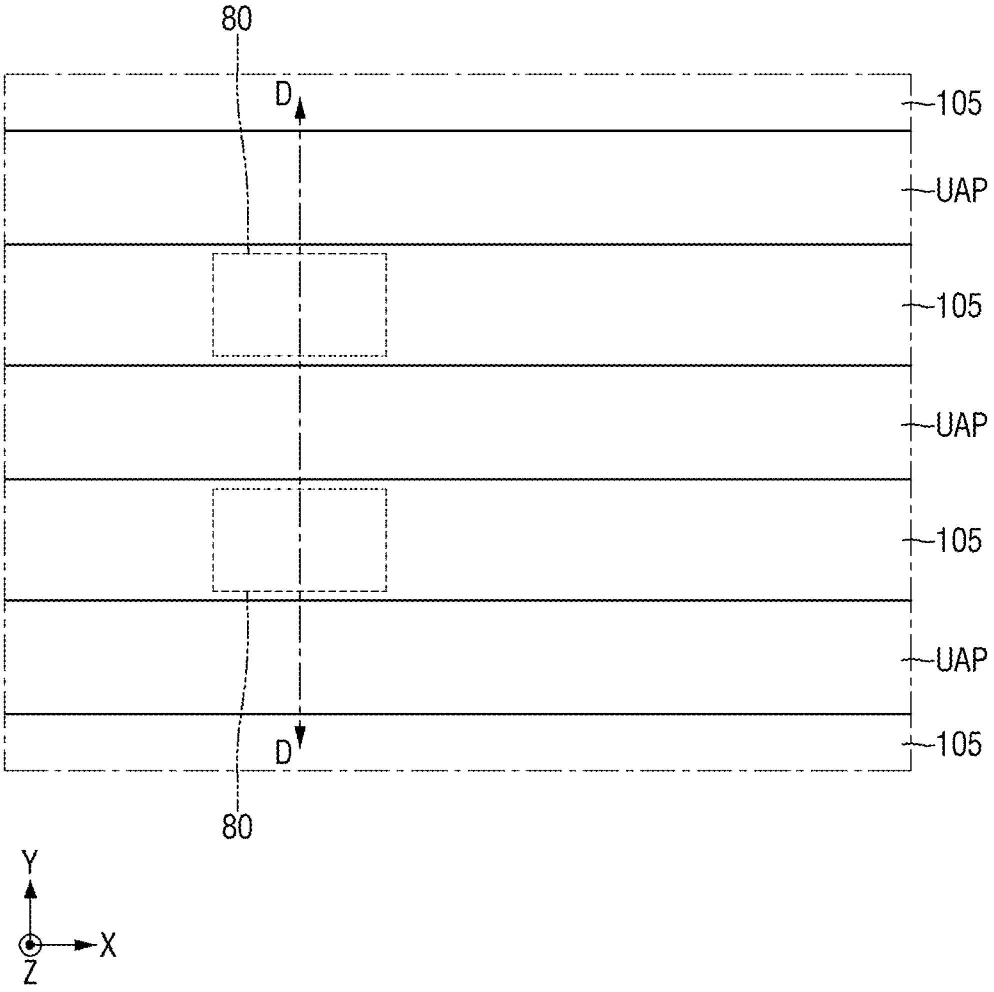
Figure 36:
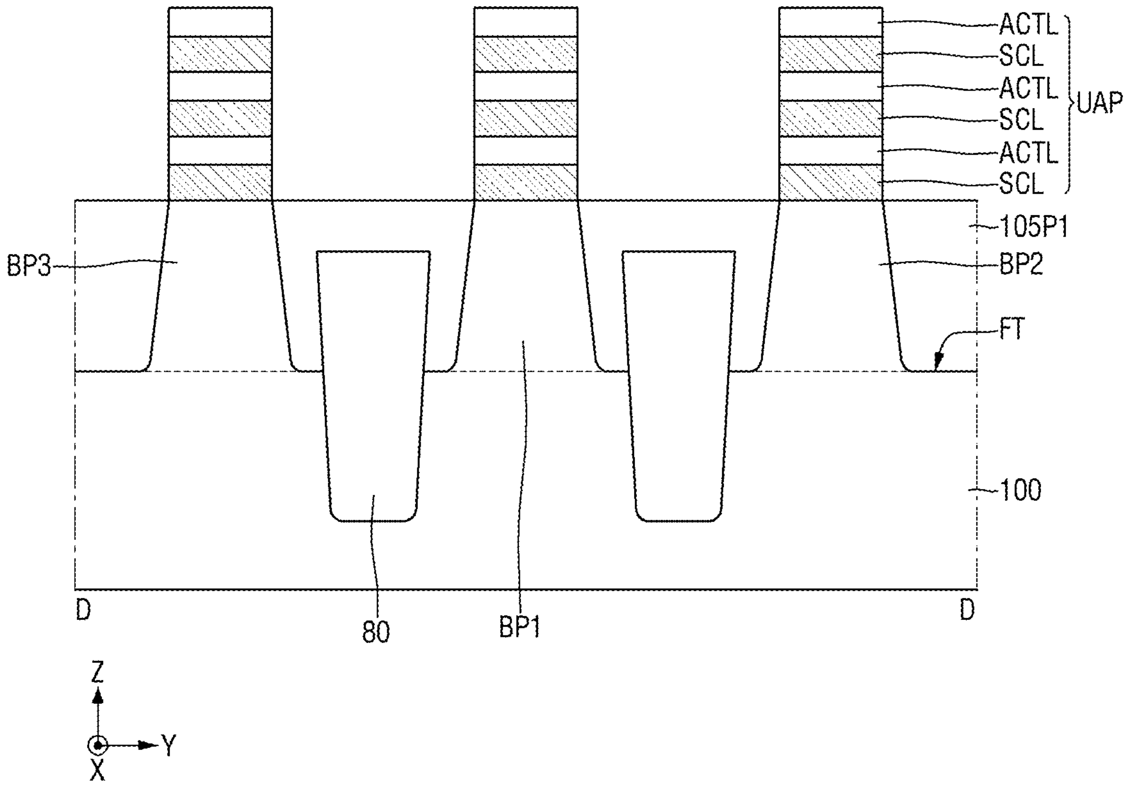

Unlike the shown example, the fin hard mask F_HM may be removed, while the field insulating film 105 is being formed in FIGS. 35 and 36.

Referring to FIGS. 35 to 36, a pre-field insulating film (105P1 of FIG. 30) that fills the remainder of the back contact guide hole 80H may be formed on the back contact guide pattern 80.

Subsequently, a field insulating film 105 may be formed on the substrate 100, by removing a part of the pre-field insulating film 105P1. The upper pattern structure UAP may protrude above the field insulating film 105.

Although the field insulating film 105 is shown to cover the back contact guide pattern 80, the embodiment is not limited thereto. The field insulating film 105 may not cover the upper face of the back contact guide pattern 80.

Figure 37:
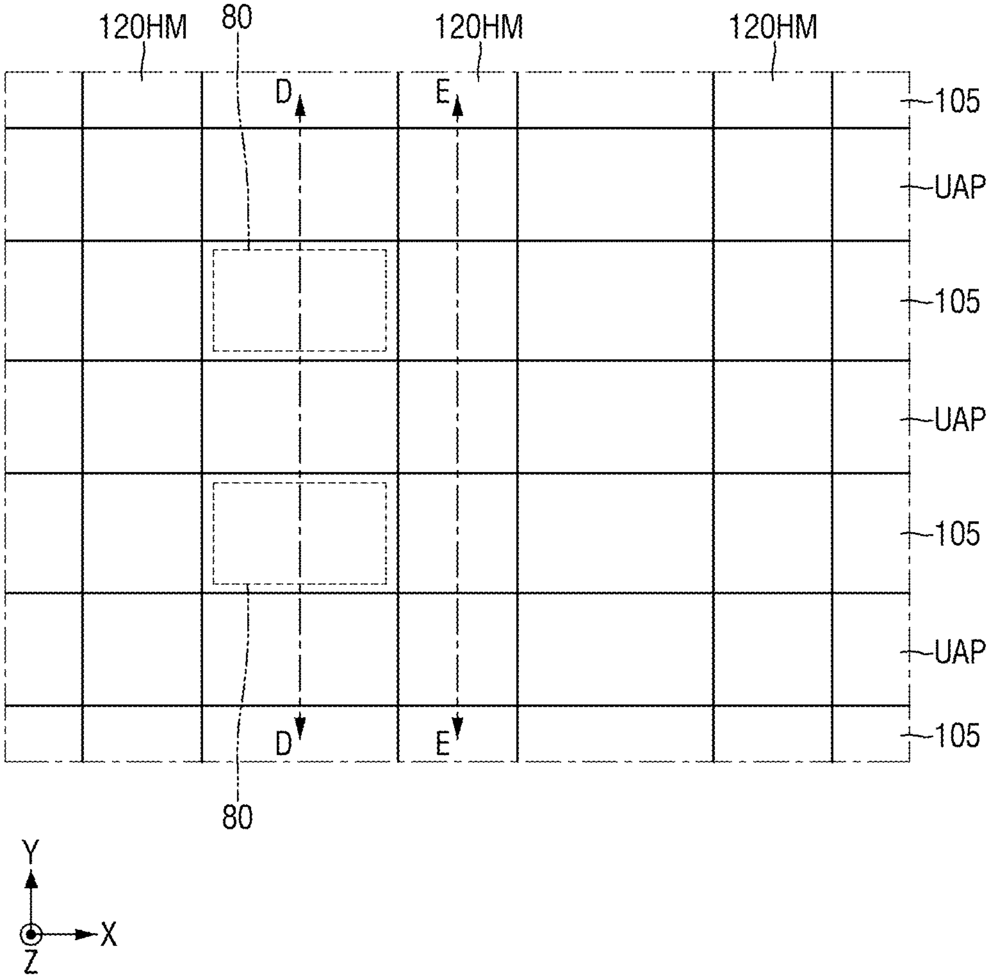
Figure 38:
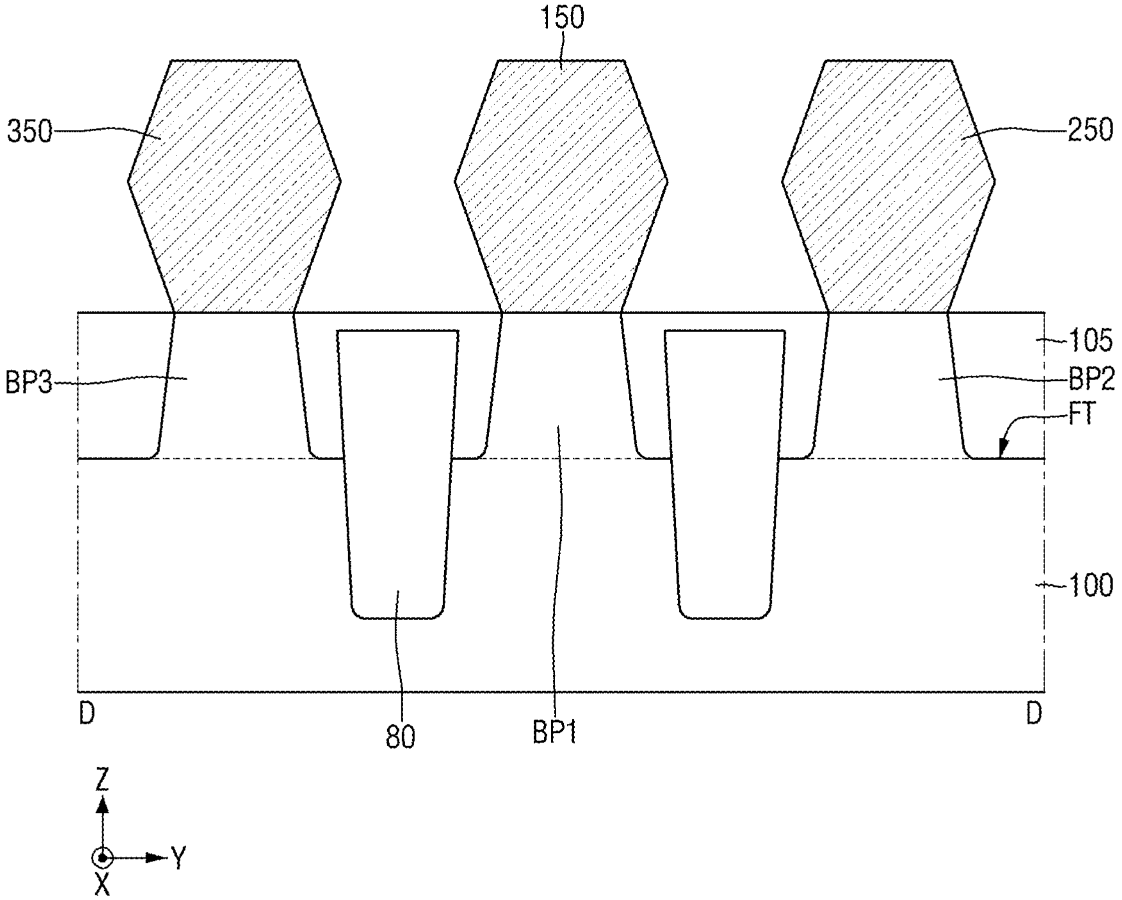
Figure 39:
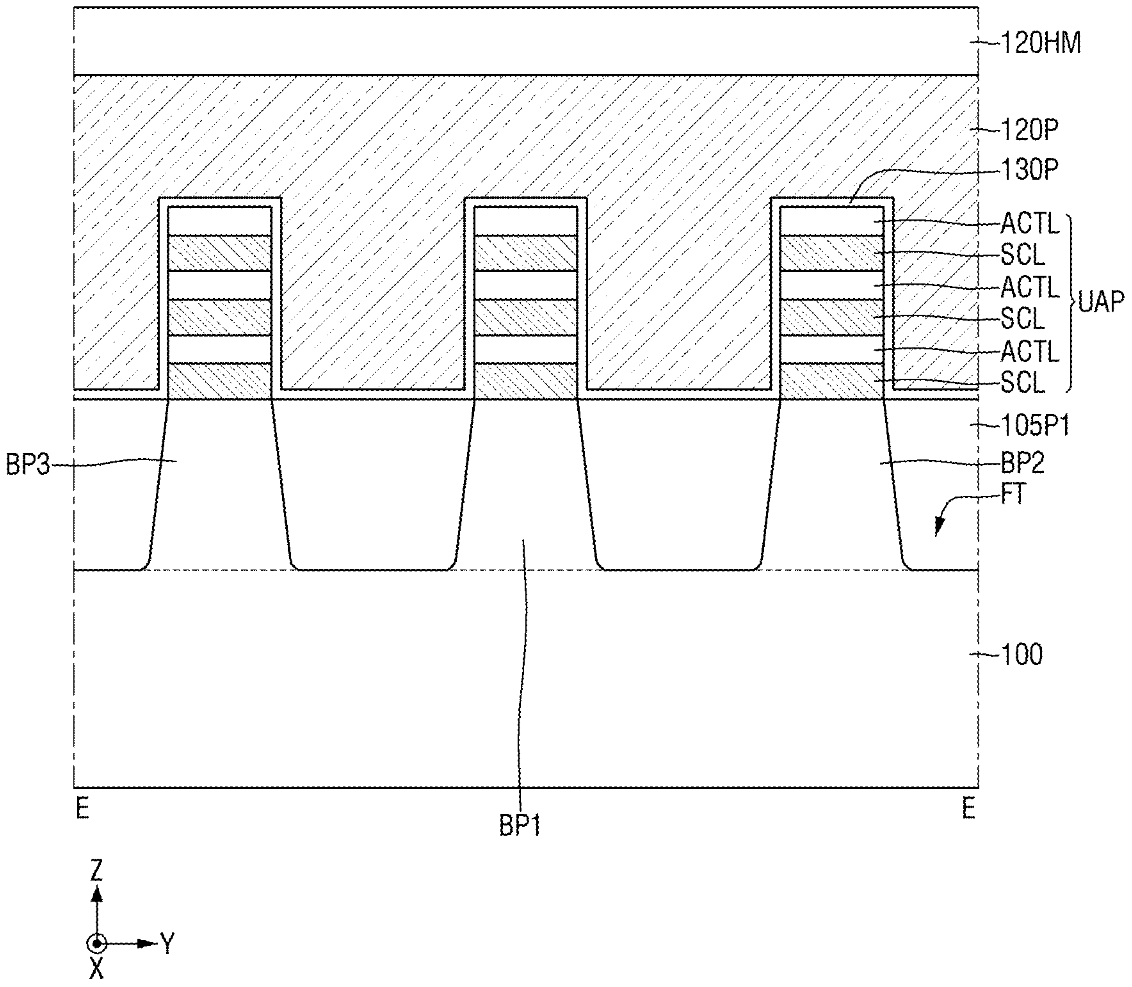

Referring to FIGS. 37 to 39, the dummy gate electrode 120P, the dummy gate insulating film 130P, and the dummy gate capping film 120HM extending in the second direction Y may be formed on the field insulating film 105 and the upper pattern structure UAP.

The dummy gate electrode 120P may intersect the upper pattern structure UAP.

The dummy gate insulating film 130P may be formed of or include, for example, but not limited to, silicon oxide. The dummy gate electrode 120P may be formed of or include, for example, but not limited to, polysilicon. The dummy gate capping film 120HM may be formed of or include, for example, but not limited to, silicon nitride.

Although not shown, a gate spacer (140 of FIG. 2) may be formed on the dummy gate electrode 120P.

Next, first to third source/drain recesses may be formed between the dummy gate electrodes 120P, by removing the upper pattern structure UAP between the dummy gate electrodes 120P adjacent to each other in the first direction X. While the first to third source/drain recesses are being formed, a part of the field insulating film 105 between dummy gate electrodes 120P adjacent in the first direction X may be etched.

The first source/drain pattern 150 may be formed in the first source/drain recess. The first source/drain pattern 150 may be formed on the first lower pattern BP1. The second source/drain pattern 250 may be formed in the second source/drain recess. The second source/drain pattern 250 may be formed on the second lower pattern BP2. The third source/drain pattern 350 may be formed in the third source/drain recess. The third source/drain pattern 350 may be formed on the third lower pattern BP3.

Figure 40:
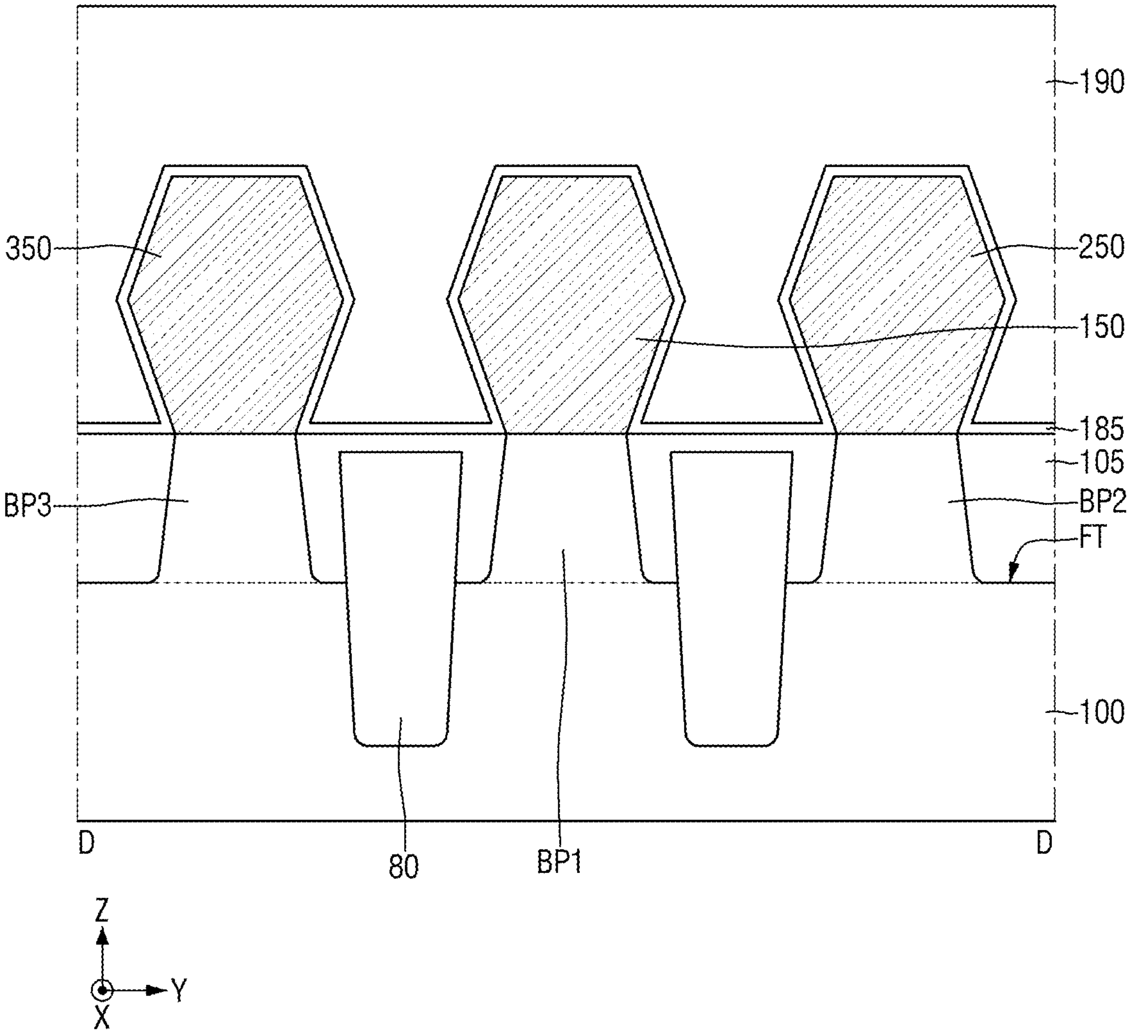
Figure 41:
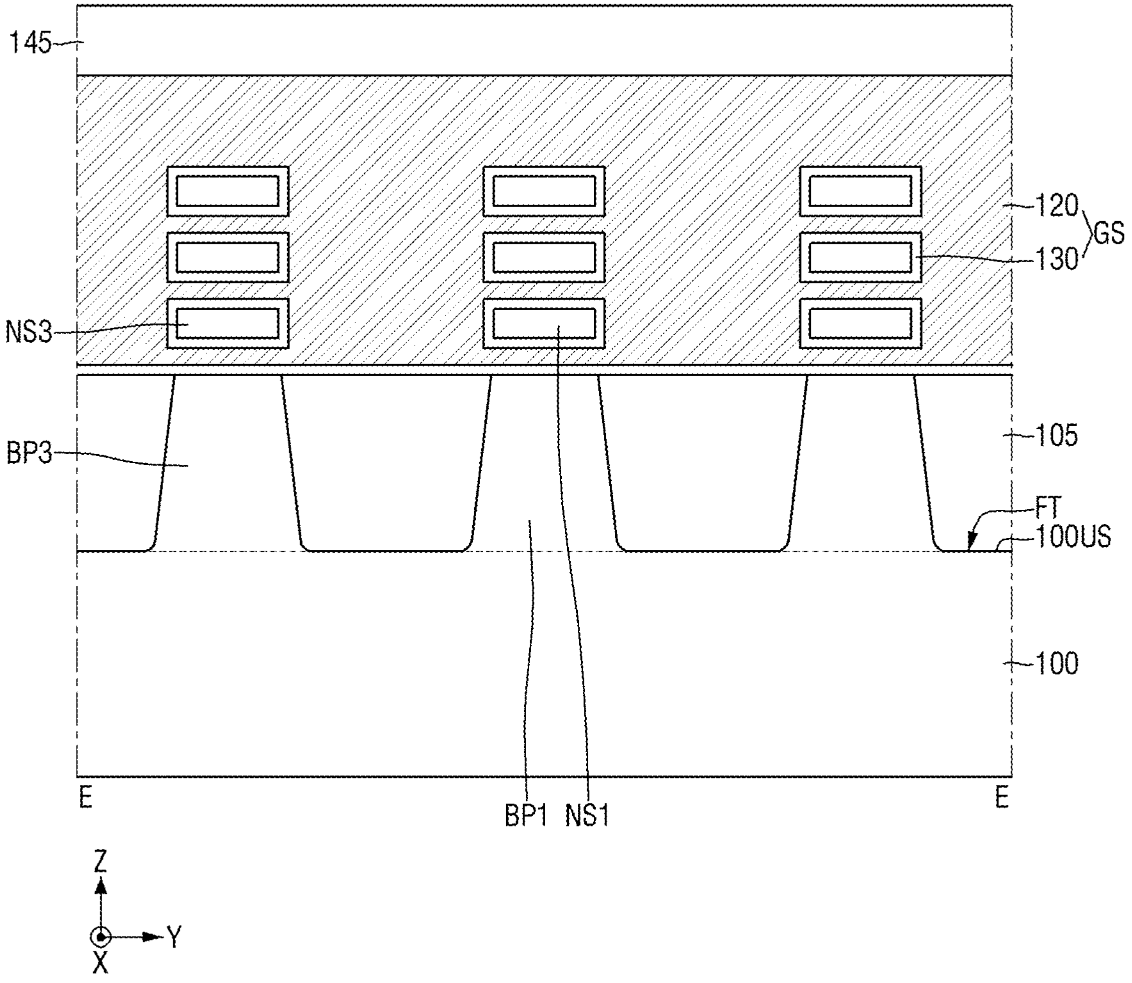

Referring to FIGS. 40 to 41, the source/drain etching stop film 185 may be formed on the source/drain patterns 150, 250, and 350 and the field insulating film 105.

The source/drain etching stop film 185 may extend along the profile of the first source/drain pattern 150, the profile of the second source/drain pattern 250, and the profile of the third source/drain pattern 350.

The first front interlayer insulating film 190 may be formed on the source/drain etching stop film 185.

Subsequently, the dummy gate capping film 120_HM is removed to expose the upper face of the dummy gate electrode 120P. The dummy gate insulating film 130P and the dummy gate electrode 120P may be removed to expose the upper pattern structure UAP.

Next, the first sheet pattern NS1, the second sheet pattern NS2, and the third sheet pattern NS3 may be formed by removing the sacrificial pattern SCL. The active pattern ACTL of the upper pattern structure UAP may be the first sheet pattern NS1, the second sheet pattern NS2, and the third sheet pattern NS3.

Subsequently, the gate insulating film 130 and the gate electrode 120 may be sequentially formed. The gate capping pattern 145 may be formed on the gate electrode 120.

Figure 42:
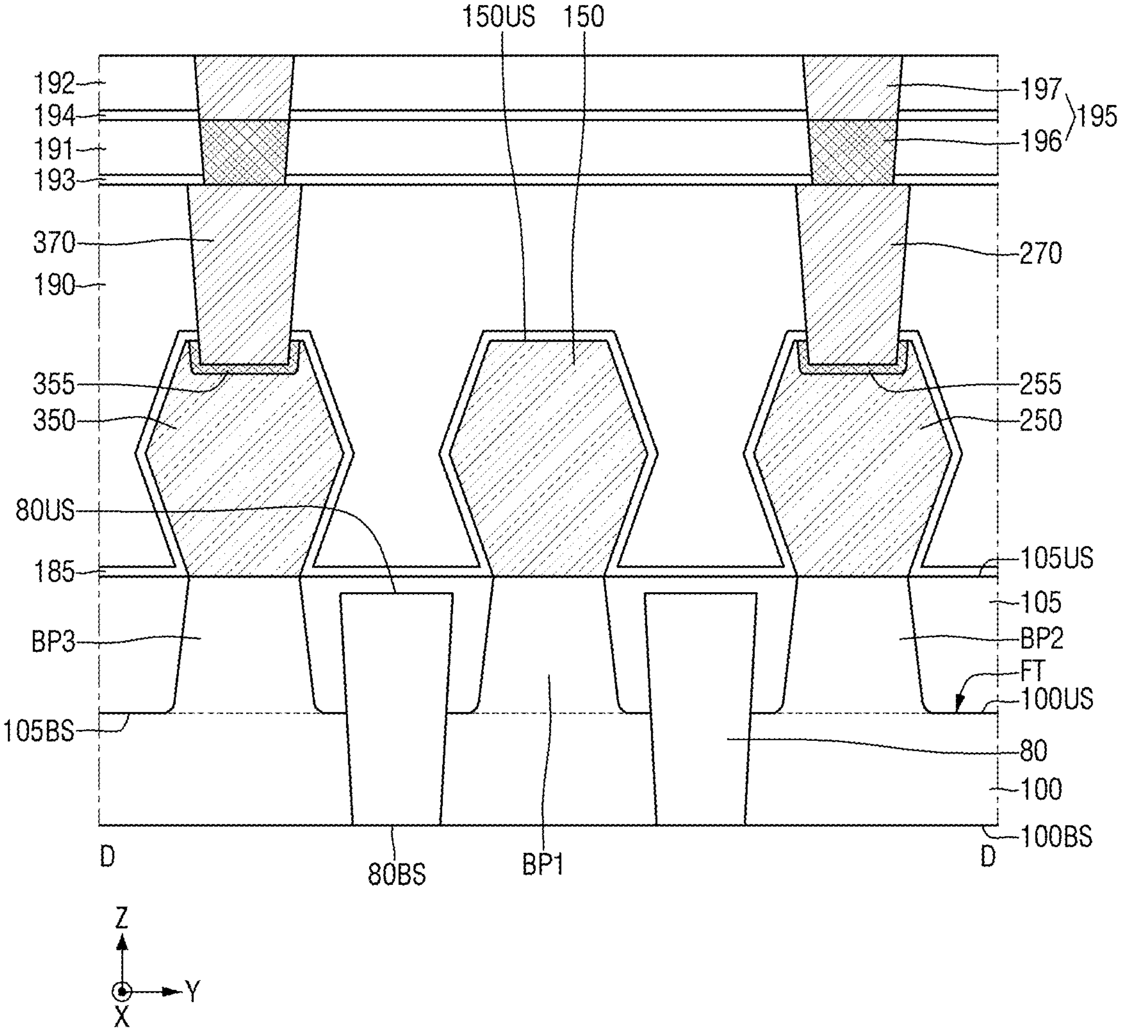

Referring to FIGS. 40 and 42, the second front source/drain contact 270 and the third front source/drain contact 370 may be formed on the second source/drain pattern 250 and the third source/drain pattern 350.

Although not shown, the first front source/drain contact (170 of FIG. 6) may be formed on the first source/drain pattern 150.

Before the second front source/drain contact 270 and the third front source/drain contact 370 are formed, the second front contact silicide film 255 and the third front contact silicide film 355 may be formed.

Subsequently, the front wiring structure 195 may be formed on the first front interlayer insulating film 190.

Thereafter, a part of the substrate 100 may be removed to reduce the thickness of the substrate 100. Therefore, the second face 100BS of the substrate 100 may be formed. The back contact guide pattern 80 may be exposed, while a part of the substrate 100 is being removed.

Unlike the shown example, as an example, the substrate 100 may remain on the bottom face 80BS of the back contact guide pattern. As another example, the entire substrate 100 may be removed. In this case, the field insulating film 105 and the lower patterns BP1, BP2, and BP3 may be exposed.

Figure 43:
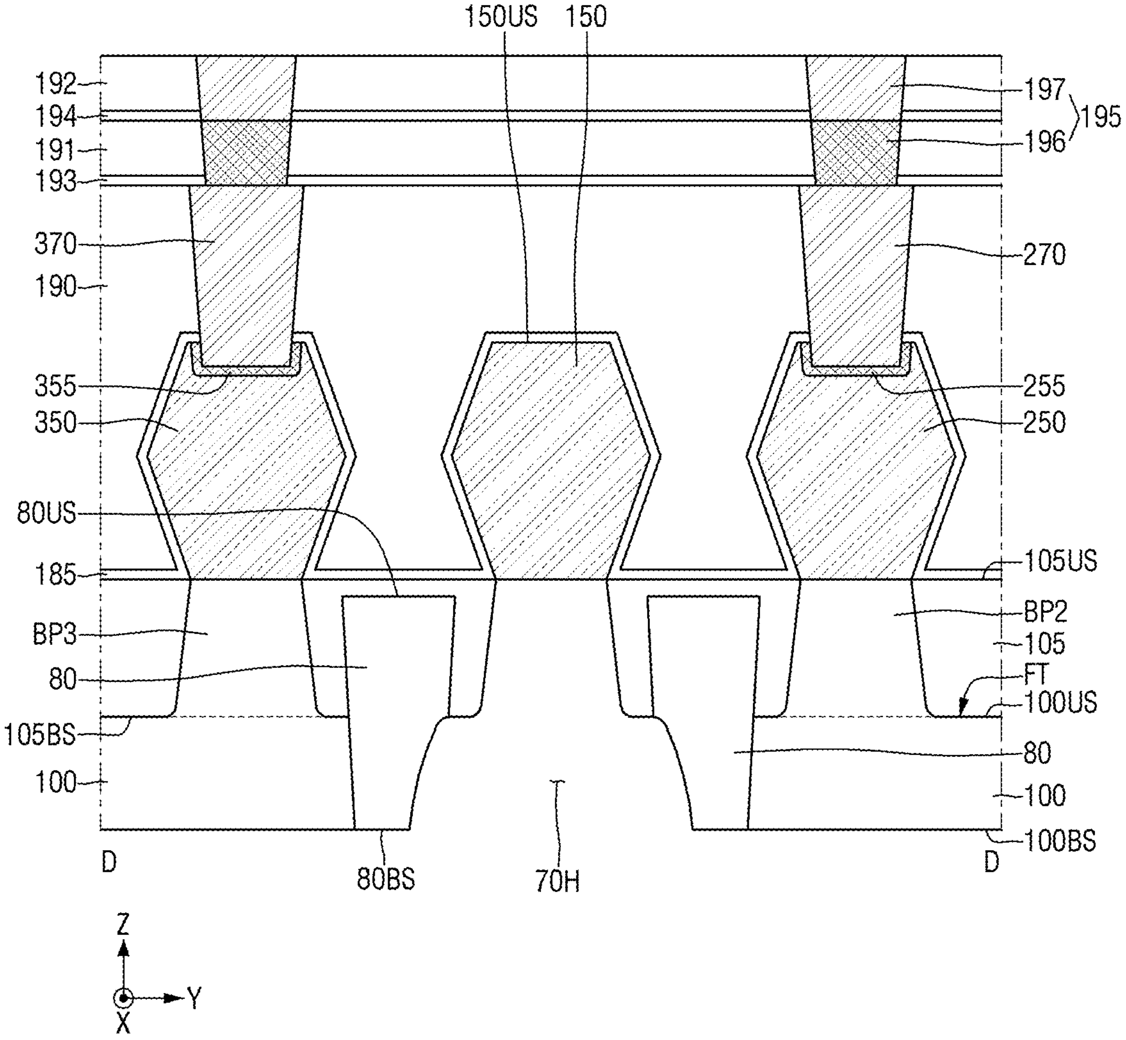

Referring to FIG. 43, the back contact hole 70H may be formed in the substrate 100 and the first lower pattern BP1, by using the back contact guide pattern 80 as a mask.

The back contact hole 70H may expose the first source/drain pattern 150. The back contact hole 70H may be formed by removing a part of the back contact guide pattern 80, but the embodiment is not limited thereto.

Figure 44:
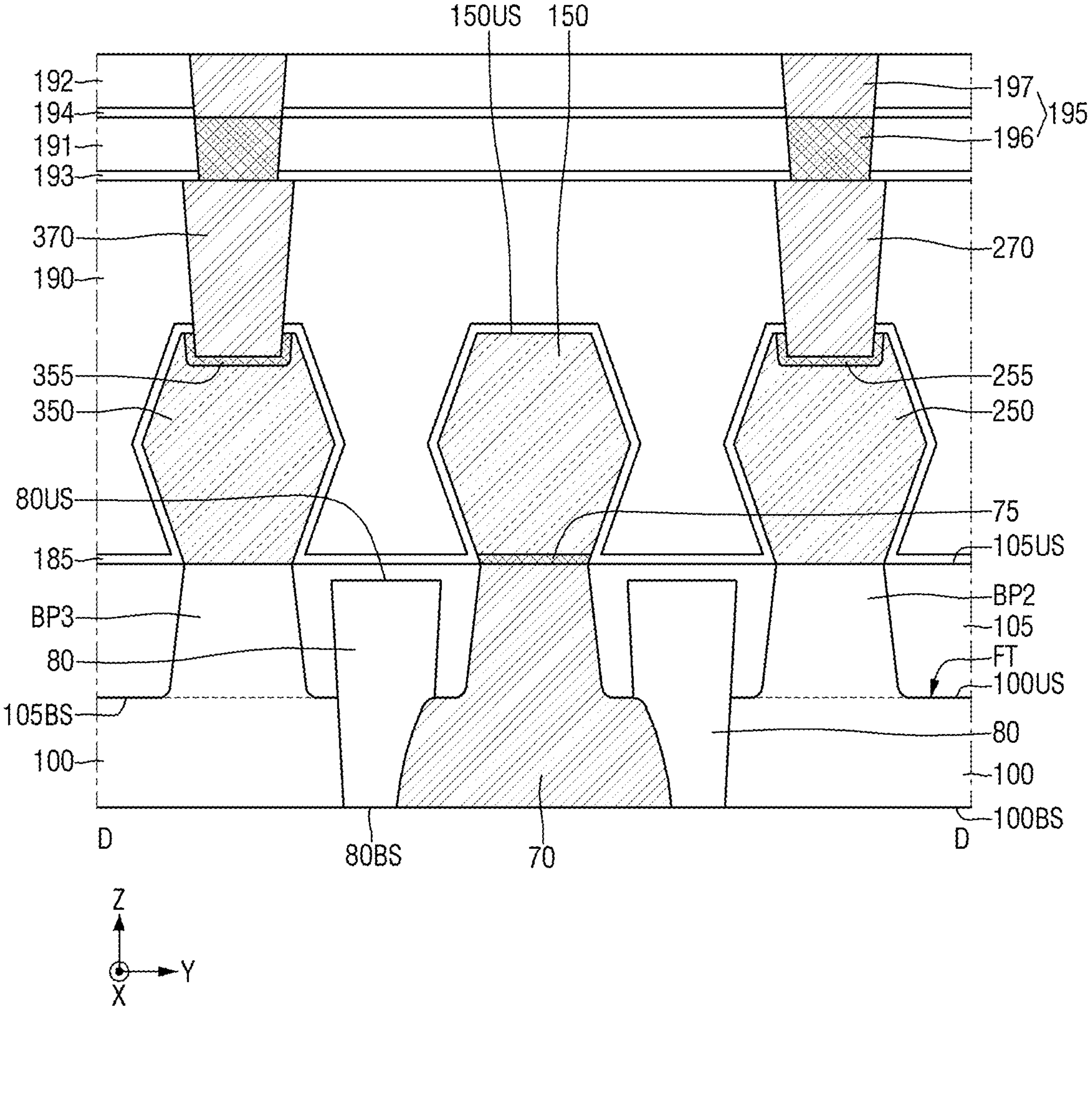

Referring to FIGS. 43 and 44, the back source/drain contact 70 may be formed in the back contact hole 70H.

Before forming the back source/drain contact 70, the back contact silicide film 75 may be formed.

Next, referring to FIG. 5, the back wiring line 50 may be formed.

FIGS. 45 to 49 are intermediate stage diagrams for explaining a method for fabricating a semiconductor device according to some embodiments. For convenience of explanation, the explanation will focus on the points that are different from those explained using FIGS. 29 to 44.

Figure 45:
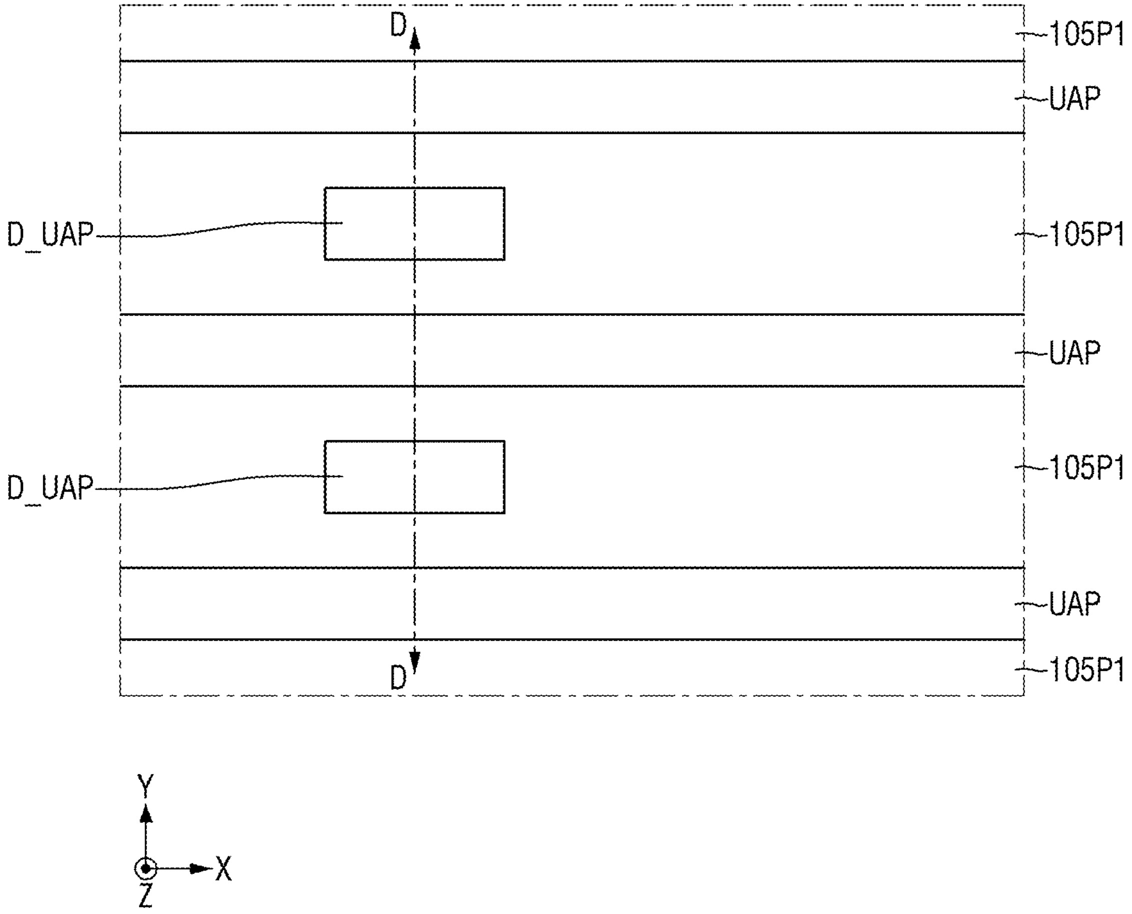
FIGS. 45 to 49 are intermediate stage diagrams for explaining a method for fabricating a semiconductor device according to some embodiments.
Figure 46:
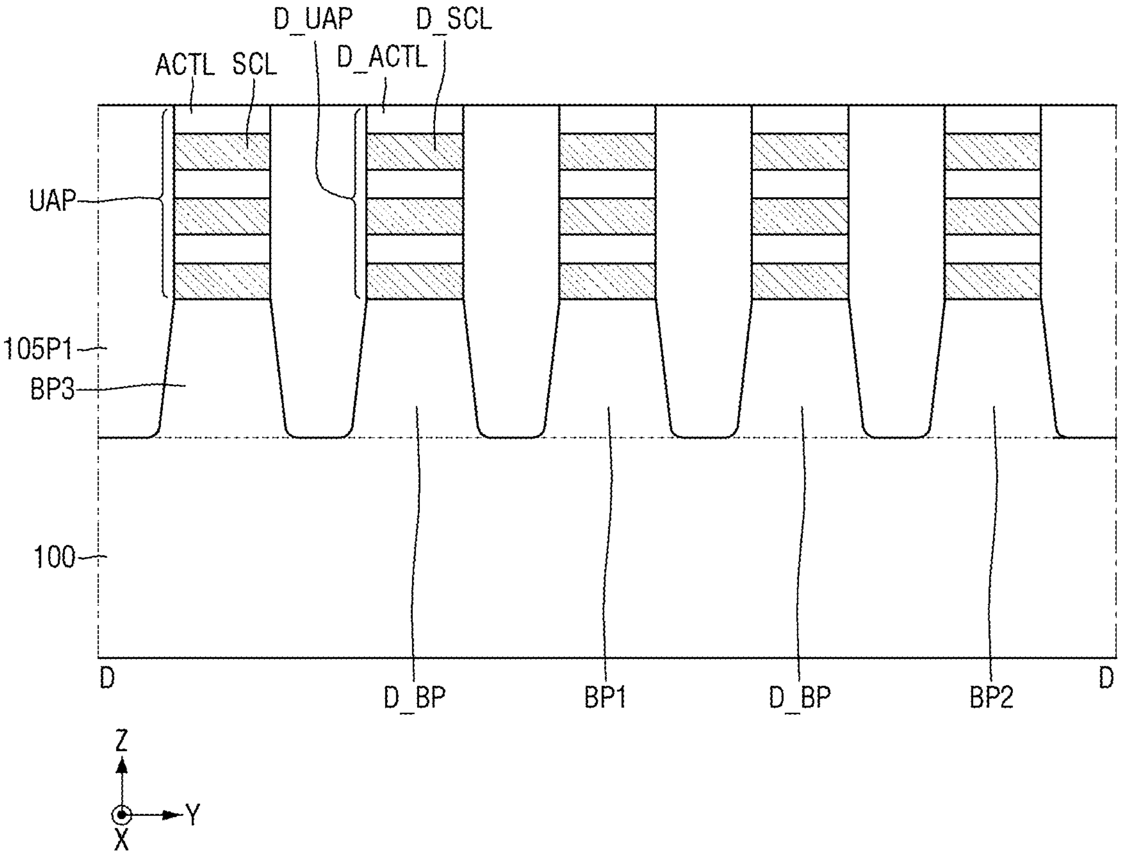

Referring to FIGS. 45 and 46, the dummy lower pattern D_BP may be formed between the first lower pattern BP1 and the second lower pattern BP2 that are adjacent to each other in the second direction Y. The dummy lower pattern D_BP may be formed between the first lower pattern BP1 and the third lower pattern BP3 adjacent to each other in the second direction Y.

The dummy lower pattern D_BP may be formed on the substrate 100. While the lower patterns BP1, BP2, and BP3 are being formed, the dummy lower pattern D_BP is formed. The dummy lower pattern D_BP, the first lower pattern BP1, the second lower pattern BP2, and the third lower pattern BP3 may be separated by the fin trench FT.

The length of the dummy lower pattern D_BP in the first direction X may be smaller than the length of the lower patterns BP1, BP2, and BP3 in the first direction X.

While the dummy lower pattern D_BP is being formed, the dummy upper pattern structure D_UAP may be formed on the dummy lower pattern D_BP. The upper pattern structure UAP may be formed simultaneously with the dummy upper pattern structure D_UAP.

The dummy upper pattern structure D_UAP may include a plurality of dummy sacrificial patterns D_SCL and a plurality of dummy active patterns D_ACTL, which are alternately stacked on the dummy lower pattern D_BP. The dummy sacrificial pattern D_SCL may be formed of or include a silicon-germanium film. The dummy active pattern D_ACTL may be formed of or include a silicon film.

Subsequently, a pre-field insulating film 105P1 may be formed on the substrate 100. The pre-field insulating film 105P1 may not cover the upper pattern structure D_UAP and the dummy upper pattern structure D_UAP. The upper pattern structure D_UAP and the dummy upper pattern structure D_UAP may be exposed.

Unlike the shown example, a fin hard mask (F_HM of FIGS. 29 and 30) may be formed on each upper pattern structure UAP. Also, the fin hard mask F_HM may be formed on the dummy upper pattern structure D_UAP.

Figure 47:
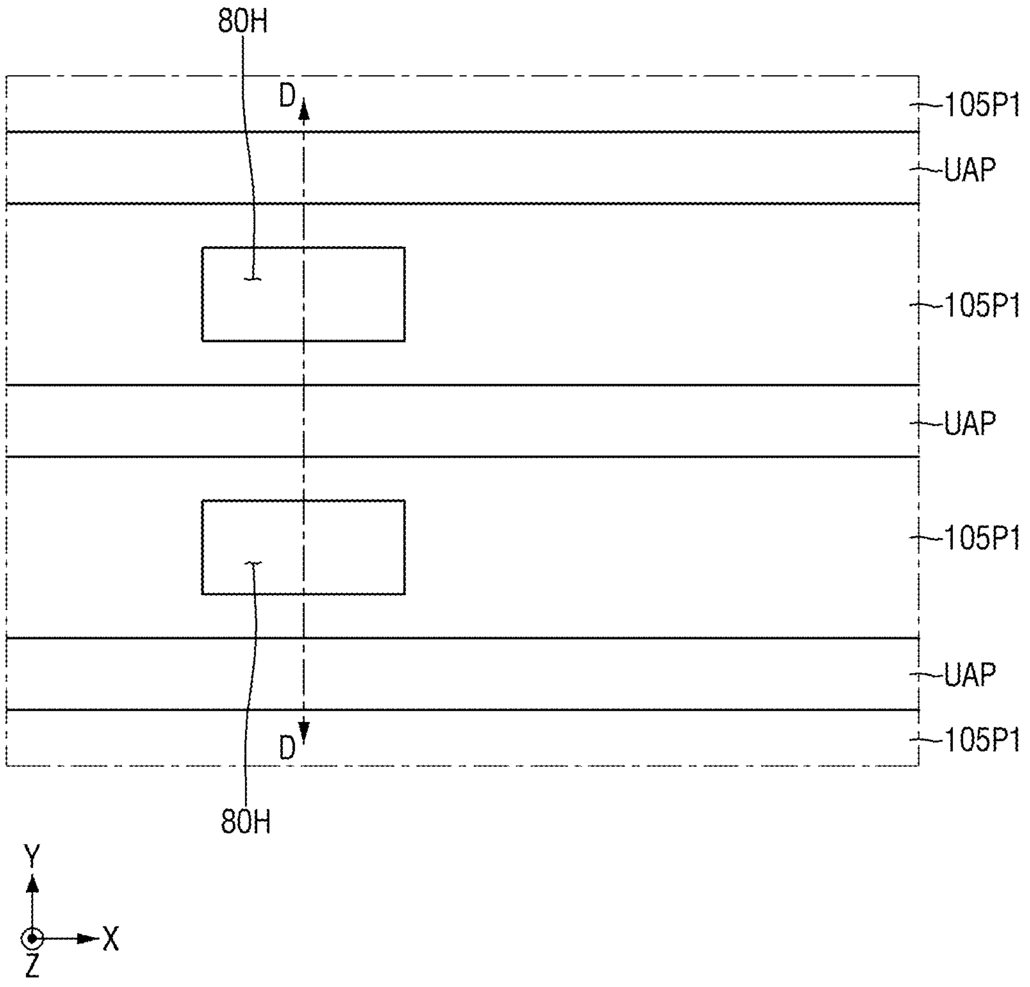
Figure 48:
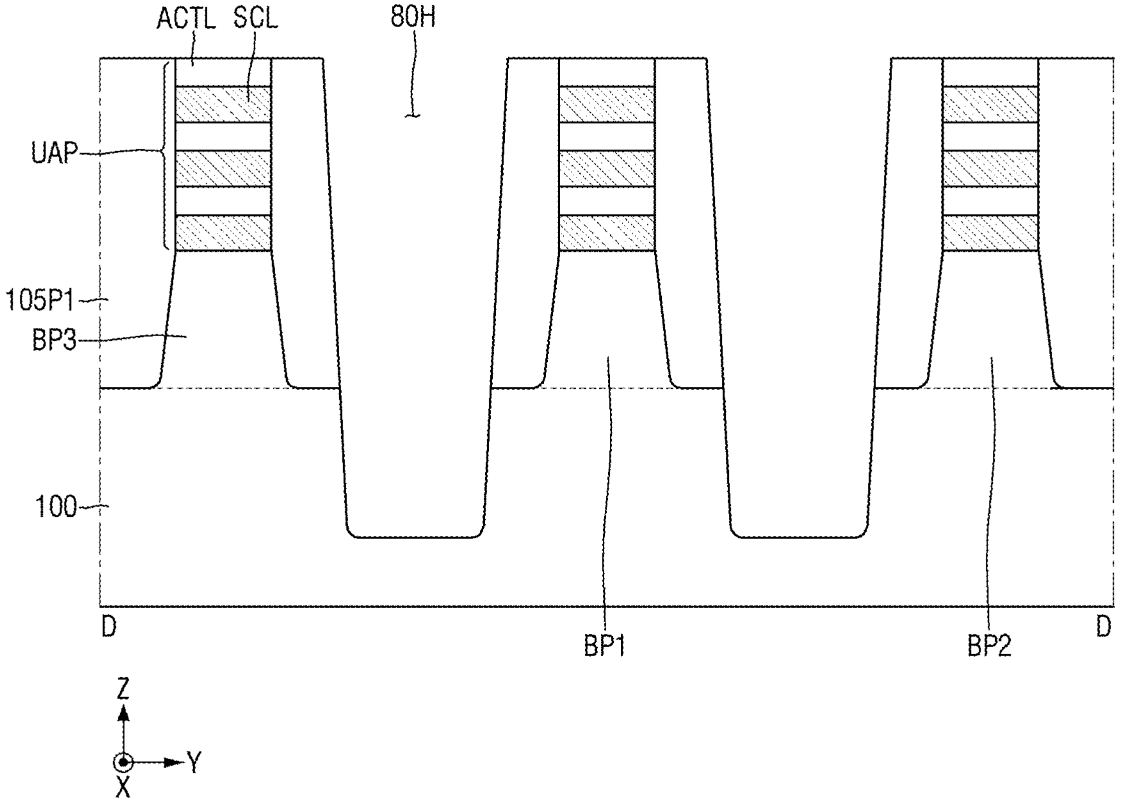

Referring to FIGS. 47 to 48, the dummy upper pattern structure D_UAP and the dummy lower pattern D_BP may be removed to form the back contact guide hole 80H.

The back contact guide hole 80H may be formed at a position corresponding to the dummy lower pattern D_BP. As an example, the back contact guide hole 80H may be formed by removing a part of the substrate 100, the dummy upper pattern structure D_UAP, and the dummy lower pattern D_BP. As another example, the back contact guide hole 80H may be formed by removing a part of the substrate 100, a part of the pre-field insulating film 105P1, the dummy upper pattern structure D_UAP, and the dummy lower pattern D_BP. The profile of the side wall of the back contact guide hole 80H may change depending on which film is removed to form the back contact guide hole 80H.

Figure 49:
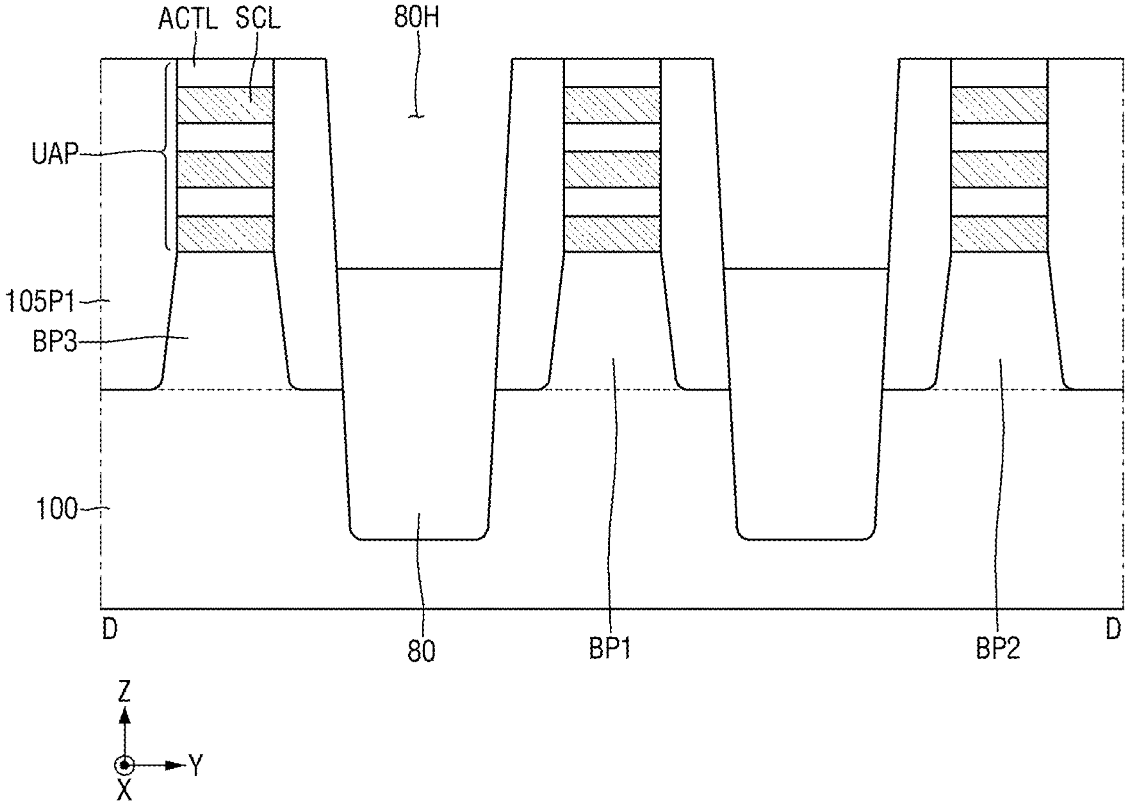

Referring to FIG. 49, the back contact guide pattern 80 may be formed in the back contact guide hole 80H.

The back contact guide pattern 80 may be formed at a position corresponding to the dummy lower pattern D_BP.

Thereafter, the fabricating process described using FIGS. 35 to 44 may proceed.

In concluding the detailed description, those skilled in the art will appreciate that many variations and modifications may be made to the preferred embodiments without substantially departing from the principles of the present inventive concept. Therefore, the disclosed preferred embodiments of the disclosure are used in a generic and descriptive sense only and not for purposes of limitation.

What is claimed is:

1. A semiconductor device comprising:

a back wiring line which includes a first face and a second face that are opposite to each other in a first direction;

a first fin-shaped pattern on the first face of the back wiring line, and extending in a second direction;

a second fin-shaped pattern spaced apart from the first fin-shaped pattern in a third direction, the second fin-shaped pattern extending in the second direction;

a field insulating film on the first face of the back wiring line, the field insulating film covering a side wall of the first fin-shaped pattern and a side wall of the second fin-shaped pattern, and including an upper face and a bottom face that are opposite to each other in the first direction, the bottom face of the field insulating film facing the first face of the back wiring line;

a back contact guide pattern on the first face of the back wiring line between the first fin-shaped pattern and the second fin-shaped pattern, the back contact guide pattern including an upper face and a bottom face that are opposite to each other in the first direction, the bottom face of the back contact guide pattern facing the first face of the back wiring line;

a first source/drain pattern on the first fin-shaped pattern; and a back source/drain contact which connects the first source/drain pattern to the back wiring line, wherein at least a part of the back source/drain contact is disposed in the first fin-shaped pattern.

2. The semiconductor device of claim 1, wherein the back contact guide pattern does not overlap an upper face of the second fin-shaped pattern in the first direction.

3. The semiconductor device of claim 1, wherein a part of the back contact guide pattern is disposed in the field insulating film, and the field insulating film covers the upper face of the back contact guide pattern.

4. The semiconductor device of claim 1, further comprising:

a source/drain etching stop film which extends along side walls of the first source/drain pattern and the upper face of the field insulating film, wherein the source/drain etching stop film is in contact with the upper face of the back contact guide pattern.

5. The semiconductor device of claim 1, further comprising:

a plurality of sheet patterns on the first fin-shaped pattern and connected to the first source/drain pattern; and a gate structure on the first fin-shaped pattern, the gate structure including a gate insulating film that surrounds the plurality of sheet patterns, and a gate electrode, wherein the plurality of sheet patterns do not overlap the back contact guide pattern in the first direction.

6. The semiconductor device of claim 5, wherein the back contact guide pattern does not overlap the gate structure in the first direction.

7. The semiconductor device of claim 5, wherein a part of the upper face of the back contact guide pattern overlaps the gate structure in the first direction.

8. The semiconductor device of claim 7, further comprising:

a gate isolation structure on the back contact guide pattern and in contact with a side wall of the gate structure.

9. The semiconductor device of claim 1, further comprising:

a substrate between the back wiring line and the second fin-shaped pattern, wherein the second fin-shaped pattern protrudes from the substrate in the first direction, and a part of the back contact guide pattern is disposed in the substrate.

10. The semiconductor device of claim 9, wherein the substrate includes a bottom face that faces the back wiring line, and an upper face opposite to the bottom face of the substrate in the first direction, the second fin-shaped pattern protrudes from the upper face of the substrate, and a height from the second face of the back wiring line to the bottom face of the substrate is smaller than a height from the second face of the back wiring line to the bottom face of the back contact guide pattern.

11. The semiconductor device of claim 1, further comprising:

a back interlayer insulating film on the bottom face of the back contact guide pattern and in contact with the back contact guide pattern, wherein the back wiring line is disposed in the back interlayer insulating film.

12. The semiconductor device of claim 1, further comprising:

a second source/drain pattern on the second fin-shaped pattern; and a front source/drain contact connected to the second source/drain pattern, wherein the second source/drain pattern is between the second fin-shaped pattern and the front source/drain contact.

13. A semiconductor device comprising:

a back wiring line which includes a first face and a second face that are opposite to each other in a first direction;

a first fin-shaped pattern on the first face of the back wiring line and extending in a second direction;

a field insulating film on the first face of the back wiring line, the field insulating film covering a side wall of the first fin-shaped pattern, and including an upper face and a bottom face that are opposite to each other in the first direction, the bottom face of the field insulating film facing the first face of the back wiring line;

a source/drain pattern on the first fin-shaped pattern;

a back source/drain contact which connects the source/drain pattern to the back wiring line; and a back contact guide pattern on both sides of the back source/drain contact and in contact with the back source/drain contact, wherein the back contact guide pattern includes an upper face and a bottom face that are opposite to each other in the first direction, the bottom face of the back contact guide pattern faces the first face of the back wiring line, and a height from the second face of the back wiring line to the bottom face of the field insulating film is smaller than a height from the second face of the back wiring line to the upper face of the back contact guide pattern.

14. The semiconductor device of claim 13, wherein a height from the second face of the back wiring line to the upper face of the field insulating film is greater than the height from the second face of the back wiring line to the upper face of the back contact guide pattern.

15. The semiconductor device of claim 13, further comprising:

a source/drain etching stop film which extends along side walls of the source/drain pattern and the upper face of the field insulating film, wherein the source/drain etching stop film is in contact with the upper face of the back contact guide pattern.

16. The semiconductor device of claim 13, further comprising:

a second fin-shaped pattern which is spaced apart from the first fin-shaped pattern in a third direction, the second fin-shaped pattern extending in the second direction, wherein the back contact guide pattern is spaced apart from the second fin-shaped pattern in the third direction.

17. The semiconductor device of claim 13, further comprising:

a substrate between the back wiring line and the first fin-shaped pattern, wherein the first fin-shaped pattern protrudes from the substrate in the first direction, and a part of the back contact guide pattern is disposed in the substrate.

18. The semiconductor device of claim 13, further comprising:

a back interlayer insulating film on the bottom face of the back contact guide pattern and in contact with the back contact guide pattern, wherein the back wiring line is disposed in the back interlayer insulating film.

19. A semiconductor device comprising:

a substrate which includes an upper face and a bottom face that are opposite to each other in a first direction;

a first fin-shaped pattern which protrudes from the upper face of the substrate in the first direction and extends in a second direction;

a second fin-shaped pattern which protrudes from the upper face of the substrate in the first direction, is spaced apart from the first fin-shaped pattern in a third direction, and extends in the second direction;

a field insulating film on the substrate, the field insulating film covering side walls of the first fin-shaped pattern and side walls of the second fin-shaped pattern;

a back contact guide pattern between the first fin-shaped pattern and the second fin-shaped pattern, the back contact guide pattern being disposed in the field insulating film and the substrate;

a source/drain pattern on the first fin-shaped pattern;

a back wiring line on the bottom face of the substrate; and a back source/drain contact which connects the source/drain pattern to the back wiring line, and is in contact with the back contact guide pattern, wherein the back contact guide pattern includes a first portion disposed in the substrate, and a second portion disposed in the field insulating film, the back contact guide pattern includes a first side wall and a second side wall that are opposite to each other in the third direction, the first side wall of the back contact guide pattern is in contact with the back source/drain contact, and in the first portion of the back contact guide pattern, the second side wall of the back contact guide pattern forms an acute angle with the bottom face of the substrate.

20. The semiconductor device of claim 19, wherein in the second portion of the back contact guide pattern, the second side wall of the back contact guide pattern forms an acute angle with the bottom face of the substrate.

* * * * *